United States Patent
Koizumi et al.

(10) Patent No.: US 9,444,554 B2
(45) Date of Patent: Sep. 13, 2016

(54) DIGITAL COHERENT RECEIVING APPARATUS

(71) Applicant: FUJITSU LIMITED, Kawasaki-shi, Kanagawa (JP)

(72) Inventors: Nobukazu Koizumi, Kawasaki (JP); Takeshi Hoshida, Kawasaki (JP); Takahito Tanimura, Kawasaki (JP); Hisao Nakashima, Kawasaki (JP); Koji Nakamuta, Kawasaki (JP); Noriyasu Nakayama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 211 days.

(21) Appl. No.: 14/040,299

(22) Filed: Sep. 27, 2013

(65) Prior Publication Data

US 2014/0029959 A1  Jan. 30, 2014

Related U.S. Application Data

(62) Division of application No. 12/821,061, filed on Jun. 22, 2010, now Pat. No. 8,649,689.

(30) Foreign Application Priority Data

Jun. 24, 2009  (JP) .................................. 2009-150124

(51) Int. Cl.
*H04B 10/00* (2013.01)
*H04B 10/61* (2013.01)
(Continued)

(52) U.S. Cl.
CPC ............... *H04B 10/616* (2013.01); *H03J 7/26* (2013.01); *H04B 10/60* (2013.01); *H04B 10/611* (2013.01);
(Continued)

(58) Field of Classification Search
CPC ..................................... H04B 10/51
USPC .......................................... 398/208
See application file for complete search history.

(56) References Cited

U.S. PATENT DOCUMENTS 5,349,549 A  9/1994  Tsutsui
5,463,461 A  10/1995  Horiuchi et al.
(Continued)

FOREIGN PATENT DOCUMENTS

EP  0 319 174 A2  6/1989
EP  0 411 566 A1  2/1991
(Continued)

OTHER PUBLICATIONS

Demodulate (2011). [Online]. In The Editors of the American Heritage Dictionaries & TheEditorsoftheAmericanHeritageDictionaries (eds.). The American Heritage Dictionary of the English language. Boston, MA: Houghton Mifflin. Available from: http://search.credoreference.com/content/entry/hmdictenglang/demodulate/0 [Accessed Feb. 4, 2016].*

(Continued)

*Primary Examiner* — David Payne
*Assistant Examiner* — Tanya Motsinger
(74) *Attorney, Agent, or Firm* — Arent Fox LLP

(57) ABSTRACT

A digital coherent receiving apparatus includes a first oscillator for outputting a local light signal of a fixed frequency, a hybrid unit mixing the local light signal with a light signal received by a receiver, a second oscillator for outputting a sampling signal of a sampling frequency, a converter for converting the mixed light signal into digital signal synchronizing with the sampling signal, a waveform adjuster for adjusting a waveform distortion of the converted digital signal, a phase adjustor for adjusting a phase of the digital signal adjusted by the waveform adjustor, a demodulator for demodulating the digital signal adjusted by the phase adjuster, and a phase detector for detecting a phase of the digital signal adjusted by the phase adjuster, and a control signal output unit for outputting a frequency control signal on the basis of the detected phase signal to the second oscillator.

6 Claims, 41 Drawing Sheets

(51) Int. Cl.
　　*H03J 7/26*　　　　(2006.01)
　　*H04B 10/60*　　　(2013.01)
　　*H04L 27/00*　　　(2006.01)
　　*H04L 27/22*　　　(2006.01)
　　*H04L 27/227*　　(2006.01)
　　*H04L 7/033*　　　(2006.01)

(52) U.S. Cl.
　　CPC ........ *H04B 10/614* (2013.01); *H04B 10/6165* (2013.01); *H04L 27/0014* (2013.01); *H04L 27/223* (2013.01); *H04L 27/2276* (2013.01); *H04L 7/0335* (2013.01); *H04L 2027/0016* (2013.01); *H04L 2027/0067* (2013.01)

(56) References Cited

U.S. PATENT DOCUMENTS

| | | | |
|---|---|---|---|
| 6,044,341 A | 3/2000 | Takahashi | |
| 7,266,310 B1 | 9/2007 | Savory et al. | |
| 7,606,498 B1* | 10/2009 | Wu | H04B 10/60 398/152 |
| 8,693,886 B2* | 4/2014 | Kikuchi | H04B 10/5561 398/147 |
| 8,855,503 B2* | 10/2014 | Kikuchi | H04B 10/677 398/208 |
| 8,942,574 B2* | 1/2015 | Nakashima | H04B 10/697 398/15 |
| 9,014,575 B2* | 4/2015 | Nakashima | H04L 7/0337 398/204 |
| 2002/0106016 A1 | 8/2002 | Egelmeers et al. | |
| 2006/0285854 A1* | 12/2006 | Sun | H03L 7/085 398/155 |
| 2006/0285855 A1* | 12/2006 | Sun | H03L 7/085 398/155 |
| 2007/0092260 A1* | 4/2007 | Bontu | H04J 3/0608 398/152 |
| 2008/0008268 A1* | 1/2008 | Koc | H04L 27/0014 375/329 |
| 2008/0152361 A1* | 6/2008 | Chen | H04B 10/61 398/205 |
| 2008/0205905 A1 | 8/2008 | Tao et al. | |
| 2009/0047030 A1* | 2/2009 | Hoshida | H04B 10/60 398/205 |
| 2009/0060511 A1* | 3/2009 | Toyoshima | H04B 10/61 398/74 |
| 2009/0142076 A1* | 6/2009 | Li | H04B 10/61 398/208 |
| 2009/0201796 A1 | 8/2009 | Roberts et al. | |
| 2009/0304064 A1* | 12/2009 | Liu | H04L 25/03057 375/232 |
| 2009/0317092 A1* | 12/2009 | Nakashima | H04B 10/61 398/204 |
| 2010/0054759 A1* | 3/2010 | Oda | H04B 10/6971 398/202 |
| 2010/0142971 A1* | 6/2010 | Chang | H04B 10/61 398/154 |
| 2010/0209121 A1* | 8/2010 | Tanimura | H04B 10/611 398/202 |
| 2010/0232788 A1* | 9/2010 | Cai | H04B 10/61 398/25 |
| 2010/0232809 A1* | 9/2010 | Cai | H04J 14/02 398/202 |
| 2010/0303474 A1* | 12/2010 | Nakashima | H04B 10/61 398/210 |
| 2010/0329677 A1* | 12/2010 | Kaneda | H04B 10/60 398/65 |
| 2010/0329697 A1* | 12/2010 | Koizumi | H03J 7/26 398/208 |
| 2011/0085797 A1* | 4/2011 | Xu | H04B 10/60 398/27 |
| 2011/0150503 A1* | 6/2011 | Winzer | H04B 10/60 398/202 |
| 2011/0200339 A1* | 8/2011 | Komaki | H04B 10/61 398/208 |
| 2011/0255877 A1* | 10/2011 | Nakashima | H04B 10/611 398/202 |
| 2012/0134676 A1* | 5/2012 | Kikuchi | H04B 10/532 398/65 |
| 2012/0308227 A1* | 12/2012 | Komaki | H04B 10/25073 398/25 |
| 2012/0308234 A1* | 12/2012 | Bianciotto | H04B 10/614 398/55 |

FOREIGN PATENT DOCUMENTS

| | | |
|---|---|---|
| JP | 05-183442 A | 7/1993 |
| JP | 05-297898 A | 11/1993 |
| JP | 08-160994 A | 6/1996 |
| JP | 11-038997 A | 2/1999 |
| JP | 2000-207000 A | 7/2000 |
| JP | 2004-507922 A | 3/2004 |
| KR | 10-2010-0065028 A | 6/2010 |
| WO | WO 02/17487 A1 | 2/2002 |

OTHER PUBLICATIONS

Fourier Transform (2011). [Online]. In The Editors of the American Heritage Dictionaries & TheEditorsoftheAmericanHeritageDictionaries (eds.). The American Heritage Dictionary of the English language. Boston, MA: Houghton Mifflin. Available from: http://search.credoreference.com/content/entry/hmdictenglang/fourier_transform/0 [Accessed 4 Feb. 2.*

Gardner, "A BPSK/QPSK Timing-Error Detector for Sampled Receivers," IEEE Transactions on Communications, May 1, 1986, pp. 423-429, vol. 34, No. 5.

Korean Office Action dated Jul. 5, 2011 issued in Korean Patent Application No. 10-2010-0058042.

Leven, et al., "Coherent Receivers for Practical Optical Communication Systems," Optical Fiber Communication Conference and Exposition National Fiber Optic Engineers Conference, OFCNFOEC 2007, Mar. 25-29, 2007, pp. 1-3.

Ly-Gagnon, et al., "Coherant Detection of Optical Quadrature Phase-Shift Keying Signals With Carrier Phase Estimation," IEEE JLT, vol. 24; pp. 12-21; Jan. 1, 2006.

Piyawanno, et al., "Correlation-Based Carrier Phase Estimation for WDM DP-QPSK Transmission", IEEE Photonics Technology Letters, vol. 20, No. 24, Dec. 15, 2008, pp. 2090-2092.

Tanimura, et al., "Digital Clock Recovery Algorithm for Optical Coherent Receivers Operating Independent of Laser Frequency Offset", EEOC 2008, vol. 1, Nos. 21-25, Sep. 2008, pp. 1-2.

* cited by examiner

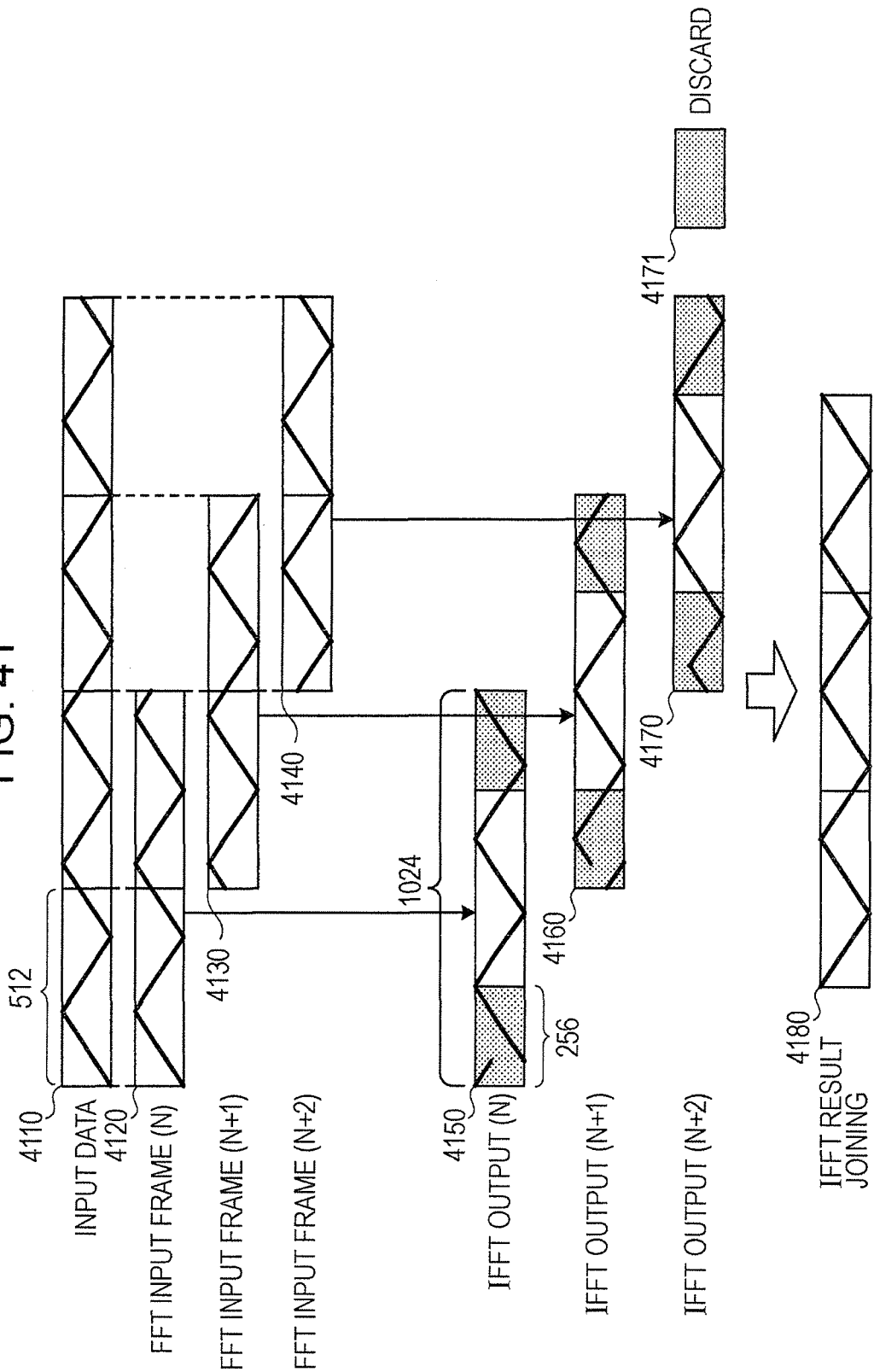

DIGITAL COHERENT RECEIVING APPARATUS

CROSS-REFERENCE TO RELATED APPLICATION

This is a Divisional Application of U.S. patent application Ser. No.: 12/821,061, filed Jun. 22, 2010; which claims priority to Japanese Patent Application No. 2009-150124, filed Jun. 24, 2009. The disclosures of each of the prior applications are hereby incorporated in their entirety by reference.

FIELD

The embodiments discussed herein are a digital coherent receiver.

BACKGROUND

Along with an increase in the internet traffic, a larger capacity in an optical communication system of a trunk line system is demanded, and research and development are carried out on an optical transmitter receiver capable of transmitting a signal exceeding 100 [Gbit/s] per wavelength. However, in the optical communication, when a bit rate per wavelength is increased, a degradation in a signal quality becomes large because of an decrease in the bearing force for Optical Signal Noise Ratio (OSNR), the wavelength dispersion in a transmission path, the polarized wave mode dispersion, or the waveform distortion from an nonlinear effect or the like.

For this reason, in recent years, a digital coherent reception system having the OSNR bearing force and the waveform bearing force in the transmission path attracts attention (for example, see D. Ly-Gagnon et al, IEEE JLT, vol. 24, pp. 12-21, 2006). Also, in contrast to a system for the direct detection by assigning ON/OFF of a light intensity to binary signals in a related art, according to the digital coherent reception system, a light intensity and phase information are extracted through the coherent reception system. Then, the extracted intensity and phase information are quantized by an ADC (Analog/Digital Converter) and demodulated by a digital signal processing circuit (for example, see F. M. Gardner, "A BPSK/QPSK timing-error detector for sampled receivers", IEEE Trans. Commun., vol. COM-34, pp. 423-429, May 1986).

However, according to the related art technology, when the frequency of the local light in the digital coherent receiver varies with respect to the frequency of the optical light transmitted from the transmitter, the optical signal cannot be digitally demodulated at a satisfactory precision in the digital coherent receiver. For this reason, a problem occurs that a communication quality is degraded.

SUMMARY

According to an aspect of the invention, A digital coherent receiving apparatus includes a receiver for receiving a light signal, a first oscillator for outputting a local light signal of a fixed frequency, a hybrid unit mixing the local light signal output from the first oscillator with the light signal received by the receiver, a second oscillator for outputting a sampling signal of a sampling frequency, the second oscillator changing the sampling frequency in response to an input a frequency control signal, a converter for converting the mixed light signal into digital signal by sampling the mixed light signal synchronizing with the sampling signal, a waveform adjuster for adjusting a waveform distortion of the digital signal converted by the convertor, a phase adjustor for adjusting a phase of the digital signal adjusted by the waveform adjustor, a demodulator for demodulating the digital signal adjusted by the phase adjuster, a phase detector for detecting a phase of the digital signal adjusted by the phase adjuster; and a control signal output unit for outputting a frequency control signal on the basis of the detected phase signal to the second oscillator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 41 shows an operation of the circuit shown in FIG. 40.

DESCRIPTION OF EMBODIMENTS

Figure 1:
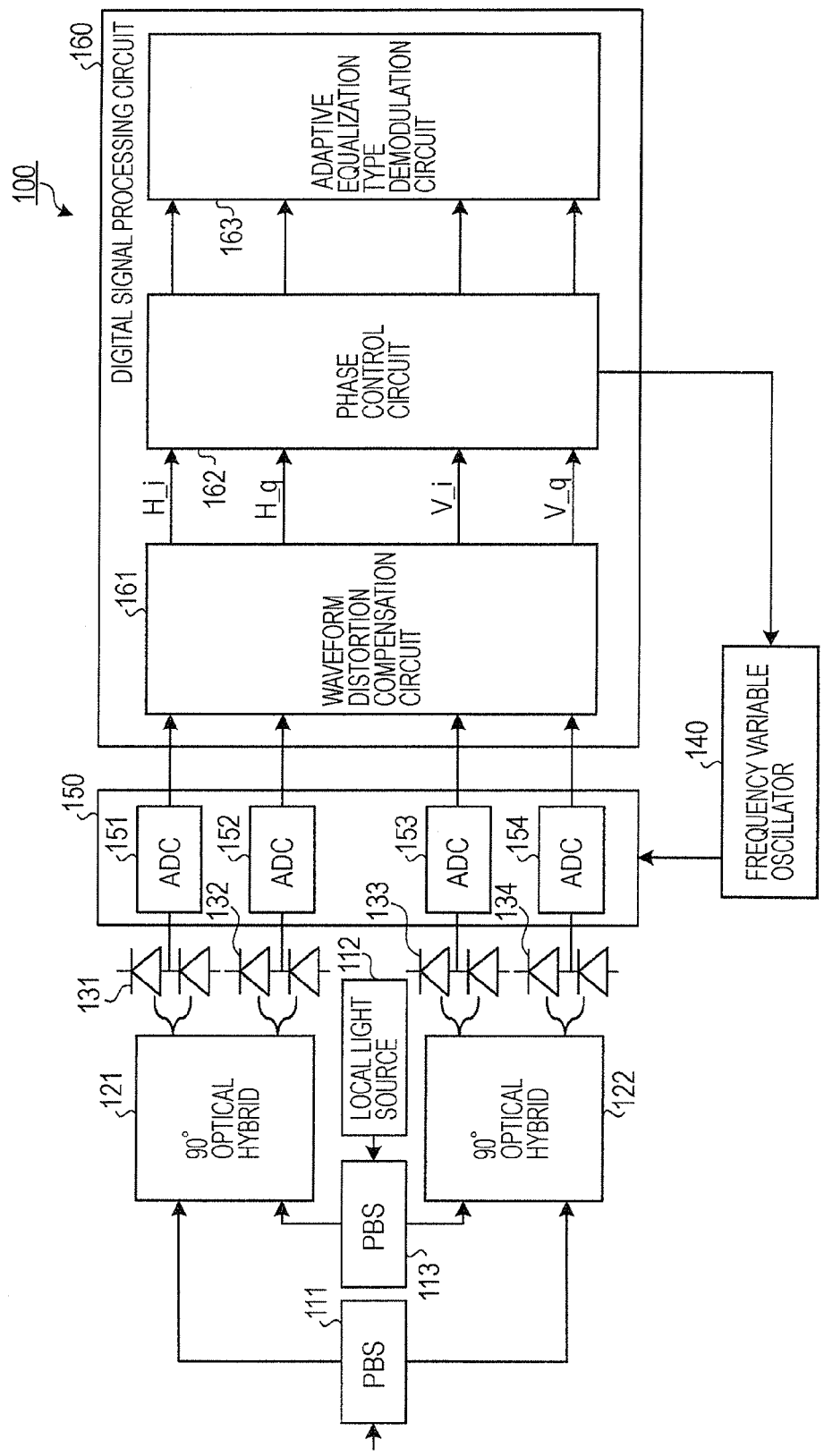
FIG. 1 is a block diagram showing a configuration example 1 of a digital coherent receiver.

Hereinafter, with reference to the attached drawings, preferred embodiments of this digital coherent receiver will be described in detail.

(Degradation in Communication Quality Due to Frequency Fluctuation)

First, degradation in a communication quality due to a frequency fluctuation of a local light source will be described. In a configuration in which the wavelength dispersion compensation is carried out by a waveform distortion compensator of the digital coherent receiver, in proportion to the size of the wavelength dispersion amount to be compensated in the waveform distortion compensator, a phenomenon is generated that the frequency fluctuation of the local light source is transformed into the sampling phase fluctuation.

A specific description will be given of this phenomenon. The transmission signal transmitted from the optical transmitter can be represented, for example, by the following expression (1). In the following expression (1), s(t) denotes a modulation signal for generating the transmission signal. Denoted by j is an imaginary number. Denoted by t is time. Denoted by $\omega_0$ is a carrier wave frequency of the light.

[Expression 1]

$$s(t)\exp(j\omega_0 t) \qquad (1)$$

A transfer function of the transmission path dispersion can be represented, for example, by the following expression (2). In the following expression (2), D denotes wavelength dispersion. $V_L$ denotes a light speed. Denoted by $\omega$ are respective frequencies of the baseband.

[Expression 2]

$$\exp\left[j\frac{\pi V_L D}{\omega_0^2}(\omega-\omega_0)^2\right] \qquad (2)$$

The reception signal distorted by the wavelength dispersion can be represented by the following expression (3).

[Expression 3]

$$\hat{S}(\omega-\omega_0)\exp\left[j\frac{\pi V_L D}{\omega_0^2}(\omega-\omega_0)^2\right] \qquad (3)$$

$\hat{S}$ denotes a frequency domain display of the transmission modulation signal. The local light can be represented by the following expression (4). In the following expression (4), $\Delta\omega$ denotes a frequency difference between the signal light and the local light.

[Expression 4]

$$\exp[j(\omega_0-\Delta\omega)t] \qquad (4)$$

The signal after the coherent reception after the local light and the signal light shown in the expression (4) are mixed can be represented as the following expression (5).

[Expression 5]

$$\hat{S}(\omega-\Delta\omega)\exp\left[j\frac{\pi V_L D}{\omega_0^2}(\omega-\Delta\omega)^2\right] \qquad (5)$$

In the digital coherent receiver, the signal represented by the expression (5) is quantized by the ADC to carry out the digital signal processing. The following expression (6) represents an inverse transfer function of the transmission path dispersion in a case where the dispersion compensation in the waveform compensation circuit of the digital signal processing circuit is performed. In the following expression (6), AD denotes a deviation of the transmission path dispersion and the dispersion compensation amount compensated in the waveform compensation circuit.

[Expression 6]

$$\exp\left[-j\frac{\pi V_L(D-\Delta D)}{\omega_0^2}\omega^2\right] \qquad (6)$$

The following expression (7) represents the signal after the wavelength dispersion compensation.

[Expression 7]

$$\hat{S}(\omega - \Delta\omega)\exp\left[j\frac{\pi V_L}{\omega_0^2}(\Delta D\omega^2 - 2D\Delta\omega \cdot \omega + D\Delta\omega^2)\right] \quad (7)$$

In the expression (7), when a consideration is given on $\Delta D=0$, the signal after the waveform compensation can be represented by the following expression (8).

[Expression 8]

$$s\left(t - \frac{2\pi V_L(D\Delta\omega)}{\omega_0^2}\right)\exp\left[j\Delta\omega\left(t - \frac{2\pi V_L(D\Delta\omega)}{\omega_0^2}\right)\right]\exp\left(j\frac{\pi V_L(D\Delta\omega^2)}{\omega_0^2}\right) \quad (8)$$

From the expression (8), because of the frequency drift of the signal light and the local light and the wavelength dispersion compensation, it is understood that a delay of $2\pi V_L D\Delta\omega/\omega_0^2$ is generated. In this manner, in proportion to the size of the wavelength dispersion amount to be compensated in the waveform distortion compensator, the frequency fluctuation of the local light source is transformed into the sampling phase fluctuation, which affects the accuracy of the digital demodulation in the subsequent stage.

(Influence on ADC Sampling Frequency Control Processing)

Also, in the digital coherent reception system where the bit rate is equal to or larger than several tens of Gbit/s, the ADC sampling frequency also becomes equal to or larger than several tens of GHz. For this reason, in a case where a digital signal processing circuit is constructed by using an inexpensive CMOS (Complementary Metal Oxide Semiconductor) process, a serial parallel conversion of the ADC sampling signal is performed so that the operation frequency becomes about several hundreds of MHz, and the digital signal processing is performed on the paralleled reception signals. In this manner, in a case where the high speed sampling is carried out in the ADC, the circuit scale becomes larger.

(Embodiments)

FIG. 1 is a block diagram showing a configuration example 1 of a digital coherent receiver. As shown in FIG. 1, a digital coherent receiver 100 according to an embodiment is provided with a PBS 111, a local light source 112, a PBS 113, a hybrid circuit 121, a hybrid circuit 122, photoelectric converters 131 to 134, a frequency variable oscillator 140, a digital conversion unit 150, and a digital signal processing circuit 160. The digital coherent receiver 100 is a digital coherent receiver configured to convert a detection result of a signal light from an optical transmission path and a local light into a digital signal to conduct a digital processing.

To the PBS 111 (Polarization Beam Splitter), the signal light sent via the optical transmission path is input. The PBS 111 separates the input signal light into respective polarization axes (which are set as H axis and V axis). The PBS 111 outputs the separated signal light on the H axis (horizontally polarized wave) to the hybrid circuit 121. Also, the PBS 111 outputs the separated signal light on the V axis (vertically polarized wave) to the hybrid circuit 122.

The local light source 112 generates the local light to be output to the PBS 113. The PBS 113 separates the local light output from the local light source 112 into respective the respective polarization axes (which are set as H axis and V axis). The PBS 113 outputs the separated local light on the H axis to the hybrid circuit 121. Also, the PBS 113 outputs the separated local light on the V axis to the hybrid circuit 122.

The hybrid circuit 121 (90° optical hybrid) performs detection on the basis of the signal light on the H axis output from the PBS 111 and the local light output from the PBS 113. The hybrid circuit 121 outputs an optical signal corresponding to an amplitude and a phase in an I channel of the signal light to the photoelectric converter 131. Also, the hybrid circuit 121 outputs an optical signal corresponding to an amplitude and a phase in a Q channel of the signal light to the photoelectric converter 132.

The hybrid circuit 122 (90° optical hybrid) performs detection on the basis of the signal light on the V axis output from the PBS 111 and the local light output from the PBS 113. The hybrid circuit 122 outputs an optical signal corresponding to the amplitude and the phase in the I channel of the signal light to the photoelectric converter 133. Also, the hybrid circuit 122 outputs an optical signal corresponding to the amplitude and the phase in the Q channel of the signal light to the photoelectric converter 134.

Each of the photoelectric converter 131 and the photoelectric converter 132 photo electrically converts the light signal output from the hybrid circuit 121 be output to the digital conversion unit 150. Each of the photoelectric converter 133 and the photoelectric converter 134 photo electrically converts the light signal output from the hybrid circuit 122 to be output to the digital conversion unit 150.

The frequency variable oscillator 140 (oscillation unit) generates a variable frequency clock to be output to the digital conversion unit 150. Also, the frequency variable oscillator 140 changes the frequency of the generated clock on the basis of a control of the digital signal processing circuit 160.

The digital conversion unit 150 is provided with ADCs 151 to 154. The ADC 151 digitally samples the signal output from the photoelectric converter 131. Similarly, the ADCs 152 to 154 respectively digitally samples the signals output from the photoelectric converters 132 to 134. Also, each of the ADCs 151 to 154 performs the digital sampling in synchronization with the clock output from the frequency variable oscillator 140. Each of the ADCs 151 to 154 outputs the digitally sampled signal to the digital signal processing circuit 160.

The digital signal processing circuit 160 is provided with the waveform distortion compensation circuit 161 (waveform distortion compensation unit), a phase control circuit 162, and an adaptive equalization type demodulation circuit 163 (demodulation unit). The waveform distortion compensation circuit 161, the phase control circuit 162, and the adaptive equalization type demodulation circuit 163 may be realized by one DSP (Digital Signal Processor) or mutually different DSPs.

The waveform distortion compensation circuit 161 compensates a waveform distortion of the signals output from the ADCs 151 to 154 (distortion generated in the optical transmission path). To be more specific, in the waveform distortion compensation circuit 161, a semi-static transmission path waveform distortion component which changes depending on a propagation characteristic fluctuation such as temperature fluctuation is compensated. The waveform distortion compensation circuit 161 outputs the respective signal in which the waveform distortion is compensated to the phase control circuit 162. the waveform distortion compensation circuit 161 may be constructed by one circuit block or may have a cascade connection configuration with a plurality of divided waveform distortion compensation circuit blocks.

The phase control circuit 162 conducts a digital phase compensation on the respective signals output from the waveform distortion compensation circuit 161. The phase control circuit 162 outputs the compensated respective signals to the adaptive equalization type demodulation circuit 163. the phase control circuit 162 may be constructed by one circuit for processing the respective signals from the waveform distortion compensation circuit 161 in parallel or may be constructed by a plurality of circuits corresponding to the respective signals from the waveform distortion compensation circuit 161. Also, on the basis of the phases of the respective signals output from the waveform distortion compensation circuit 161, the phase control circuit 162 controls the frequency of the clock output by the frequency variable oscillator 140.

The adaptive equalization type demodulation circuit 163 conducts the demodulation on the respective signals output from the phase control circuit 162. Also, the adaptive equalization type demodulation circuit 163 performs an adaptive equalization type waveform distortion compensation on the respective signals output from the phase control circuit 162 before the demodulation. To be more specific, the adaptive equalization type demodulation circuit 163 compensates the waveform distortion component which is generated in the transmission path and fluctuates at a high speed. the adaptive equalization type demodulation circuit 163 may be constructed by one circuit block or may have a cascade connection configuration with a plurality of adaptive equalization circuit blocks.

For example, in a case where the ADCs 151 to 154 conduct the digital sampling at equal to or higher than several tens of GHz, such a configuration may be adopted that a multiple PLL (Phase-Locked Loop) using the clock output from the frequency variable oscillator 140 as the reference is provided. Also, the digital coherent receiver 100 shown in FIG. 1 can cope with both a polarized wave multiplex transmission system multiplexing transmission signals for every polarized wave axis and a non-polarized wave multiplex transmission with which the polarized wave multiplexing of the transmission signals is not carried out.

In this manner, as the digital coherent receiver 100 detects the phase of the signal in the subsequent stage of the waveform distortion compensation circuit 161, the phase fluctuation generated in the waveform distortion compensation circuit 161 due to the frequency fluctuation of the local light source 112 can be detected. Also, by compensating the detected frequency fluctuation in the former stage of the adaptive equalization type demodulation circuit 163 to precisely conduct the digital demodulation in the adaptive equalization type demodulation circuit 163, it is possible to improve the communication quality.

Also, on the basis of the detected phase of the signal in the subsequent stage of the waveform distortion compensation circuit 161, the digital coherent receiver 100 controls the sampling phase in the digital conversion unit 150. To be more specific, the digital coherent receiver 100 controls the frequency of the clock oscillated by the frequency variable oscillator 140. With this configuration, while the enlargement in the circuit scale is suppressed, it is possible to carry out the high speed sampling in the digital conversion unit 150. Also, the deviation and wander of the modulation frequency of the optical signal and the sampling frequency in the digital coherent receiver 100 is compensated, and it is possible to reduce the phase compensation amount in the waveform distortion compensation circuit 161.

Also, the adaptive equalization type demodulation circuit 163 of the digital coherent receiver 100 compensates the waveform distortion fluctuating at a speed higher than the waveform distortion compensated in the waveform distortion compensation circuit 161 to carry out the demodulation. For example, the waveform distortion compensation circuit 161 compensates the waveform distortion of a semi-static characteristic which changes under the temperature fluctuation or the like. With this configuration, while compensating the phase fluctuation due to the frequency of the transmission light source and the frequency drift of the local light source 112 generated under the temperature fluctuation or the like is compensated in the waveform distortion compensation circuit 161, it is possible to carry out the high precision waveform distortion compensation and demodulation in the adaptive equalization type demodulation circuit 163.

Figure 2:
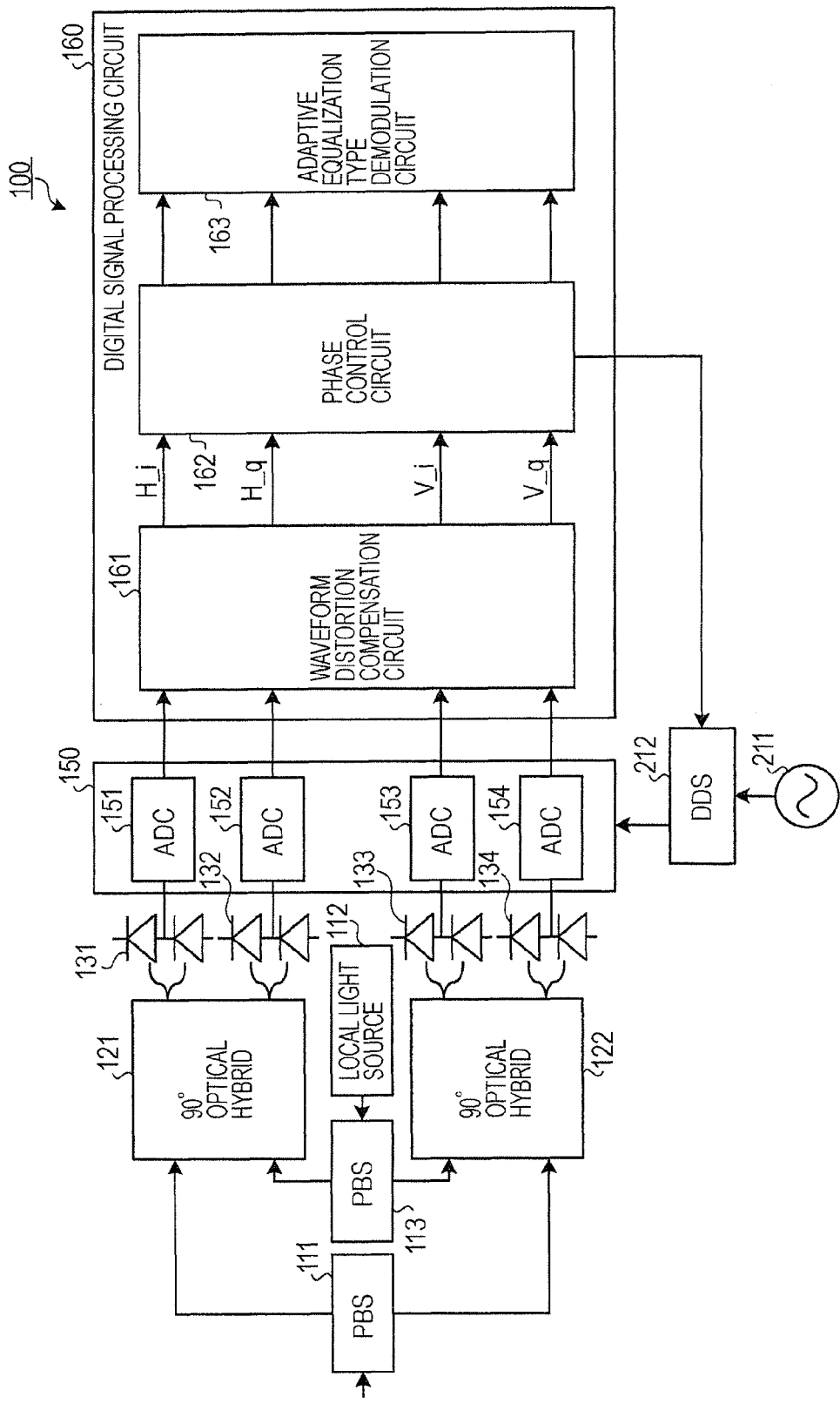
FIG. 2 is a block diagram showing a configuration example 2 of the digital coherent receiver.

FIG. 2 is a block diagram showing a configuration example 2 of the digital coherent receiver. In FIG. 2, a part similar to the configuration shown in FIG. 1 is assigned with the similar reference symbol, and a description thereof is omitted. As shown in FIG. 2, the digital coherent receiver 100 may be provided with a fixed-frequency oscillator 211 and a DDS 212 (Direct Digital Synthesizer) instead of the frequency variable oscillator 140 shown in FIG. 1.

The fixed-frequency oscillator 211 (oscillation unit) generates a fixed frequency clock to be output to the DDS 212. On the basis of the clock output from the fixed-frequency oscillator 211, the DDS 212 generates a clock to be supplied to the digital conversion unit 150 as a sampling control clock. Also, the DDS 212 changes the frequency of the clock to be generated on the basis of the control of the digital signal processing circuit 160. Each of the ADCs 151 to 154 performs the digital sampling in synchronism with the clock output from the DDS 212.

In this manner, the digital coherent receiver 100 controls the frequency of the sampling control clock supplied by the DDS. With this configuration, while the enlargement in the circuit scale is suppressed, it is possible to carry out the high speed sampling in the digital conversion unit 150.

Figure 3:
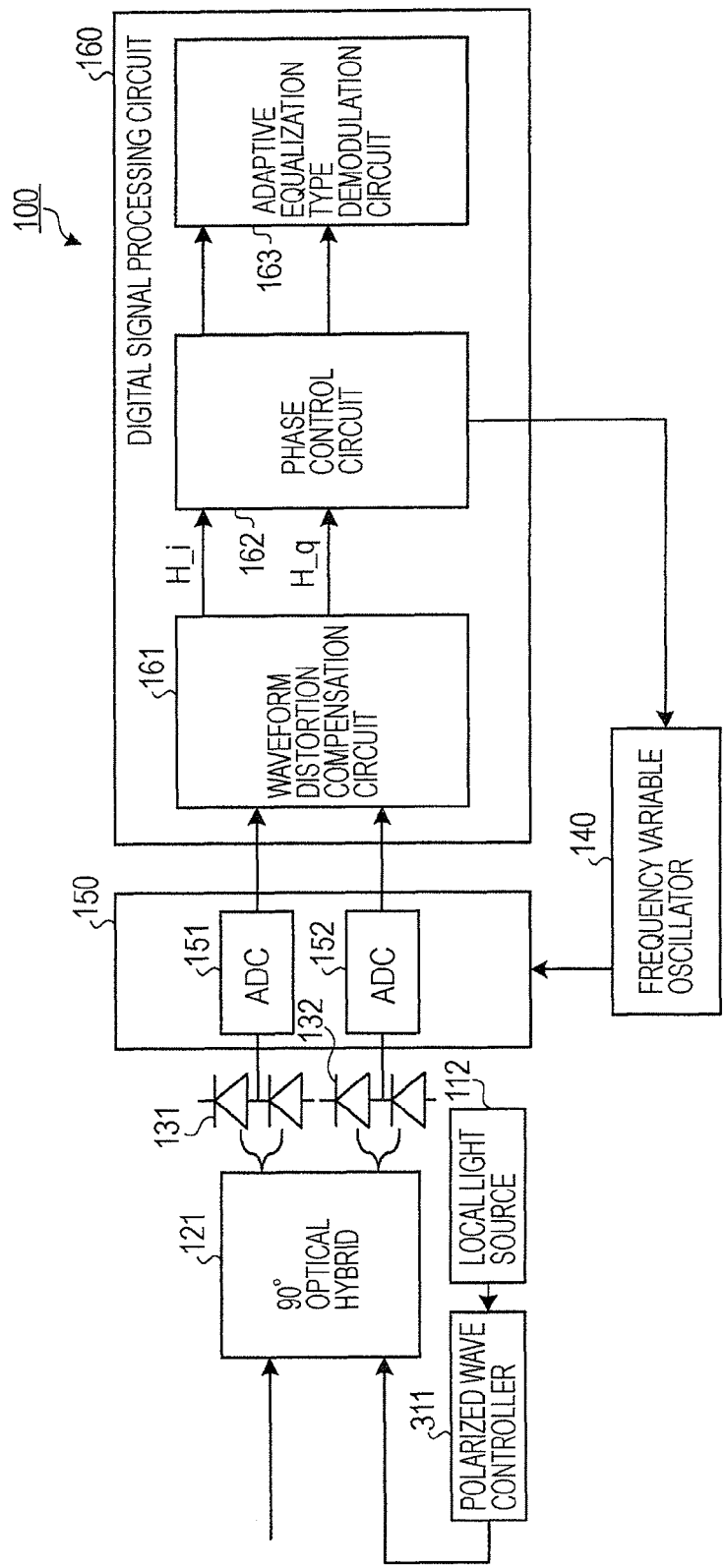
FIG. 3 is a block diagram showing a configuration example 3 of the digital coherent receiver.

FIG. 3 is a block diagram showing a configuration example 3 of the digital coherent receiver. In FIG. 3, a part similar to the configuration shown in FIG. 1 is assigned with the similar reference symbol, and a description thereof is omitted. As shown in FIG. 3, the digital coherent receiver 100 in the case of the non-polarized wave multiplex system may have a configuration provided with a polarized wave controller 311 instead of the PBS 111, the PBS 113, the hybrid circuit 122, the photoelectric converters 133 and 134 and the ADCs 153 and 154 shown in FIG. 1.

The local light source 112 outputs the generated local light to the polarized wave controller 311. The polarized wave controller 311 controls the polarized wave of the local light output from the local light source 112 so as to be a polarized wave of the signal light received by the digital coherent receiver 100 (for example, H axis). The polarized wave controller 311 outputs the local light in which the polarized wave is controlled to the hybrid circuit 121. To the hybrid circuit 121, the signal light sent via the optical transmission path and the local light output from the polarized wave controller 311 are input. such a configuration may be adopted that instead of the frequency variable oscillator 140 shown in FIG. 3, the fixed-frequency oscillator 211 and the DDS 212 (see FIG. 2) is provided. the polarized wave controller 311 may be applied to the signal light sent via the optical transmission path instead of the local light.

Figure 4:
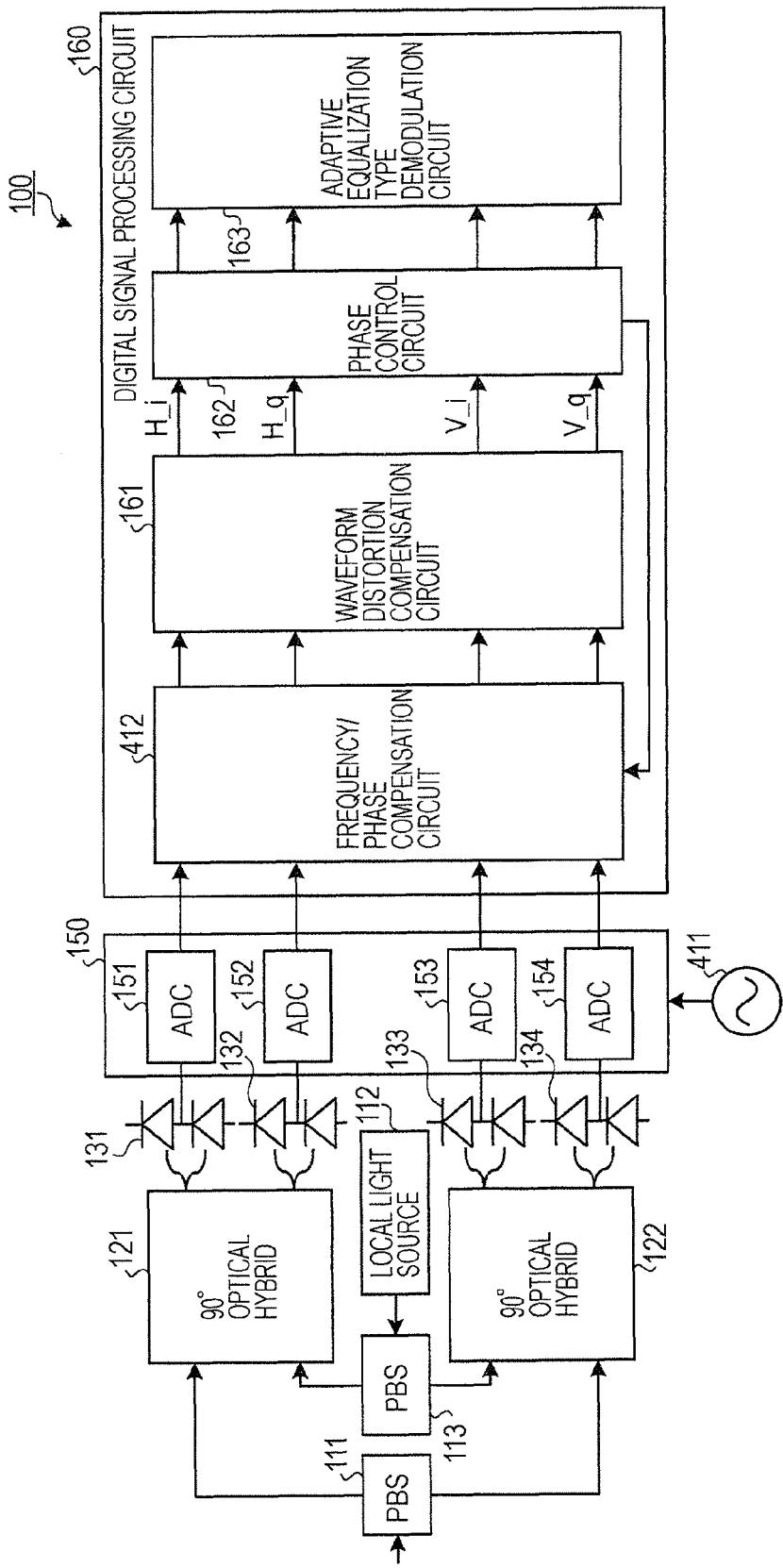
FIG. 4 is a block diagram showing a configuration example 4 of the digital coherent receiver.

FIG. 4 is a block diagram showing a configuration example 4 of the digital coherent receiver. In FIG. 4, a part similar to the configuration shown in FIG. 1 is assigned with the similar reference symbol, and a description thereof is omitted. As shown in FIG. 4, the digital coherent receiver 100 may be provided with a fixed-frequency oscillator 411 and a frequency/phase compensation circuit 412 instead of the frequency variable oscillator 140.

The fixed-frequency oscillator 411 outputs the fixed frequency clock to the digital conversion unit 150. Each of the ADCs 151 to 154 performs the digital sampling in synchronism with the clock output from the fixed-frequency oscillator 411. The phase control circuit 162 detects the phases of the respective signals output from the waveform distortion compensation circuit 161 and outputs the frequency control signal and the phase control signal to the frequency/phase compensation circuit 412.

The frequency/phase compensation circuit 412 (frequency/phase compensation unit) is provided to the digital signal processing circuit 160. The frequency/phase compensation circuit 412 performs the frequency compensation and the phase compensation on the signal output from the ADCs 151 to 154 to compensate the sampling phase. To be more specific, on the basis of the frequency control signal and the phase control signal output from the phase control circuit 162, the frequency/phase compensation circuit 412 compensates the sampling phase of the signal output from the ADCs 151 to 154. The frequency/phase compensation circuit 412 outputs the signal in which the sampling phase is compensated to the waveform distortion compensation circuit 161.

In this manner, the digital coherent receiver 100 performs the frequency compensation and the phase compensation on the signal converted into the digital signal on the basis of the detected phase. With this configuration, it is possible to suppress the influence on the digital processing from the fluctuation of the sampling phase in the digital conversion unit 150. For this reason, for example, even when such a configuration that the digital conversion unit 150 performs the sampling in synchronism with the clock oscillated by the fixed-frequency oscillator 411 is adopted, it is possible to suppress the influence on the digital processing from the fluctuation of the sampling phase in the digital conversion unit 150.

(Specific Example of Phase Control Circuit)

Figure 5:
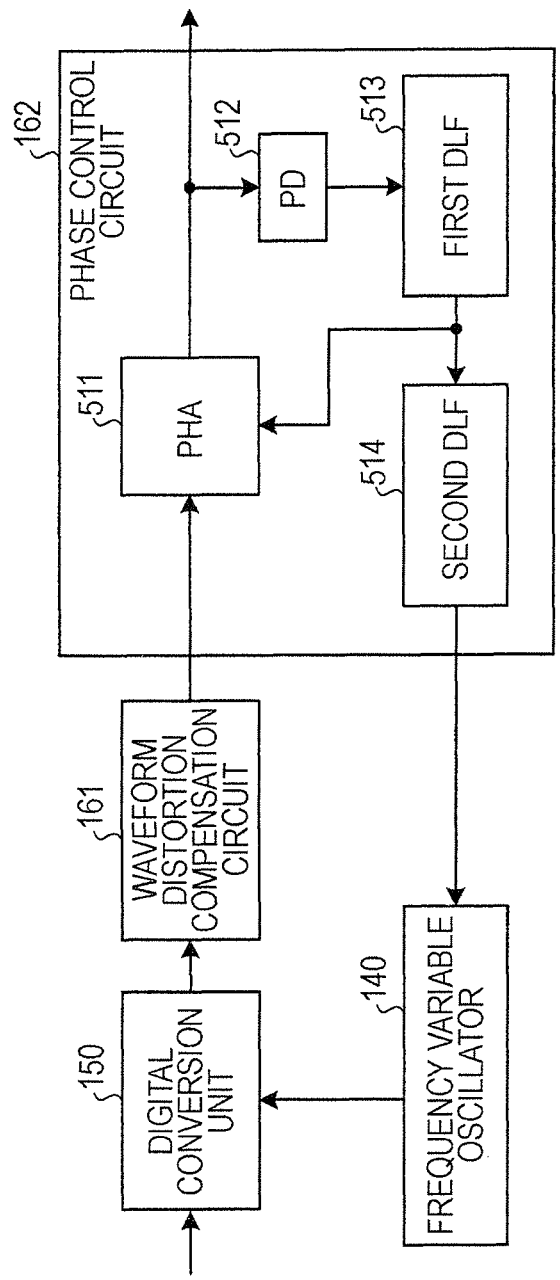
FIG. 5 is a block diagram showing a specific example 1 of the phase control circuit shown in FIGS. 1 to 3.

FIG. 5 is a block diagram showing a specific example 1 of the phase control circuit shown in FIGS. 1 to 3. In FIG. 5, with regard to a part of the configuration of the digital coherent receiver 100 shown in FIG. 1, the respective signals for I and Q channels and the H and V axes are collectively illustrated. As shown in FIG. 5, the phase control circuit 162 is provided with a phase adjuster 511 (PHA: PHase Adjuster), a phase detection unit 512 (PD: Phase Detector), a first DLF 513 (Digital Loop Filter), and a second DLF 514.

The phase adjuster 511 (phase compensation unit) compensates the phase of the signal output from the waveform distortion compensation circuit 161 on the basis of the phase control signal output from the first DLF 513. The phase adjuster 511 outputs the signal in which the phase is compensated to the subsequent stage (the adaptive equalization type demodulation circuit 163). The phase detection unit 512 detects the phase of the signal output from the phase adjuster 511. The phase detection unit 512 outputs the detected phase signal indicating the phase to the first DLF 513.

The first DLF 513 conducts a signal processing on the phase signal output from the phase detection unit 512. The signal processing conducted by the first DLF 513 is, for example, noise removal (low pass filter). The first DLF 513 outputs the signal subjected to the signal processing as the phase control signal to the phase adjuster 511. Also, the first DLF 513 outputs the signal subjected to the signal processing to the second DLF 514.

The second DLF 514 performs a signal processing on the signal output from the first DLF 513. The signal processing performed by the second DLF 514 is, for example, the transform from the phase component into the frequency component. The second DLF 514 outputs the signal subjected to the signal processing as the frequency control signal to the frequency variable oscillator 140. On the basis of the frequency control signal output from the second DLF 514, the frequency variable oscillator 140 changes the frequency of the clock to be output.

In this manner, the phase detection unit 512 is provided to the subsequent stage of the phase adjuster 511 and detects the phase of the signal compensated by the phase adjuster 511. With this configuration, as the control becomes a feed back control in which the phase compensation result in the phase adjuster 511 returns from the phase detection unit 512 to the phase adjuster 511, it is possible to easily perform the compensation processing in the phase adjuster 511. For this reason, the phase compensation in the phase adjuster 511 can be carried out precisely, and it is possible to improve the communication quality.

In a case where the configuration of the phase control circuit 162 shown in FIG. 5 is applied to the digital coherent receiver 100 shown in FIG. 2, the second DLF 514 outputs the frequency control signal to the DDS 212. On the basis of the frequency control signal output from the second DLF 514, the DDS 212 changes the frequency of the clock to be generated.

Figure 6:
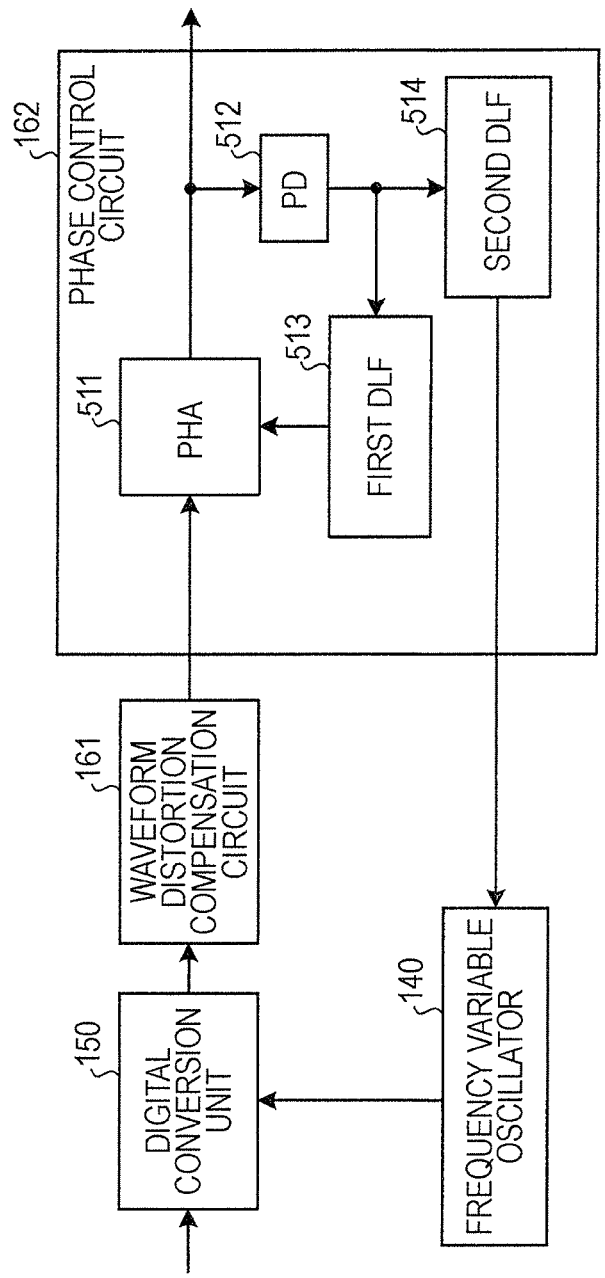
FIG. 6 is a block diagram showing a specific example 2 of the phase control circuit shown in FIGS. 1 to 3.

FIG. 6 is a block diagram showing a specific example 2 of the phase control circuit shown in FIGS. 1 to 3. In FIG. 6, a configuration similar to the configuration shown in FIG. 5 is assigned with the same reference symbol, and a description thereof is omitted. As shown in FIG. 6, the phase detection unit 512 may output the detected phase signal indicating the phase to the first DLF 513 and the second DLF 514. In this case, the second DLF 514 conducts the signal processing on the phase signal output from the phase detection unit 512.

Figure 7:
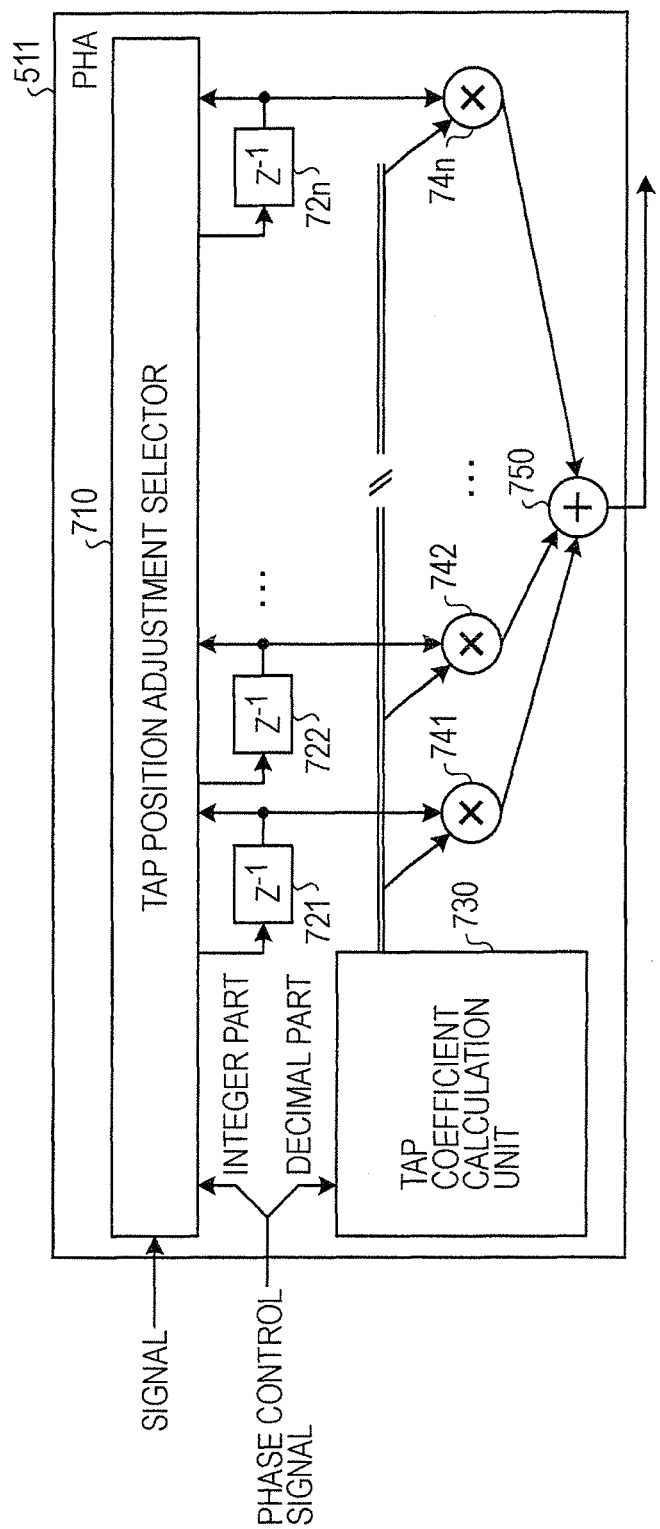
FIG. 7 is a block diagram showing a specific example 1 of a phase adjuster.

FIG. 7 is a block diagram showing a specific example 1 of a phase adjuster. The phase adjuster 511 shown in FIG. 7 is a specific example of a time domain compensation type phase adjuster. As shown in FIG. 7, the phase adjuster 511 is provided with a tap position adjustment selector 710, a delay elements 721 to 72n, a tap coefficient calculation unit 730, multiplication units 741 to 74n, and an adder unit 750.

To the tap position adjustment selector 710, the signal output from the former stage of the phase adjuster 511 and an integer part obtained by dividing the phase control signal input to the phase adjuster 511 by the sampling period are input. The tap position adjustment selector 710 switches connection paths of the delay elements 721 to 72n in accordance with the input integer part.

For example, the tap position adjustment selector 710 switches the connection paths so that the signal output from the former stage of the phase adjuster 511 (the waveform distortion compensation circuit 161) is input to the delay element 721. Also, the tap position adjustment selector 710 switches the connection path so that the output of the delay element 721 is connected to the input of the delay element 722, the output of the delay element 722 is connected to the input of the delay element 723, . . . , and the output of the delay element 72(n−1) is connected to the input of the delay element 72n.

Each of the delay elements 721 to 72n delays and outputs the input signal. To the tap coefficient calculation unit 730, a decimal part obtained by dividing the phase control signal input to the phase adjuster 511 by the sampling period (phase less than 1 sample) is input. On the basis of the input decimal part, the tap coefficient calculation unit 730 calculates the respective tap coefficients of the multiplication units 741 to 74n.

For example, the tap coefficient calculation unit 730 calculates the tap coefficients by sampling a filtering waveform such as a sinc function by the input phase of the decimal part. Alternatively, the tap coefficient calculation unit 730 decides the respective tap coefficients on the basis of a table in which the decimal parts and the respective tap coefficients are associated with each other. The table in which the decimal parts and the respective tap coefficients are associated with each other is previously stored, for example, in a memory of the digital coherent receiver 100. The tap coefficient calculation unit 730 respectively outputs the calculated respective tap coefficients to the multiplication units 741 to 74n.

To the multiplication units 741 to 74n, the output signals of the delay elements 721 to 72n and the tap coefficients output from the tap coefficient calculation unit 730 are respectively input. Each of the multiplication units 741 to 74n multiplies the thus input output signal by the tap coefficient to be output to the adder unit 750. The adder unit 750 adds the respective output signals output from the multiplication units 741 to 74n to be output to the subsequent stage.

In a case where the signals are input in N parallel with respect to the phase adjuster 511, the delay elements 721 to 72n are omitted, and input selectors at a maximum width of the integer part of the phase control signal and FIR (Finite Impulse Response) filters having the same tap coefficient calculated by the tap coefficient calculation unit 730 are operated in parallel by N pieces. In this case, the input selectors are provided by the number of the taps.

Figure 8:
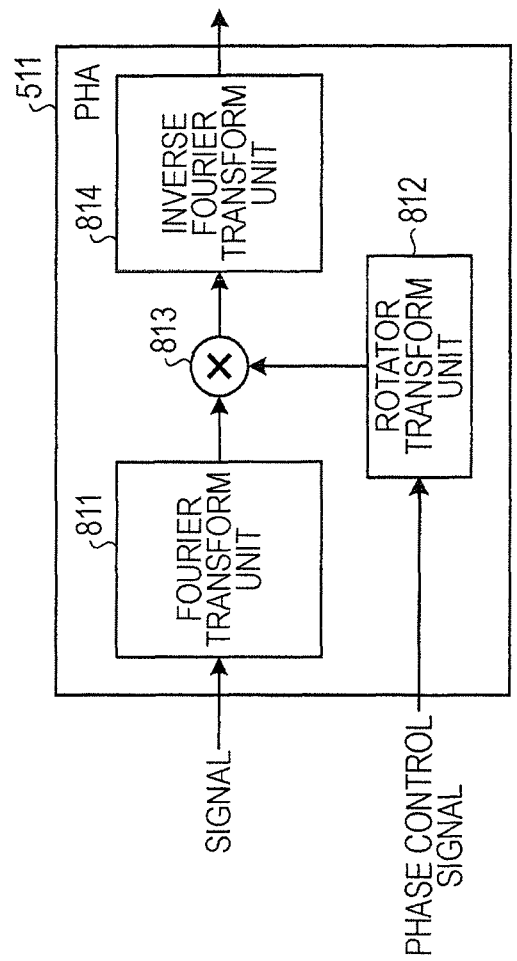
FIG. 8 is a block diagram showing a specific example 2 of the phase adjuster.

FIG. 8 is a block diagram showing a specific example 2 of the phase adjuster. The phase adjuster 511 shown in FIG. 8 is a specific example of a frequency domain compensation type phase adjuster. As shown in FIG. 8, the phase adjuster 511 is provided with a Fourier transform unit 811, a rotator transform unit 812, a multiplication unit 813, and an inverse Fourier transform unit 814. The Fourier transform unit 811 subjects the signal input to the phase adjuster 511 to Fourier Transform (FFT: Fast Fourier Transform) to be transformed into the frequency domain. The Fourier transform unit 811 outputs the signal subjected to the Fourier transform to the multiplication unit 813.

The rotator transform unit 812 performs the rotator transform processing on the phase control signal output from the first DLF 513 and outputs the phase shift coefficient obtained through the rotator transform processing to the multiplication unit 813. The multiplication unit 813 multiplies the signal output from the Fourier transform unit 811 by the phase shift coefficient output from the rotator transform unit 812 and outputs the multiplied signal to the inverse Fourier transform unit 814. The inverse Fourier transform unit 814 subjects the signal output from the multiplication unit 813 to Inverse Fourier Transformation (IFFT: Inverse FFT: Inverse Fast Fourier Transformation) to be output to the subsequent stage (the adaptive equalization type demodulation circuit 163).

Figure 9:
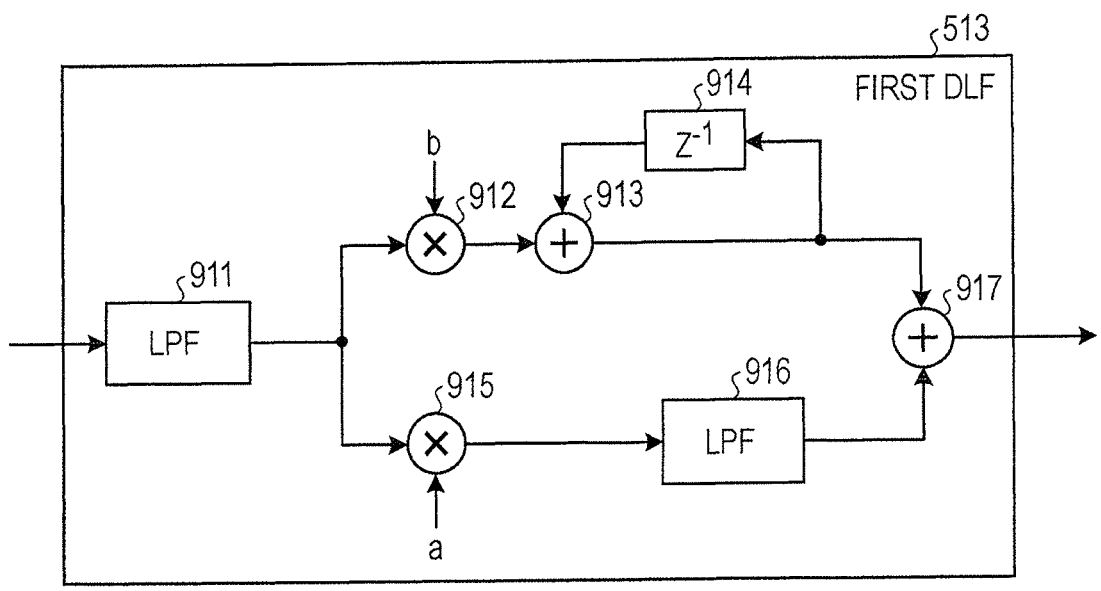
FIG. 9 is a block diagram showing a specific example of a first DLF.

FIG. 9 is a block diagram showing a specific example of the first DLF. As shown in FIG. 9, the first DLF 513 is provided with a low pass filter 911 (LPF: Low Pass Filter), a multiplication circuit 912, an adder circuit 913, a delay element 914, a multiplication circuit 915, a low pass filter 916, and an adder circuit 917. To the low pass filter 911, the phase signal output from the phase detection unit 512 is input. The low pass filter 911 extracts a low frequency component of the input phase signal and outputs the extracted signal to the multiplication circuit 912 and the multiplication circuit 915.

The multiplication circuit 912 multiplies the signal output from the low pass filter 911 by a coefficient b to be output to the adder circuit 913. The adder circuit 913 adds the signal output from the multiplication circuit 912 with the signal output from the delay element 914 to output the added signal as an integral term to the delay element 914 and the adder circuit 917. The delay element 914 delays the signal output from the adder circuit 913 by one operational clock of the first DLF and outputs the delayed signal to the adder circuit 913.

The multiplication circuit 915 multiplies the signal output from the low pass filter 911 by a coefficient a to be output to the low pass filter 916. The low pass filter 916 extracts the low frequency component of the signal output from the multiplication circuit 915 and outputs the extracted signal as a proportional term to the adder circuit 917. The adder circuit 917 adds the signal of the integral term output from the adder circuit 913 with the signal of the proportional term output from the low pass filter 916. The adder circuit 917 outputs the added signal as the phase control signal to the phase adjuster 511.

With the configuration, the phase signal input to the first DLF 513 is converted as a sum of the proportional term and the integral term having the coefficients a and b into the phase control signal. The coefficients a and b are decided, for example, in accordance with a design and a transmission mode of the digital coherent receiver 100.

The low pass filter 911 operates as a decimation filter for processing the respective phase signals of the paralleled respective signals (the I and Q channels and the H and V axes). For example, as a simple example, the low pass filter 911 outputs an average or a total sum of the respective phase signals. it is also possible to adopt a configuration omitting the low pass filter 911.

The low pass filter 916 is provided for suppressing the high frequency noise component of the phase signal. In some cases, the frequency fluctuation of the local light source 112 may have a component equal to or higher than several hundreds of kHz. For this reason, in order to minimize the control loop delay, the low pass filter 916 for suppressing the high frequency noise is inserted only to the proportional term. it is also possible to adopt a configuration omitting the low pass filter 916.

Figure 10:
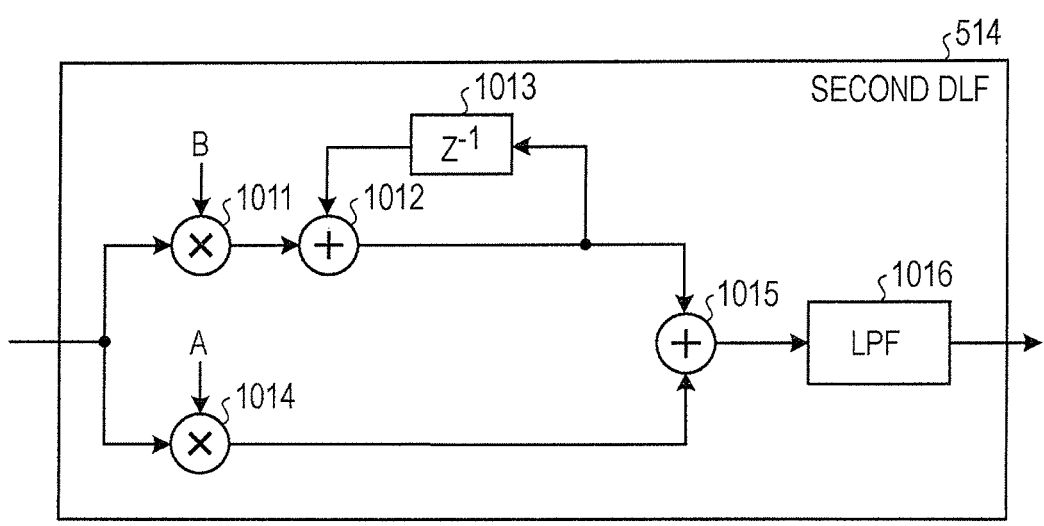
FIG. 10 is a block diagram showing a specific example of a second DLF.

FIG. 10 is a block diagram showing a specific example of the second DLF. As shown in FIG. 10, the second DLF 514 is provided with a multiplication circuit 1011, an adder circuit 1012, a delay element 1013, a multiplication circuit 1014, an adder circuit 1015, and a low pass filter 1016. The phase signal input to the second DLF 514 (or the phase control signal input) is input to the multiplication circuit 1011 and the multiplication circuit 1014.

The multiplication circuit 1011 multiplies the input signal by a coefficient B to be output to the adder circuit 1012. The adder circuit 1012 adds the signal output from the multiplication circuit 101 with the signal output from the delay element 1013 and outputs the added signal as the integral term to the delay element 1013 and the adder circuit 1015. The delay element 1013 delays the signal output from the adder circuit 1012 by one operational clock of the second DLF and outputs the delayed signal to the adder circuit 1012.

The multiplication circuit 1014 multiplies the input signal by a coefficient A and outputs the multiplied signal as the proportional term to the adder circuit 1015. The adder circuit 1015 adds the signal of the integral term output from the adder circuit 1012 with the signal of the proportional term output from the multiplication circuit 1014 to be output to the low pass filter 1016. The low pass filter 1016 extracts the low frequency component of the signal output from the adder circuit 1015 and outputs the extracted signal as the frequency control signal to the frequency variable oscillator 140.

With the configuration, the signal input to the second DLF 514 is converted as a sum of the proportional term and the integral term having the coefficients A and B into the frequency control signal. The coefficients A and B are decided, for example, in accordance with a design and a transmission mode of the digital coherent receiver 100.

For example, as shown in FIG. 6, in a case where the phase signal output from the phase detection unit 512 is directly input to the second DLF 514, a low pass filter may be provided in the former stage of the multiplication circuit 1011 and the multiplication circuit 1014. The low pass filter provided in the former stage of the multiplication circuit 1011 and the multiplication circuit 1014 conducts the integral operation of the decimation filter for the phase signals and the phase information. Also, the low pass filter 1016 is a low pass filter for avoiding the high frequency noise placed on the clock output from the frequency variable oscillator 140. it is also possible to adopt a configuration omitting the low pass filter 1016.

Figure 11:
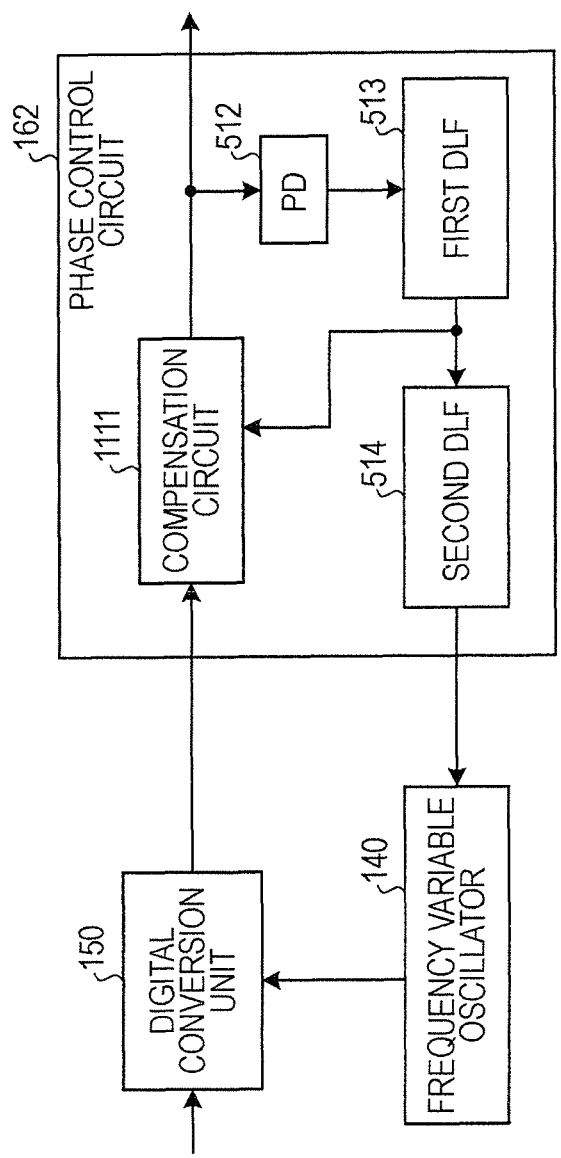
FIG. 11 is a block diagram showing a specific example 3 of the phase control circuit shown in FIGS. 1 to 3.

FIG. 11 is a block diagram showing a specific example 3 of the phase control circuit shown in FIGS. 1 to 3. In FIG. 11, a configuration similar to the configuration shown in FIG. 5 is assigned with the same reference symbol, and a description thereof is omitted. In a case where the waveform distortion compensation circuit 161 is a circuit for conducting the waveform distortion compensation in the frequency domain, as shown in FIG. 11, a compensation circuit 1111 in which the waveform distortion compensation circuit 161 and the phase adjuster 511 are integrally constructed may be provided instead of the waveform distortion compensation circuit 161 and the phase adjuster 511 shown in FIG. 5. such a configuration may be adopted that instead of the frequency variable oscillator 140 shown in FIG. 11, the fixed-frequency oscillator 211 and the DDS 212 (see FIG. 2) are provided.

Figure 12:
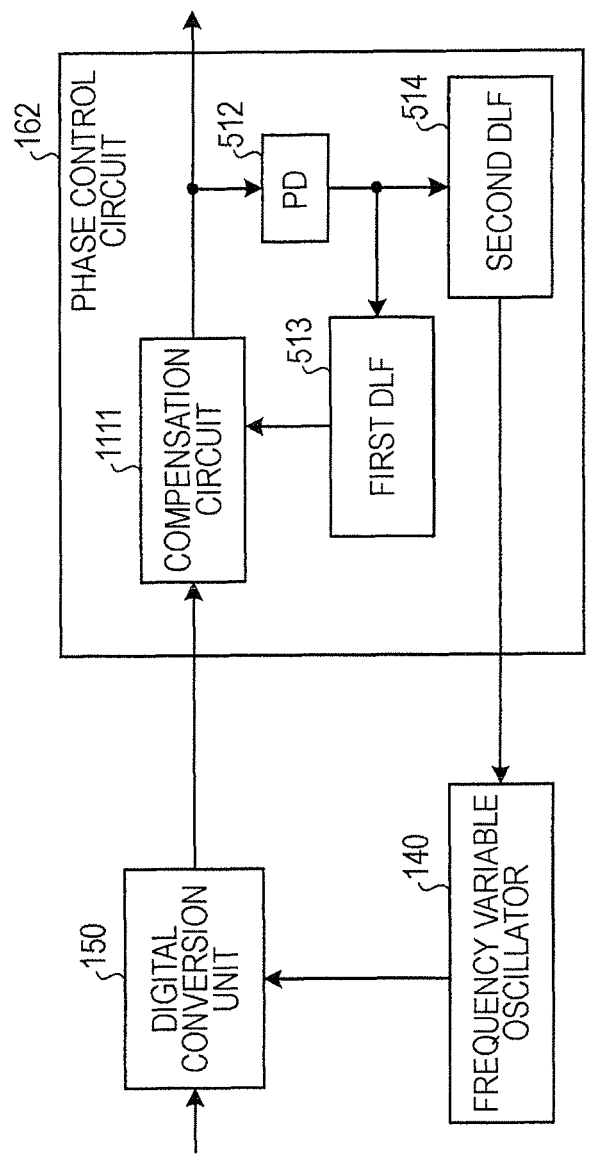
FIG. 12 is a block diagram showing a specific example 4 of the phase control circuit shown in FIGS. 1 to 3.

FIG. 12 is a block diagram showing a specific example 4 of the phase control circuit shown in FIGS. 1 to 3. In FIG. 12, a configuration similar to the configuration shown in FIG. 6 is assigned with the same reference symbol, and a description thereof is omitted. In a case where the waveform distortion compensation circuit 161 is a circuit for conducting the waveform distortion compensation in the frequency domain, as shown in FIG. 12, instead of the waveform distortion compensation circuit 161 and the phase adjuster 511 shown in FIG. 6, the compensation circuit 1111 in which the waveform distortion compensation circuit 161 and the phase adjuster 511 are integrally constructed may be provided. such a configuration may be adopted that instead of the frequency variable oscillator 140 shown in FIG. 12, the fixed-frequency oscillator 211 and the DDS 212 (see FIG. 2) are provided.

Figure 13:
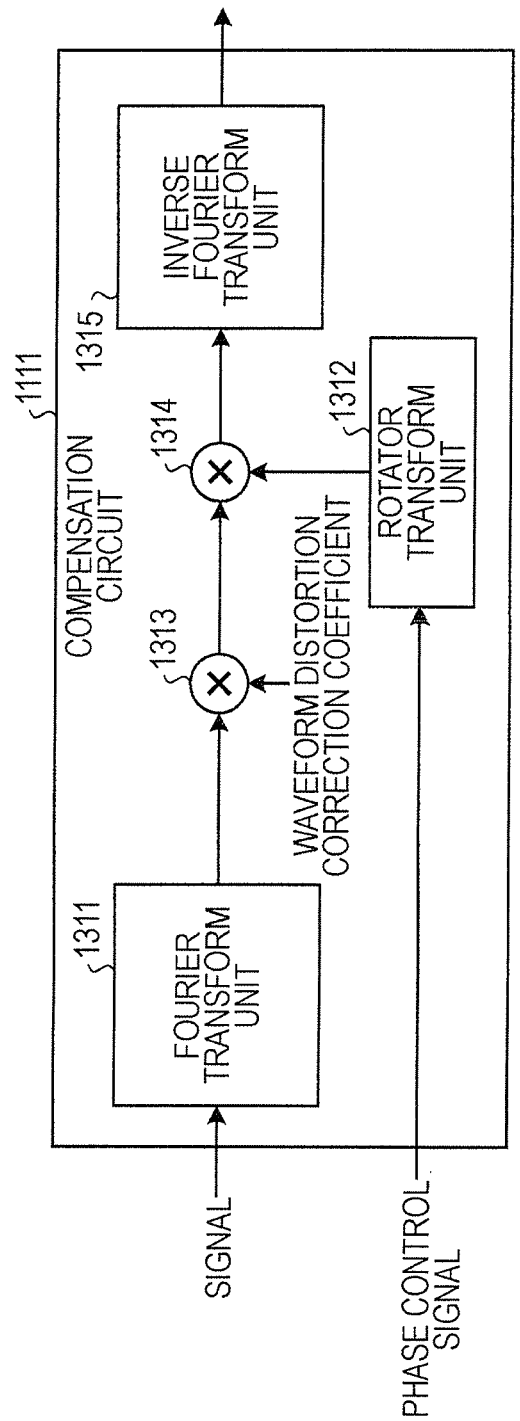
FIG. 13 is a block diagram showing a specific example 1 of a compensation circuit.

FIG. 13 is a block diagram showing a specific example 1 of the compensation circuit. The compensation circuit 1111 shown in FIGS. 11 and 12 is provided, for example, as shown in FIG. 13, with a Fourier transform unit 1311, a rotator transform unit 1312, a multiplication unit 1313, a multiplication unit 1314, and an inverse Fourier transform unit 1315.

The Fourier transform unit 1311 performs the Fourier transform on the signal input to the compensation circuit 1111 to be transformed into the frequency domain. The Fourier transform unit 1311 outputs the signal subjected to the Fourier transform to the multiplication unit 1313. The rotator transform unit 1312 performs the rotator transform processing on the phase control signal output from of the first DLF 513 and outputs the phase shift coefficient obtained through the rotator transform processing to the multiplication unit 1314.

The multiplication unit 1313 multiplies the signal output from the Fourier transform unit 1311 by the waveform distortion correction coefficient in the frequency domain and outputs the multiplied signal to the multiplication unit 1314. The waveform distortion correction coefficient multiplied in the multiplication unit 1313 is a coefficient decided in accordance with the waveform distortion of the reception signal and is previously stored, for example, in the memory of the digital coherent receiver 100.

The multiplication unit 1314 multiplies the signal output from the multiplication unit 1313 by the phase shift coefficient output from the rotator transform unit 1312 and outputs the multiplied signal to the inverse Fourier transform unit 1315. The inverse Fourier transform unit 1315 subjects the signal output from the multiplication unit 1314 to the inverse Fourier transform to be output to the subsequent stage (the adaptive equalization type demodulation circuit 163). such a configuration may also be adopted that the multiplication unit 1314 is provided in the former stage of the multiplication unit 1313. That is, the order for multiplying the waveform distortion correction coefficient and the phase shift coefficient does not make difference in either way.

In this manner, the waveform distortion compensation circuit 161 and the phase adjuster 511 can be realized by the compensation circuit 1111 for multiplying the waveform distortion correction coefficient by the phase shift coefficient obtained by transforming the phase control signal transformed by the first DLF 513 into the rotator of the respective frequencies in the frequency domain. With this configuration, the waveform compensation and the phase compensation can be carried out by performing the Fourier transform by one time. For this reason, it is possible to realize the miniaturization and speeding up of the circuit.

Figure 14:
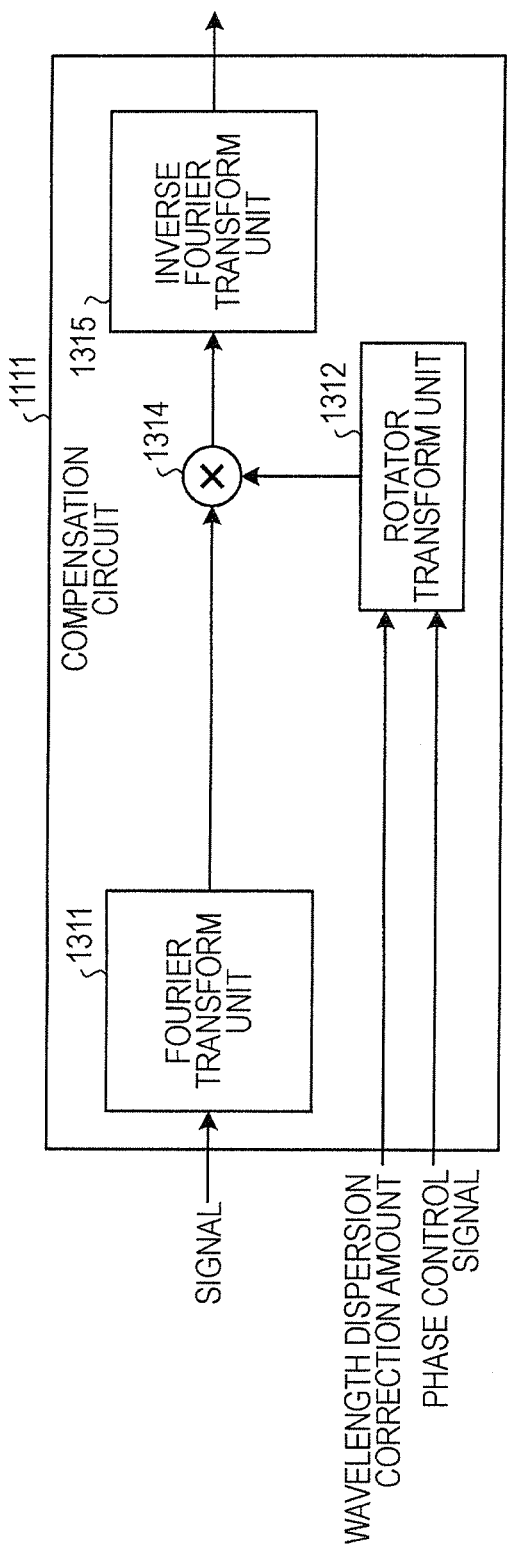
FIG. 14 is a block diagram showing a specific example 2 of the compensation circuit.

FIG. 14 is a block diagram showing a specific example 2 of the compensation circuit. In FIG. 14, a configuration similar to the configuration shown in FIG. 13 is assigned with the same reference symbol, and a description thereof is omitted. The waveform distortion compensation circuit 161 is a dispersion compensator for compensating the wavelength dispersion of the signal, and in a case where the waveform distortion compensation target in the frequency domain is the wavelength dispersion, the compensation circuit 1111 may have a configuration shown in FIG. 14. Herein, the compensation circuit 1111 has a configuration omitting the multiplication unit 1313 shown in FIG. 13.

The Fourier transform unit 1311 outputs the signal subjected to the Fourier transform to the multiplication unit

1314. The rotator transform unit 1312 (rotator transformer) conducts the rotator transform processing at the wavelength dispersion compensation amount with the phase control signal output from the first DLF 513 and outputs the rotator obtained through the rotator transform processing (the wavelength dispersion and the shift coefficient of the phase) to the multiplication unit 1314. The wavelength dispersion amount at which the rotator transform processing is conducted in the rotator transform unit 1312 is a coefficient decided in accordance with the wavelength dispersion of the reception signal and is previously stored, for example, in the memory of digital coherent receiver 100.

The multiplication unit 1314 multiplies the Fourier transform unit 1311 by the rotator output from the rotator transform unit 1312 and outputs the multiplied signal to the inverse Fourier transform unit 1315. In this manner, with use of a state in which the wavelength dispersion compensation coefficient represented by the expression (6) has an amplitude of 1.0 and has only phase angle information, by performing the rotator transform of the wavelength dispersion amount with the phase angle information on the phase shift coefficient of the phase compensation processing, the multiplication in the frequency domain can be conducted by one time.

The processing of the rotator transform unit 1312 can be represented, for example, by the following expression (9). In the following expression (9), $\Delta\tau$ denotes a phase control amount in the time domain.

[Expression 9]

$$\exp\left[j\left(\omega\Delta\tau - \frac{\pi V_L(D-\Delta D)}{\omega_0^2}\omega^2\right)\right] \quad (9)$$

In this manner, in a case where the waveform distortion compensation circuit 161 compensates the wavelength dispersion, the compensation circuit 1111 is provided with the rotator transform unit 1312 for transforming the wavelength dispersion compensation amount and the phase control signal into rotators having the respective frequencies. Then, as the compensation circuit 1111 multiplies the signal by the rotator transformed by the rotator transform unit 1312, it is possible to carry out the waveform compensation and the phase compensation by conducting the complex multiplication by one time. For this reason, it is possible to realize the miniaturization and speeding up of the circuit.

Figure 15:
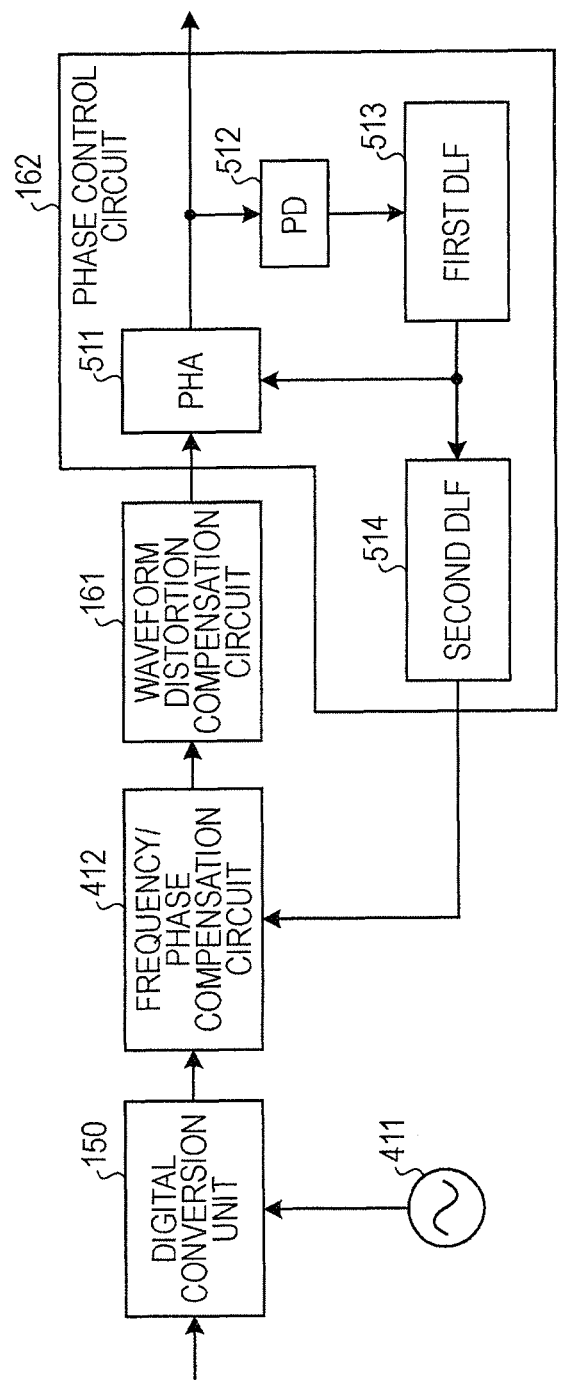
FIG. 15 is a block diagram showing a specific example 1 of the phase control circuit shown in FIG. 4.

FIG. 15 is a block diagram showing a specific example 1 of the phase control circuit shown in FIG. 4. In FIG. 15, a configuration similar to the configuration shown in FIG. 5 is assigned with the same reference symbol, and a description thereof is omitted. As shown in FIG. 15, the second DLF 514 outputs the signal subjected to the signal processing as the frequency control signal to the frequency/phase compensation circuit 412.

On the basis of the frequency control signal output from the second DLF 514, the frequency/phase compensation circuit 412 compensates the sampling phase of the signal from the digital conversion unit 150. The frequency/phase compensation circuit 412 outputs the signal in which the sampling phase is compensated to the waveform distortion compensation circuit 161. The waveform distortion compensation circuit 161 compensates the waveform distortion of the signal from the frequency/phase compensation circuit 412.

In the configuration shown in FIG. 15, such a configuration may be adopted that instead of the waveform distortion compensation circuit 161 and the phase adjuster 511, the compensation circuit 1111 in which the waveform distortion compensation circuit 161 and the phase adjuster 511 are integrally constructed (see FIGS. 11 to 14).

Figure 16:
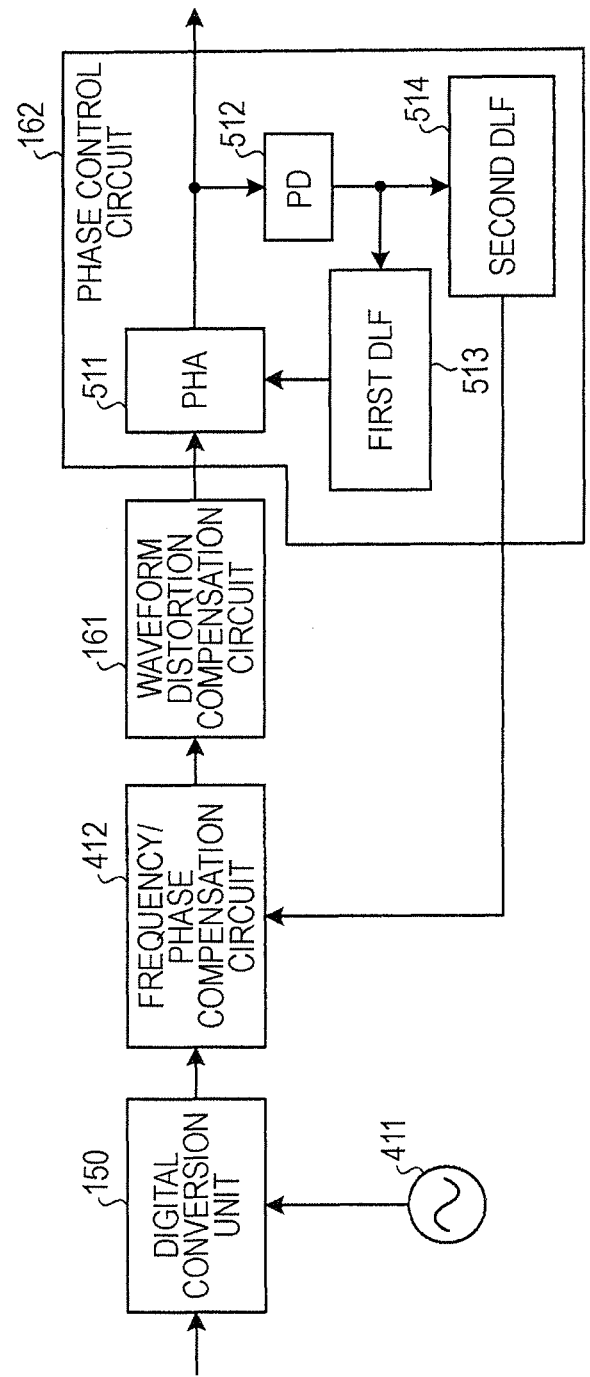
FIG. 16 is a block diagram showing a specific example 2 of the phase control circuit shown in FIG. 4.

FIG. 16 is a block diagram showing a specific example 2 of the phase control circuit shown in FIG. 4. In FIG. 16, a configuration similar to the configuration shown in FIG. 15 is assigned with the same reference symbol, and a description thereof is omitted. As shown in FIG. 16, the phase detection unit 512 may output the detected phase signal indicating the phase to the first DLF 513 and the second DLF 514. In this case, the second DLF 514 conducts the signal processing on the phase signal output from the phase detection unit 512.

In the configuration shown in FIG. 16, such a configuration may be adopted that instead of the waveform distortion compensation circuit 161 and the phase adjuster 511, the compensation circuit 1111 in which the waveform distortion compensation circuit 161 and the phase adjuster 511 are integrally constructed is provided (see FIGS. 11 to 14).

Figure 17:
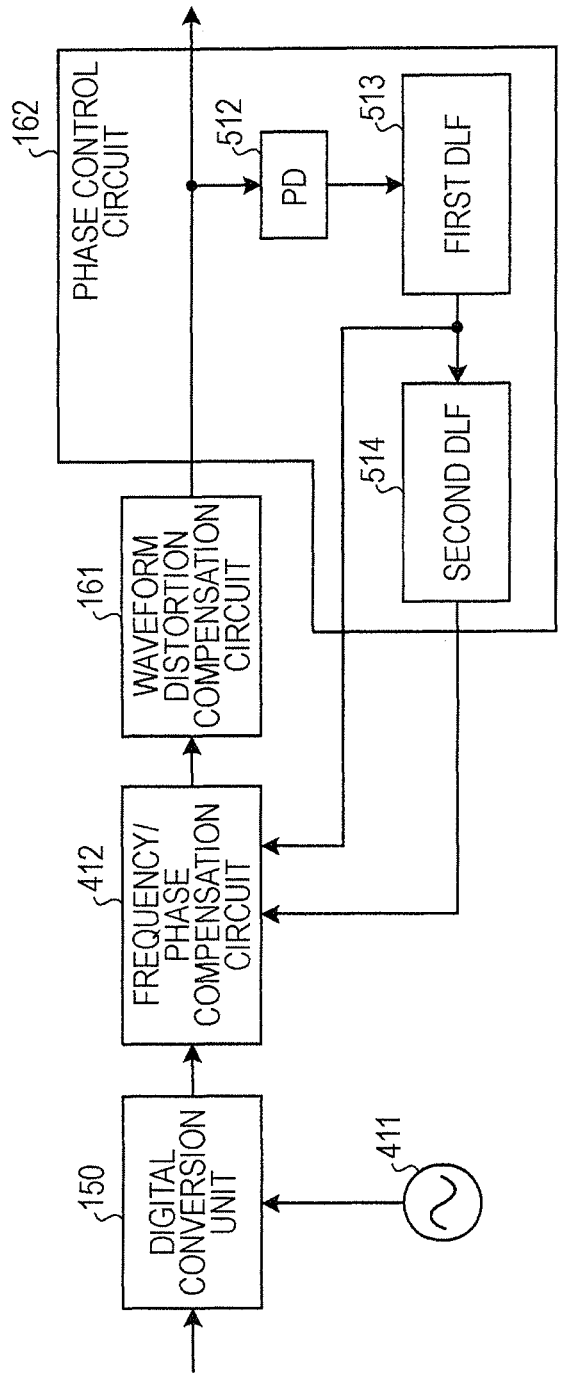
FIG. 17 is a block diagram showing a specific example 3 of the phase control circuit shown in FIG. 4.

FIG. 17 is a block diagram showing a specific example 3 of the phase control circuit shown in FIG. 4. In FIG. 17, a configuration similar to the configuration shown in FIG. 15 is assigned with the same reference symbol, and a description thereof is omitted. As shown in FIG. 17, the phase control circuit 162 may have a configuration omitting the phase adjuster 511 in the configuration shown in FIG. 15. The first DLF 513 outputs the signal subjected to the signal processing as the phase control signal to the frequency/phase compensation circuit 412.

The frequency/phase compensation circuit 412 performs the compensation for the sampling phase on the basis of the frequency control signal from the second DLF 514 and also compensates the phase of the signal output from the waveform distortion compensation circuit 161 on the basis of the phase control signal output from the first DLF 513. The frequency/phase compensation circuit 412 outputs the signal subjected to the compensation to the waveform distortion compensation circuit 161. In this manner, the compensation is conducted in the former stage of the waveform distortion compensation circuit 161 also with the inclusion of the phase fluctuation generated in the waveform distortion compensation circuit 161.

Figure 18:
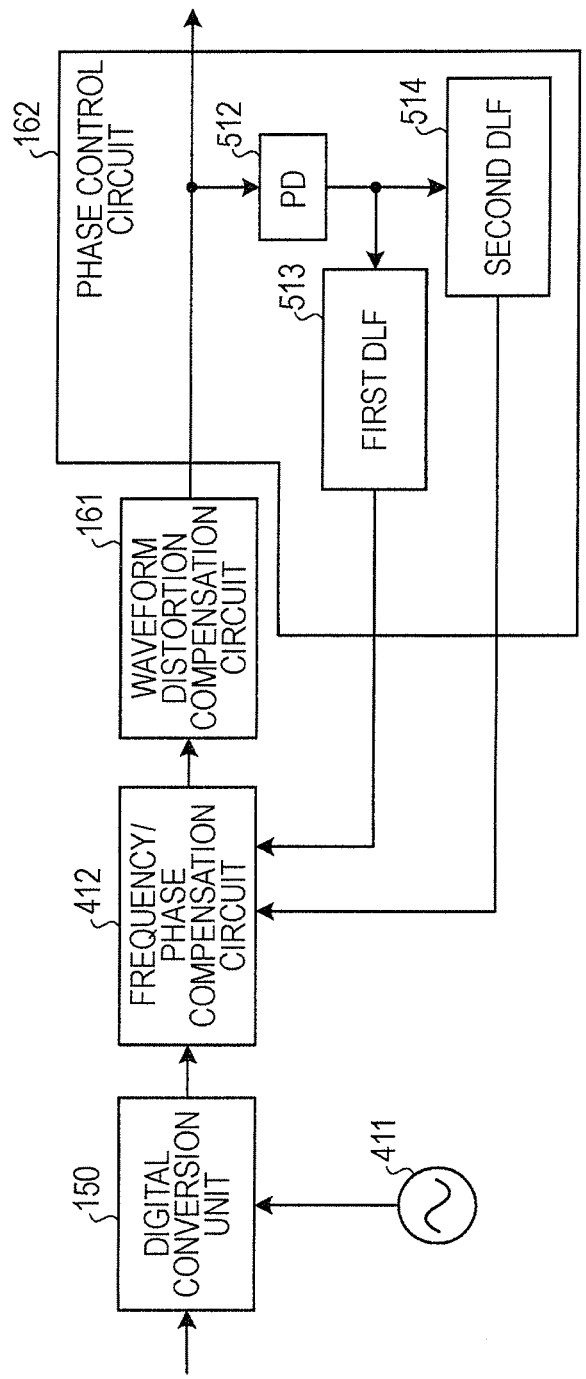
FIG. 18 is a block diagram showing a specific example 4 of the phase control circuit shown in FIG. 4.

FIG. 18 is a block diagram showing a specific example 4 of the phase control circuit shown in FIG. 4. In FIG. 18, a configuration similar to the configuration shown in FIG. 17 is assigned with the same reference symbol, and a description thereof is omitted. As shown in FIG. 18, the phase detection unit 512 may output the detected phase signal indicating the phase to the first DLF 513 and the second DLF 514. In this case, the second DLF 514 conducts the signal processing on the phase signal output from the phase detection unit 512.

Figure 19:
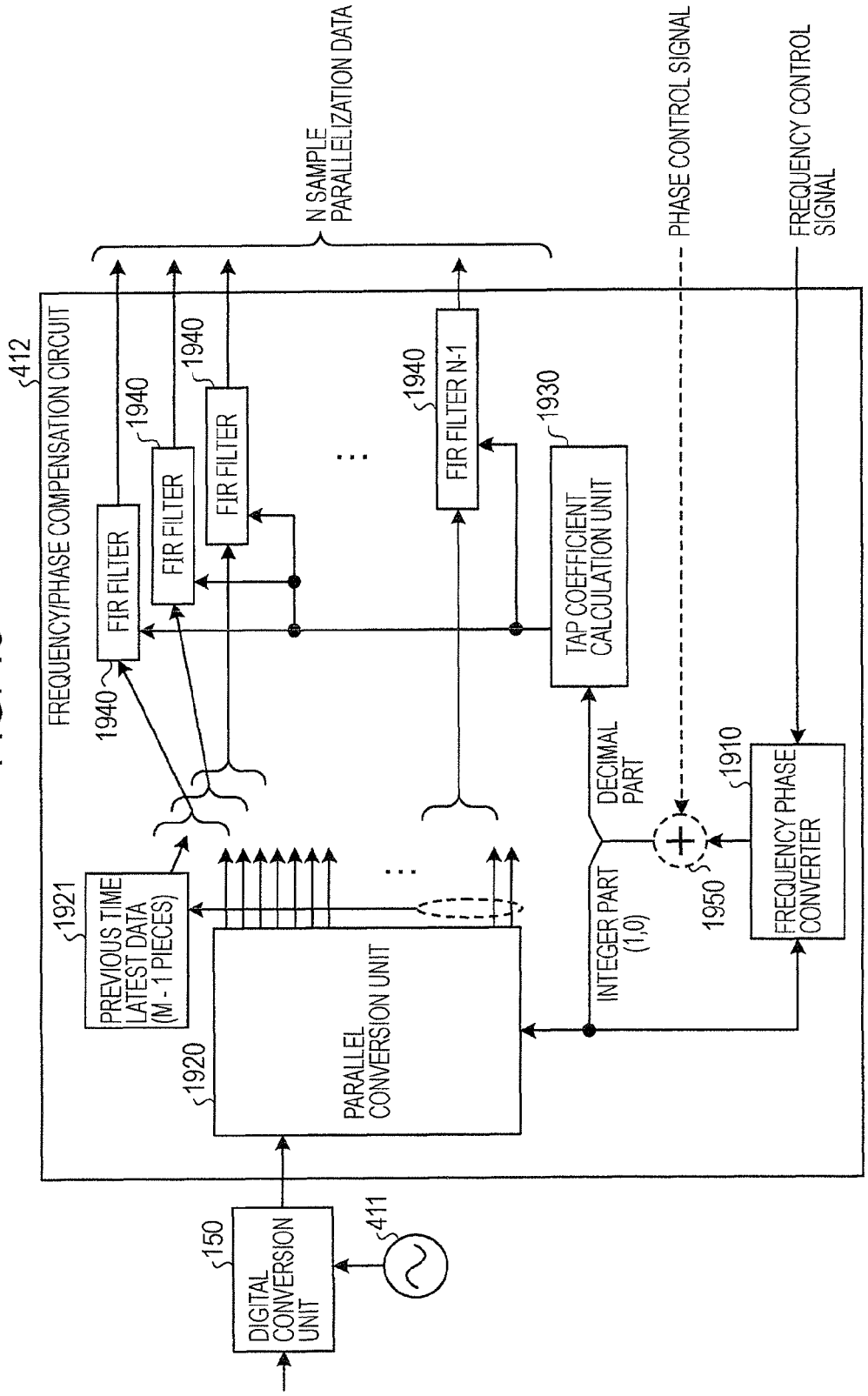
FIG. 19 is a block diagram showing a specific example 1 of a frequency/phase compensation circuit.

FIG. 19 is a block diagram showing a specific example 1 of the frequency/phase compensation circuit. The frequency/phase compensation circuit 412 shown in FIG. 19 is a specific example of a time domain compensation type digital frequency/phase compensation circuit. Herein, it is assumed that the oscillation frequency of the fixed-frequency oscillator 411 is set slightly higher than the reception signal. As shown in FIG. 19, the frequency/phase compensation circuit 412 is provided with a frequency phase converter 1910, a parallel conversion unit 1920, a tap coefficient calculation unit 1930, and N pieces of FIR filters 1940.

The frequency phase converter 1910 converts the output of the second DLF 514 from the frequency into the phase for using the output of the second DLF 514 (the frequency control signal) as the phase control signal. The frequency phase converter 1910 is, for example, an integrator. An integer part of the signal converted by the frequency phase converter 1910 into the phase is output to the parallel conversion unit 1920 and also deducted as the number of samples where the control is ended in the frequency phase converter 1910.

On the basis of the integer part of the signal output from the frequency phase converter 1910, the parallel conversion unit 1920 converts the signal input to the frequency/phase compensation circuit 412 into the parallel signal. To be more specific, by using the integer part output from the frequency phase converter 1910 as the control signal, the parallel conversion unit 1920 performs the parallel conversion of 1 to N (in a case where the integer part is "0") or 1 to N+1 (in a case where the integer part is "1") to be output to the subsequent stage.

M pieces (N−1−M) to (N−1) of previous time latest data denoted by reference numeral 1921 is held in a case where the integer part of the output from the frequency phase converter 1910 is "0". Also, M pieces (N−M) to N of the previous time latest data is held in a case where the integer part of the output from the frequency phase converter 1910 is "1" as the parallel conversion of 1 to N+1 is carried out in the parallel conversion unit 1920.

Also, the parallel conversion unit 1920 generates a clock for performing the signal processing in the subsequent stage of the parallel conversion unit 1920. To be more specific, the parallel conversion unit 1920 generates clocks of 1/N (in a case where the integer part is "0") or 1/(N+1) (in a case where the integer part is "1") of the sampling clocks of the digital conversion unit 150 to be output to the subsequent stage. In a case where the parallel conversion of 1 to N+1 is performed, the parallel conversion unit 1920 creates clocks so that one clock time of the subsequent stage of the parallel conversion unit 1920 becomes the N+1 sample time.

The decimal part converted into the phase by the frequency phase converter 1910 is output to the tap coefficient calculation unit 1930. On the basis of the decimal part of the output from the frequency phase converter 1910, the tap coefficient calculation unit 1930 calculates the respective tap coefficients which become the sample positions for the N pieces of FIR filters 1940 (0 to N−1). The tap coefficient calculation unit 1930 outputs the calculated respective tap coefficients to the respectively corresponding FIR filters 1940. The processing by the tap coefficient calculation unit 1930 includes a latency adjustment equivalent to the parallel conversion unit 1920.

For example, in a case where the frequency difference between the reception signal and the fixed-frequency oscillator 411 is small, the tap coefficients with respect to the N pieces of FIR filters 1940 may be set to be identical.

Each of the N pieces of FIR filters 1940 (0 to N−1) compensates the respective signals output from the parallel conversion unit 1920 on the basis of the tap coefficients output from the tap coefficient calculation unit 1930. Each of the FIR filters 1940 (0 to N−1) outputs the compensated signal to the subsequent stage as N sample paralleled data.

Also, as in the configuration shown in FIGS. 17 and 18, in a case where the output of the first DLF 513 (the phase control signal) is also input to the frequency/phase compensation circuit 412, an adder circuit 1950 for adding the output of the first DLF 513 to the output of the frequency phase converter 1910 may be provided.

Figure 20:
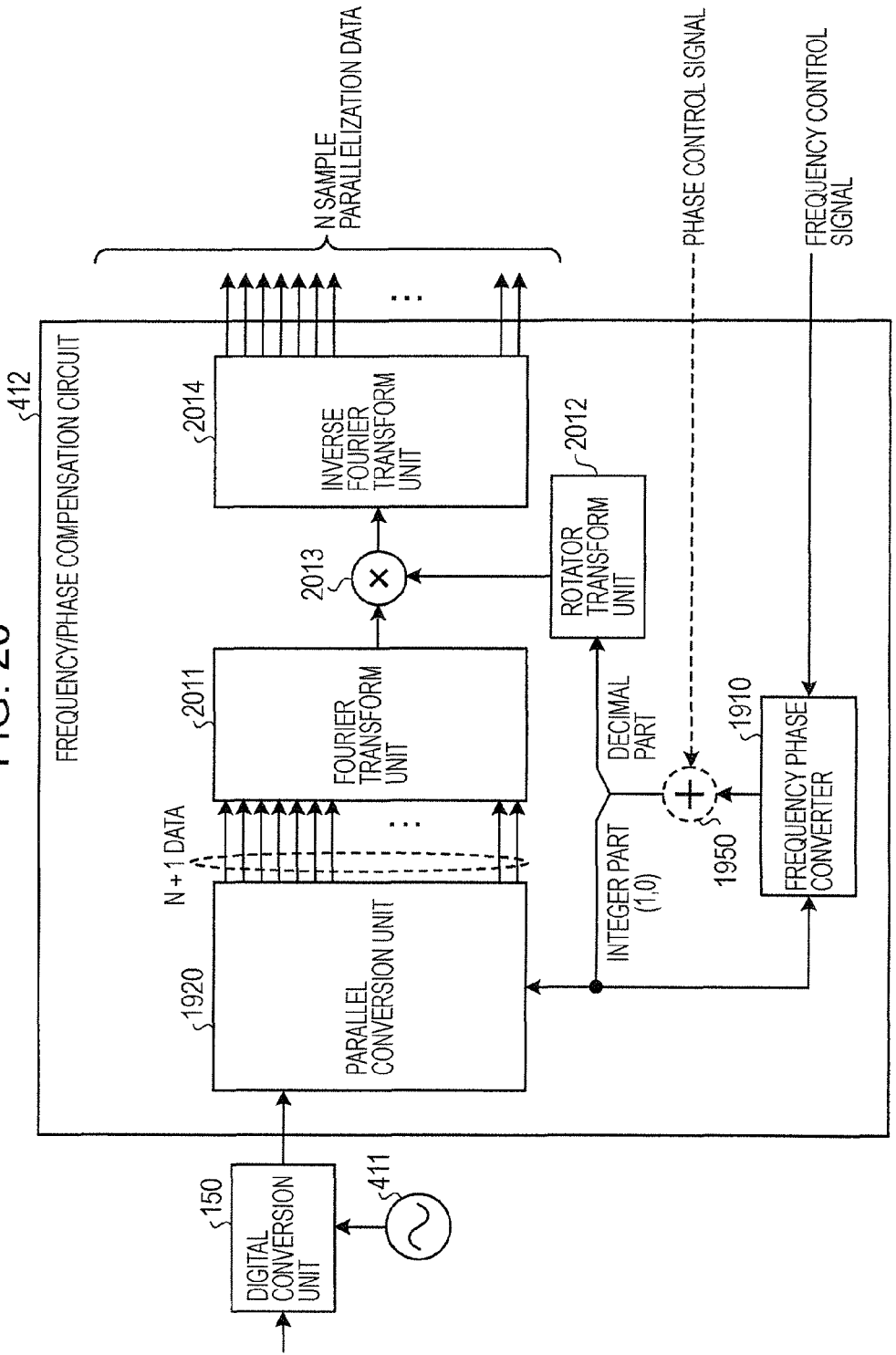
FIG. 20 is a block diagram showing a specific example 2 of the frequency/phase compensation circuit.

FIG. 20 is a block diagram showing a specific example 2 of the frequency/phase compensation circuit. In FIG. 20, a configuration similar to the configuration shown in FIG. 19 is assigned with the same reference symbol, and a description thereof is omitted. As shown in FIG. 20, instead of the tap coefficient calculation unit 1930 and the FIR filters 1940 shown in FIG. 19, the frequency/phase compensation circuit 412 may be provided with a Fourier transform unit 2011, a rotator transform unit 2012, a multiplication unit 2013, and an inverse Fourier transform unit 2014.

The parallel conversion unit 1920 outputs the parallel data (N+1 data) subjected to the parallel conversion to the Fourier transform unit 2011. The Fourier transform unit 2011 subjects the signal output from the parallel conversion unit 1920 to the Fourier transform to be transformed into the frequency domain. To be more specific, in a case where the integer part of the output from the frequency phase converter 1910 is "0", the Fourier transform unit 2011 performs the processing by only using the 1 to N-th inputs.

Also, in a case where the integer part of the output from the frequency phase converter 1910 is "1" and already the FFT segment begins, the Fourier transform unit 2011 uses the 1 to (N+1)-th inputs to be input to the FFT as the continuous sample. Then, until the FFT segment ends, the Fourier transform unit 2011 uses all the signals output from the parallel conversion unit 1920. The last FFT inputs are the 1 to (N−1)-th.

In a case where the FFT segment is to begin after this, the Fourier transform unit 2011 uses the 2 to (N+1)-th inputs to start the FFT and thereafter uses the 1 to N-th inputs. In a case where the FFT segment is about to end, the Fourier transform unit 2011 uses the 1 to N-th inputs, and the FFT window ends. The Fourier transform unit 2011 outputs the signal subjected to the Fourier transform to the multiplication unit 2013.

The rotator transform unit 2012 performs the rotator transform processing on the decimal part of the output from the frequency phase converter 1910 and outputs the shift coefficient obtained through the rotator transform processing to the multiplication unit 2013. The processing by the rotator transform unit 2012 includes a latency adjustment equivalent to the parallel conversion unit 1920 and the Fourier transform unit 2011.

The multiplication unit 2013 multiplies the signal output from the Fourier transform unit 2011 by the shift coefficient output from the rotator transform unit 2012 and outputs the multiplied signal to the inverse Fourier transform unit 2014. The inverse Fourier transform unit 2014 subjects the signal output from the multiplication unit 2013 to the inverse Fourier transform to be output to the subsequent stage (the waveform distortion compensation circuit 161).

A phase shift of a decimal part $\Delta\tau$ of the output from the frequency phase converter 1910 becomes a rotator coefficient $\exp(j\omega\Delta\tau)$ in the frequency domain. For this reason, the Fourier transform result of the input signal is multiplied by the rotator coefficient to conduct the inverse Fourier transform so that the phase shift is realized, the frequency domain processing in the Fourier transform unit 2011, the multiplication unit 2013, and the inverse Fourier transform unit 2014 can be commonly used not only as the frequency/phase compensation but also, for example, as the compensation processing for the wavelength dispersion.

Figure 21:
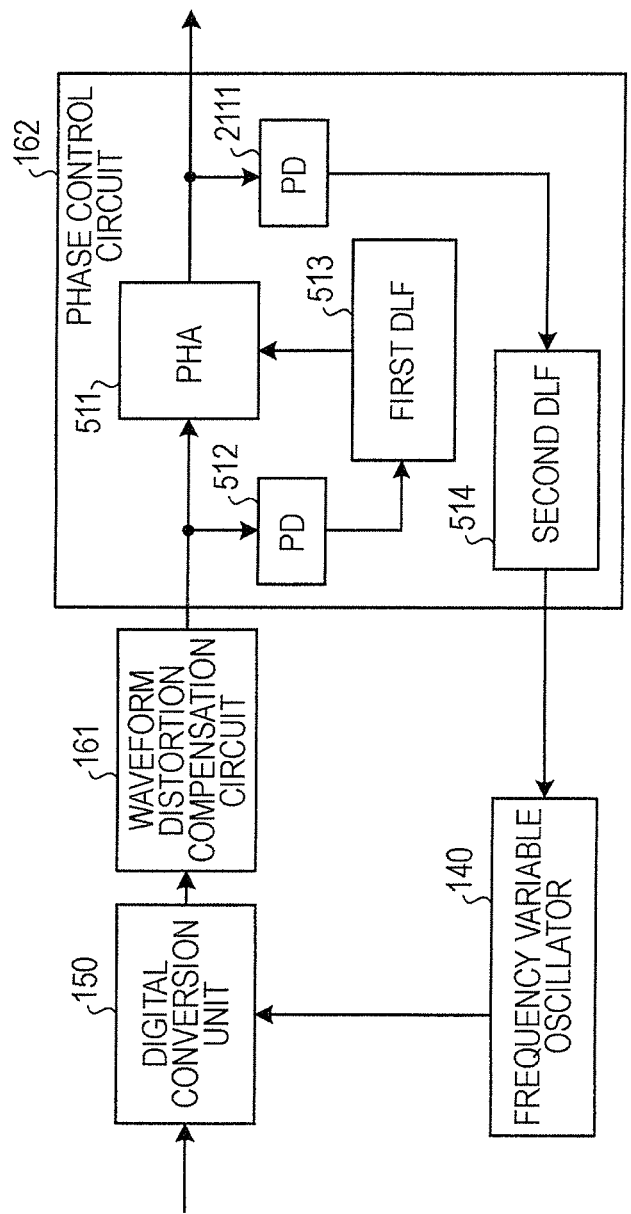
FIG. 21 is a block diagram showing a specific example 5 of the phase control circuit shown in FIGS. 1 to 3.

FIG. 21 is a block diagram showing a specific example 5 of the phase control circuit shown in FIGS. 1 to 3. In FIG. 21, a configuration similar to the configuration shown in FIG. 5 is assigned with the same reference symbol, and a description thereof is omitted. As shown in FIG. 21, the phase control circuit 162 may be provided with a phase detection unit 2111 in addition to the configuration shown in FIG. 5. The phase detection unit 512 detects the phase of the signal output from the waveform distortion compensation circuit 161 to the phase adjuster 511. The phase detection unit 512 outputs the detected phase signal indicating the phase to the first DLF 513.

The phase detection unit 2111 detects the phase of the signal output from the phase adjuster 511. The phase detection unit 2111 outputs the detected phase signal indicating the phase to the second DLF 514. The first DLF 513 conducts the signal processing on the phase signal output from the phase detection unit 512 and outputs the signal subjected to the signal processing to the phase adjuster 511. The second DLF 514 conducts the signal processing on the phase signal output from the phase detection unit 2111. The second DLF 514 outputs the signal subjected to the signal processing as the frequency control signal to the frequency variable oscillator 140.

In this manner, the phase detection unit 512 may have a configuration of detecting the phase of the signal before being compensated by the phase adjuster 511 in the configuration shown in FIG. 5. In this case, the control becomes a feed forward control in which the phase detection result by the phase detection unit 512 is output to the subsequent stage of the phase adjuster 511. such a configuration may be adopted that instead of the frequency variable oscillator 140 shown in FIG. 21, the fixed-frequency oscillator 211 and the DDS 212 (see FIG. 2) are provided.

Figure 22:
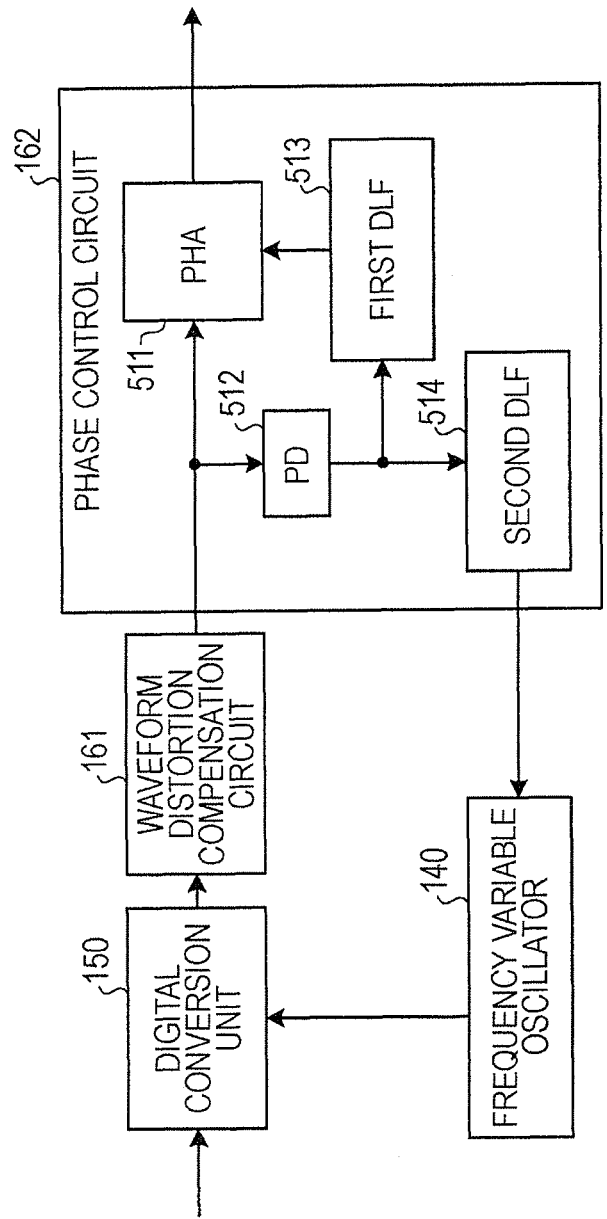
FIG. 22 is a block diagram showing a specific example 6 of the phase control circuit shown in FIGS. 1 to 3.

FIG. 22 is a block diagram showing a specific example 6 of the phase control circuit shown in FIGS. 1 to 3. In FIG. 22, a configuration similar to the configuration shown in FIG. 6 is assigned with the same reference symbol, and a description thereof is omitted. As shown in FIG. 22, the phase detection unit 512 of the phase control circuit 162 detects the phase of the signal output from the waveform distortion compensation circuit 161 to the phase adjuster 511.

In this manner, the phase detection unit 512 may have a configuration of detecting the phase of the signal before being compensated by the phase adjuster 511 in the configuration shown in FIG. 6. In this case, the control becomes the feed forward control in which the phase detection result by the phase detection unit 512 is output to the subsequent stage of the phase adjuster 511. such a configuration may be adopted that instead of the frequency variable oscillator 140 shown in FIG. 22, the fixed-frequency oscillator 211 and the DDS 212 (see FIG. 2) are provided.

(Configuration Example of Phase Detection Unit)

Figure 23:
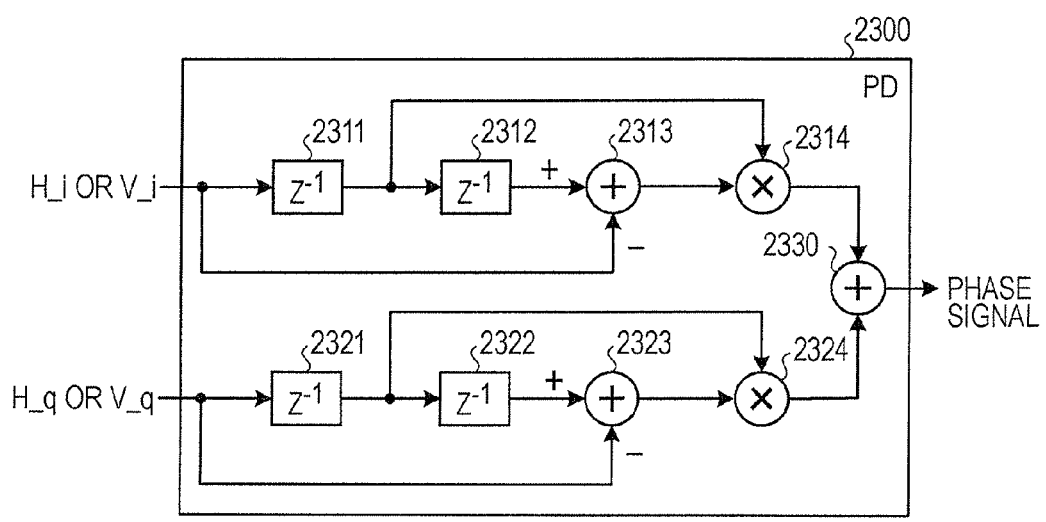
FIG. 23 is a block diagram showing a configuration example of a phase detector used for a phase detection unit.

FIG. 23 is a block diagram showing a configuration example of a phase detector used for the phase detection unit 512. A phase detector 2300 shown in FIG. 23 is a Gardner-system phase detector (for example, see F. M. Gardner, "A BPSK/QPSK timing-error detector for sampled receivers" mentioned above). As shown in FIG. 23, the phase detector 2300 is provided with a delay element 2311, a delay element 2312, a subtraction unit 2313, a multiplication unit 2314, a delay element 2321, a delay element 2322, a subtraction unit 2323, a multiplication unit 2324, and an adder unit 2330. To the phase detector 2300, for example, a signal subjected to 2× over sampling is input.

An I channel component (H_i or V_i) of the signal input to the phase detector 2300 is input to the delay element 2311 and the subtraction unit 2313. The delay element 2311 delays the input signal by ½ symbols and outputs the delayed signal to the delay element 2312 and the multiplication unit 2314. The delay element 2312 delays the signal output from the delay element 2311 by ½ symbols to be output to the subtraction unit 2313.

The subtraction unit 2313 subtracts the signal input to the phase detector 2300 from the signal output from the delay element 2312 to be output to the multiplication unit 2314. The signal output from the subtraction unit 2313 is a difference between the signals deviated by 1 symbol. The multiplication unit 2314 multiplies the ½ symbols deviated signal output from the delay element 2311 by a difference between the 1 symbol deviated signals output from the subtraction unit 2313 to be output to the adder unit 2330.

A Q channel component (H_q or V_q) of the signal input to the phase detector 2300 is input to the delay element 2321 and the subtraction unit 2323. The delay element 2321 delays the input signal by ½ symbols and outputs the delayed signal to the delay element 2322 and the multiplication unit 2324. The delay element 2322 delays the signal output from the delay element 2321 by ½ symbols to be output to the subtraction unit 2323.

The subtraction unit 2323 subtracts the signal input to the phase detector 2300 from the signal output from the delay element 2322 to be output to the multiplication unit 2324. The signal output from the subtraction unit 2323 is a difference between the 1 symbol deviated signals. The multiplication unit 2324 multiplies the ½ symbols deviated signal output from the delay element 2321 by a difference between the 1 symbol deviated signals output from the subtraction unit 2323 to be output to the adder unit 2330.

The adder unit 2330 adds the signal output from the multiplication unit 2314 with the signal output from the multiplication unit 2324 to be output to the subsequent stage. The processing in the adder unit 2330 is conducted on the basis of a symbol rate (=½ down sampling). With this configuration, the signal output from the adder unit 2330 becomes a phase signal where the signal of the ½ symbols deviated phase is a 0 cross point.

Herein, it is also conceivable that the Gardner system phase detector 2300 shown in FIG. 23 can be used as the phase detection unit 512, the phase detection sensitivity changes because of the wavelength dispersion compensation error (SD) and the polarized wave mode dispersion shown in the expressions (6) and (7). In particular, the change in phase detection sensitivity based on the polarized wave mode dispersion has a dependency with respect to the polarized wave rotation state of the optical fiber.

Figure 24:
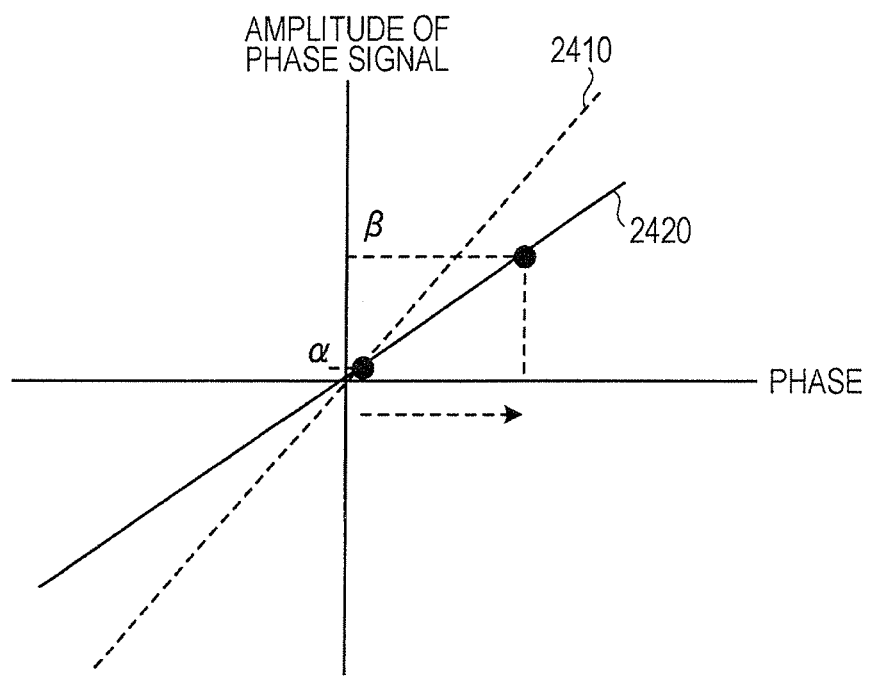
FIG. 24 is a graph showing a sensitivity correction by a phase detector of a sensitivity correction type (single-sided correction)

FIG. 24 is a graph showing a sensitivity correction by a phase detector of a sensitivity correction type (single-sided correction). In FIG. 24, the horizontal axis represents a phase of the signal input to the phase detector. The vertical axis represents an amplitude of the phase signal output from the phase detector. A relation 2410 represents a relation between the phase of the signal and the amplitude of the phase signal in a case where the sensitivity degradation in the phase detector does not exist. A relation 2420 represents a relation between the phase of the signal and the amplitude of the phase signal in a case where the sensitivity degradation in the phase detector exists.

Typically, as shown in the relation 2410, the phase detector linearly detects the phase in a range about ±0.15 to 0.2 symbols by using the 0 cross point as the center. However, the phase detection sensitivity indicated by an inclination of the phase detection result is degraded because of the wavelength dispersion compensation error (ΔD) and the polarized wave mode dispersion represented by the expressions (6) and (7). For this reason, as shown in the relation 2410, the phase detection result has an inclination different from a phase detection result expectation value.

This sensitivity degradation adversely affects the phase control loop through which the first DLF 513 and the second DLF 514 are inserted. For this reason, a phase shift amount x is set in a range where the phase detector linearly performs the phase detection, and a phase detection result α of the input signal is corrected on the basis of a phase detection result β of the x phase shifted signal (single-sided correction). The correction coefficient is in proportion to $1/(\beta-\alpha)$, but as the current phase is close to the origin, the correction coefficient may be in proportion to $1/\beta$.

Figure 25:
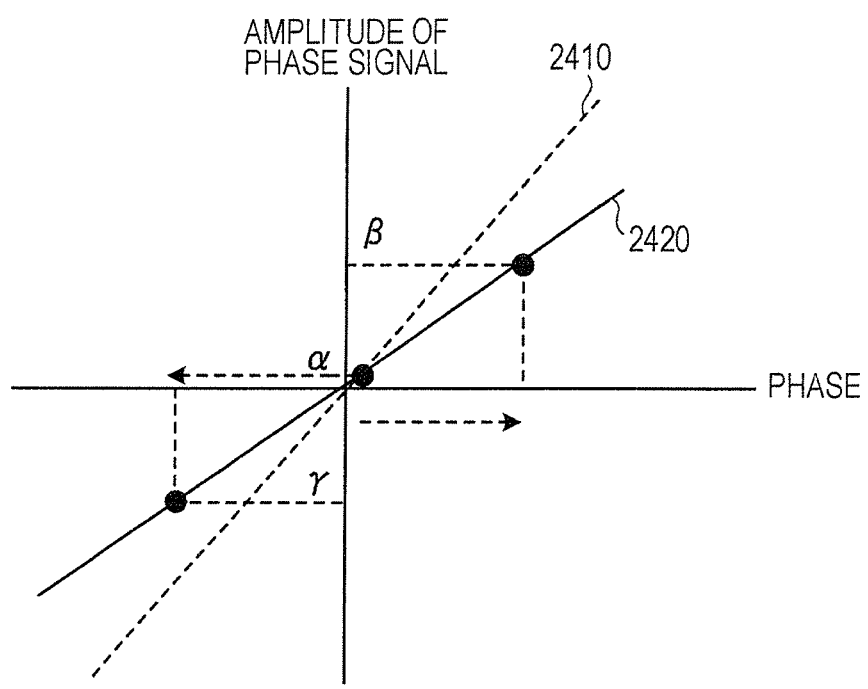
FIG. 25 is a graph showing a sensitivity correction by a phase detector of a sensitivity correction type (two-sided correction)

FIG. 25 is a graph showing a sensitivity correction by a phase detector of a sensitivity correction type (two-sided correction). In FIG. 25, a part similar to the part shown in FIG. 24 is assigned with the same reference symbol, and a description thereof is omitted. The phase detection result α of the input signal may be corrected on the basis of the phase detection results β and γ of the x and −x phase shifted signals (two-sided correction). The correction coefficient is assumed to be in proportion to $2/(\beta-\gamma)$ as the current phase is close to the origin. A proportionality coefficient for the correction value is decided on the basis of the phase shift amount x and may be decided so as to be the inclination of the phase detection result expectation value through the multiplication of the correction coefficient. Also, β of the single-sided correction and (α−γ) of the two-sided correction may be set as negative values.

Figure 26:
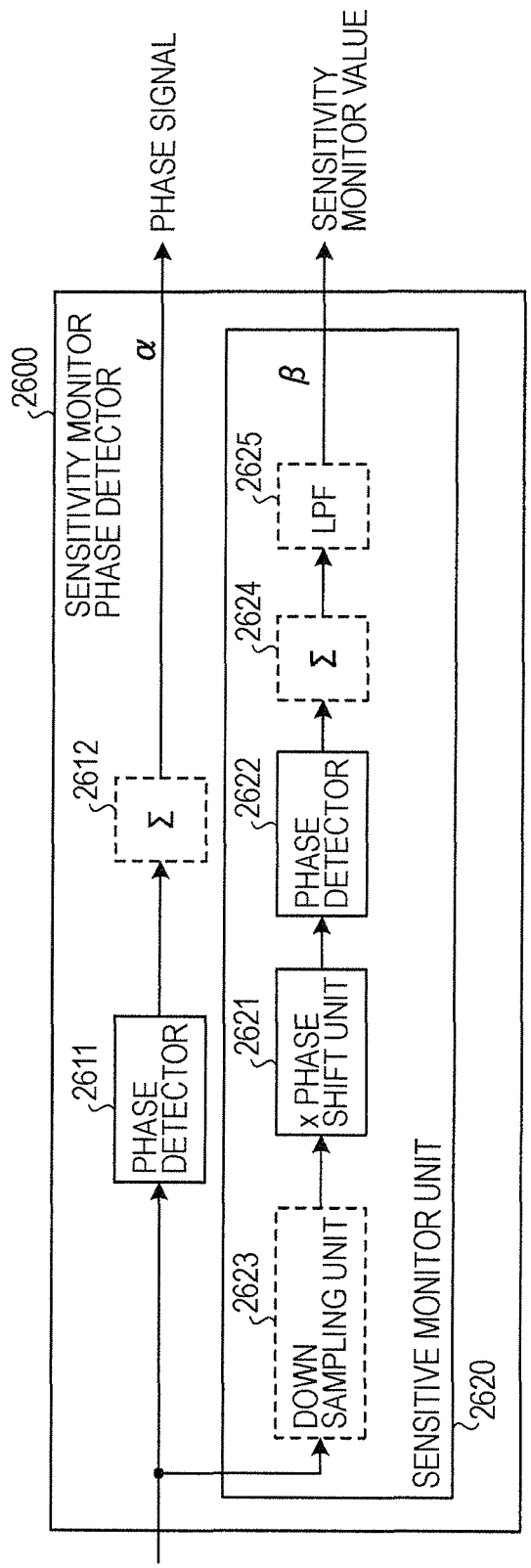
FIG. 26 is a block diagram showing a configuration example of a sensitivity monitor phase detector (single-sided monitor)

FIG. 26 is a block diagram showing a configuration example of a sensitivity monitor phase detector (single-sided monitor). As shown in FIG. 26, a sensitivity monitor phase detector 2600 is provided with a phase detector 2611 and a sensitive monitor unit 2620. To the sensitive monitor unit 2620, a branched signal input to the sensitivity monitor phase detector 2600 is input. The phase detector 2611 detects the phase of the input signal and outputs the detected phase signal indicating the phase (α in FIGS. 24 and 25) to the subsequent stage.

The sensitive monitor unit 2620 is provided with an x phase shift unit 2621 and a phase detector 2622 (a second phase detector). The x phase shift unit 2621 shifts the phase of the input signal by the shift amount x. For example, the x phase shift unit 2621 generates a signal in which the phase is shifted by the shift amount x through an inter-sample interpolation or the like. The x phase shift unit 2621 outputs the phase shifted signal to the phase detector 2622.

The phase detector 2622 detects the phase of the signal output from the x phase shift unit 2621. The phase detector 2622 is a phase detector having a sensitivity degradation characteristic similar to the phase detector 2611. The phase detector 2622 outputs the detected phase signal indicating the phase as the sensitivity monitor value (β in FIGS. 24 and 25) to the subsequent stage.

Also, in a case where the parallel signals are input to the sensitivity monitor phase detector 2600, such a configuration may be adopted that an averaging unit 2612 (Σ) is provided in the subsequent stage of the phase detector 2611, and the phase signals of the respective signals output from the phase detector 2611 may be averaged by the averaging unit 2612. Also, in a case where the respective signals on the H axis and the V axis are input to the sensitivity monitor phase detector 2600, a polarized wave diversity addition may be conducted in the averaging unit 2612.

Also, in a case where the parallel signals are input to the sensitivity monitor phase detector 2600, for example, such a configuration may be adopted that a down sampling unit 2623 is provided in the former stage of the x phase shift unit 2621, and down sampling is conducted in accordance with a sensitivity fluctuation speed. The sensitive monitor unit 2620 can adopt a configuration of conducting the down sampling as the sensitive monitor unit 2620 may be operated at a speed where the operation can follow a state affecting the phase detection sensitivity (polarized characteristic state fluctuation or the like) among the state fluctuations of the optical transmission path.

Also, in a case where the parallel signals are input to the sensitivity monitor phase detector 2600, such a configuration may be adopted that an averaging unit 2624 (Σ) is provided in the subsequent stage of the phase detector 2622, the phase signals of the respective signals output from the phase detector 2622 may be averaged by the averaging unit 2624. Also, in a case where the respective signals on the H axis and the V axis are input to the sensitivity monitor phase detector 2600, the polarized wave diversity addition may be conducted in the averaging unit 2624. Also, such a configuration may be adopted that a low pass filter 2625 is provided in the output stage of the sensitive monitor unit 2620, and wide-area noise of the sensitivity monitor value is suppressed.

In this manner, the sensitive monitor unit 2620 shifts the phase of the signal and detects the phase of the phase shifted signal, so that it is possible to monitor the detection sensitivity of the phase detector 2611. Also, the x phase shift unit 2621 shifts the phase in a range where the phase detector 2611 linearly detects the phase. With this configuration, the detection sensitivity of the phase detector 2611 can be monitored accurately.

Figure 27:
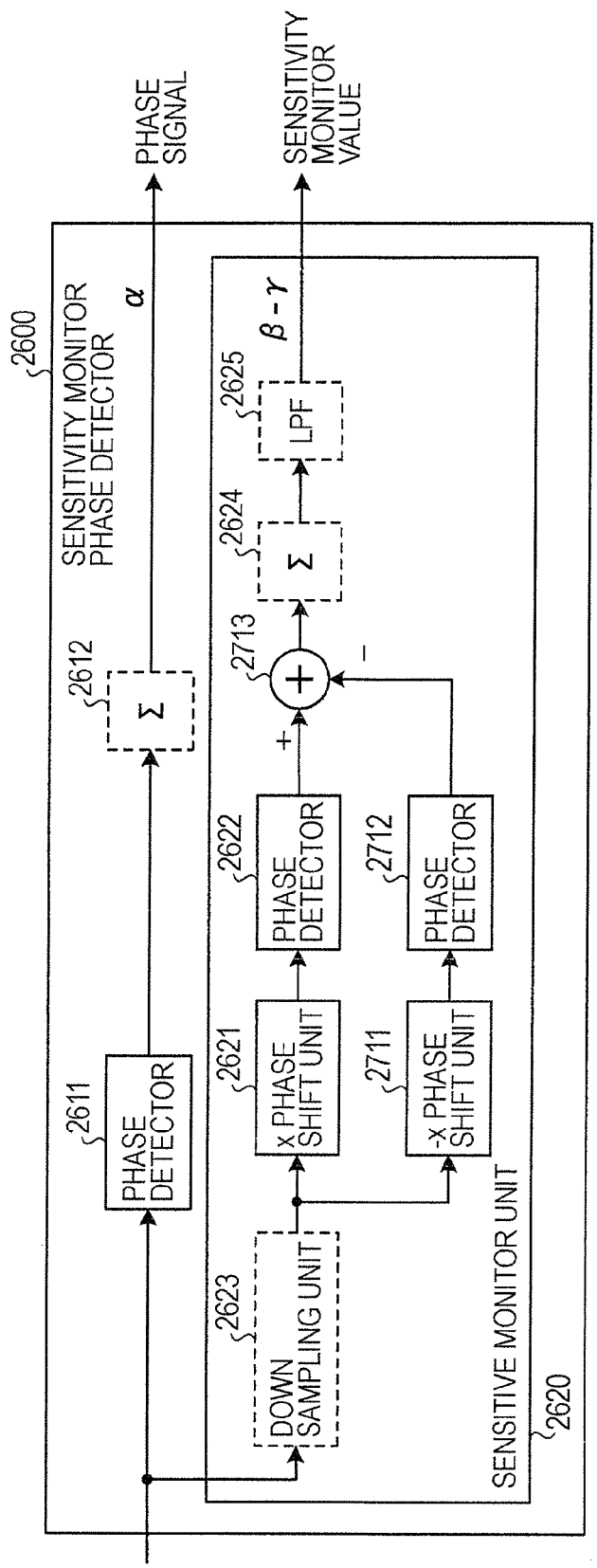
FIG. 27 is a block diagram showing a configuration example of a sensitivity monitor phase detector (two-sided monitor)

FIG. 27 is a block diagram showing a configuration example of a sensitivity monitor phase detector (two-sided monitor). In FIG. 27, a configuration similar to the configuration shown in FIG. 26 is assigned with the same reference symbol, and a description thereof is omitted. As shown in FIG. 27, the sensitive monitor unit 2620 of the sensitivity monitor phase detector 2600 is provided with a −x phase shift unit 2711 (a second phase shift unit), a phase detector 2712 (a third phase detector), and a subtraction unit 2713 in addition to the configuration shown in FIG. 26.

The phase detector 2622 outputs the phase signal to the subtraction unit 2713. The −x phase shift unit 2711 shifts the phase of the input signal by a shift amount −x (opposite direction of the shift amount x). For example, the −x phase shift unit 2711 generates a signal in which the phase is shifted by the shift amount −x through the inter-sample interpolation or the like. The −x phase shift unit 2711 outputs the phase shifted signal to the phase detector 2712.

The phase detector 2712 detects the phase of the signal output from the −x phase shift unit 2711. The phase detector 2712 is a phase detector having a sensitivity degradation characteristic similar to that of the phase detector 2611. The phase detector 2712 outputs the detected phase signal indicating the phase to the subtraction unit 2713. The subtraction unit 2713 subtracts the phase signal output from the phase detector 2712 from the phase signal output from the phase detector 2622. The subtraction unit 2713 outputs the signal indicating the subtraction result as the phase signal to the subsequent stage.

In this manner, the sensitive monitor unit 2620 calculates a difference between the respective phases of the signal in which the phase is shifted by x and the signal in which the phase is shifted by −x, so that it is possible to monitor the detection sensitivity of the phase detector 2611 with respect to the fluctuations in both directions of the phase. Also, the −x phase shift unit 2711 shifts the phase in a range where the phase detector 2611 linearly detects the phase. With this configuration, it is possible to monitor the detection sensitivity of the sensitivity monitor phase detector 2600 accurately.

Figure 28:
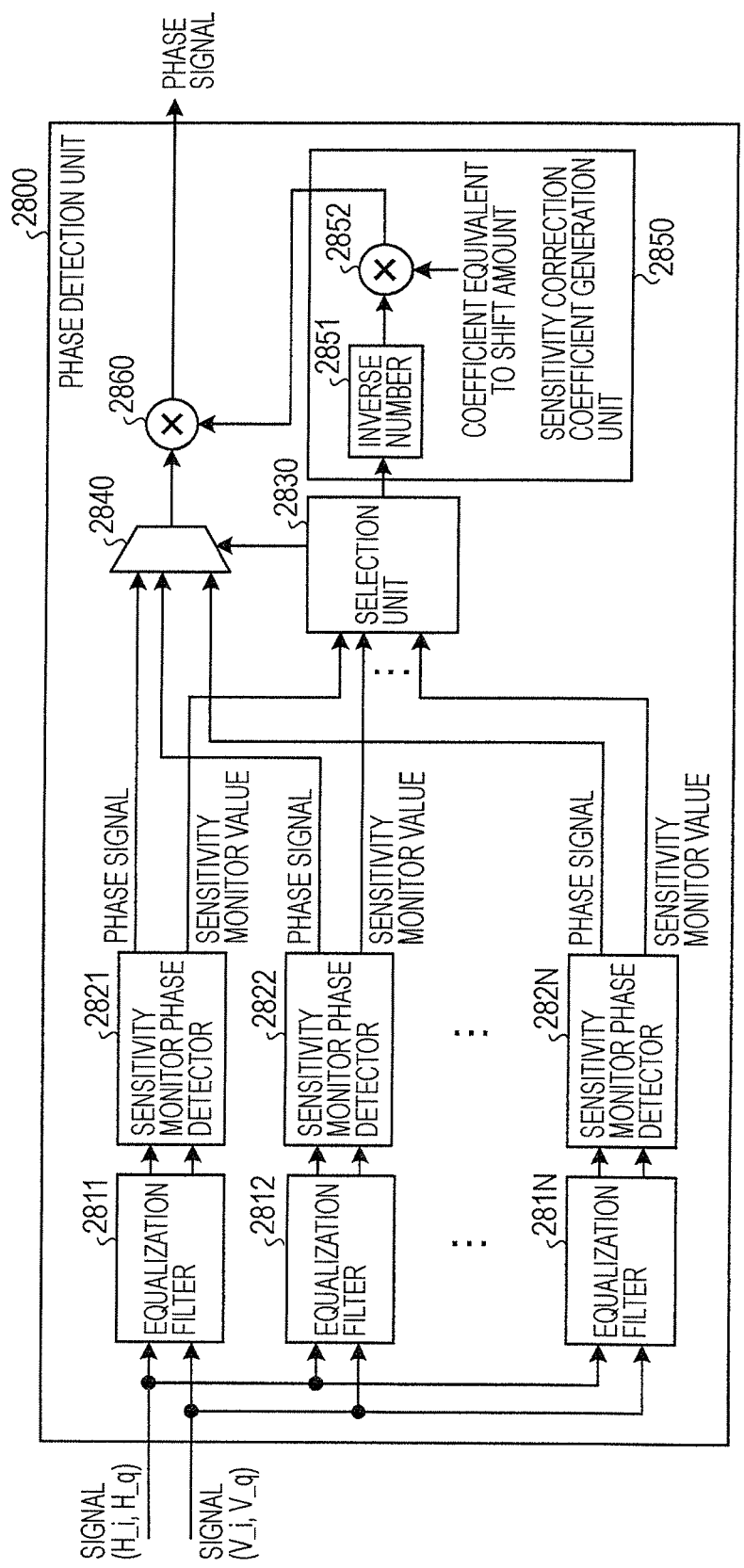
FIG. 28 is a block diagram showing a configuration example of a phase detection unit of a sensitivity selection correction type.

FIG. 28 is a block diagram showing a configuration example of a phase detection unit of a sensitivity selection correction type. As shown in FIG. 28, a phase detection unit 2800 is provided with equalization filters 2811 to 281N, sensitivity monitor phase detectors 2821 to 282N, a selection unit 2830, a selection switch 2840, a sensitivity correction coefficient generation unit 2850, and a multiplication unit 2860. The phase detection unit 2800 is a sensitivity selection type phase detection unit and can be applied, for example, to the phase detection unit 512.

The equalization filters 2811 to 281N are equalization filters having mutually different equalization characteristics (multiplication coefficients and the like). To the respective equalization filters 2811 to 281N, the I channel component (H_i) and the Q channel component (H_q) included in the H axis of the signal and the I channel component (V_i) and the Q channel component (V_q) included in the V axis of the signal are input. The equalization filter 2811 performs an equalization processing on the respective input signals to be output to the sensitivity monitor phase detector 2821. Similarly, the equalization filters 2812 to 281N respectively perform the equalization processing on the respective input signals to be respectively output to the sensitivity monitor phase detectors 2822 to 282N.

Each of the sensitivity monitor phase detectors 2821 to 282N is, for example, the sensitivity monitor phase detector 2600 shown in FIG. 26 or 27. The sensitivity monitor phase detector 2821 detects the phase of the signal on the basis of the respective signals output from the equalization filter 2811 and outputs the detected phase signal indicating the phase to the selection switch 2840. Also, the sensitivity monitor phase detector 2821 outputs the sensitive monitor value to the selection unit 2830.

Similarly, each of the sensitivity monitor phase detectors 2822 to 282N detects the phase of the signal on the basis of the respective signals output from the equalization filters 2812 to 281N and outputs the detected phase signal indicating the phase to the selection switch 2840. Also, each of the sensitivity monitor phase detectors 2822 to 282N outputs the sensitive monitor value to the selection unit 2830.

On the basis of the sensitivity monitor values output from the sensitivity monitor phase detectors 2821 to 282N, the selection unit 2830 selects one of the sensitivity monitor phase detectors 2821 to 282N. To be more specific, the selection unit 2830 selects the sensitivity monitor phase detector that outputs the sensitivity monitor value whose absolute value is largest among the sensitivity monitor phase detectors 2821 to 282N. In the selection of the sensitivity monitor phase detector, in order to avoid an influence from noise, the detection of the largest value of the sensitivity monitor value may have hysteresis.

The selection is made on the basis of the absolute value of the sensitivity monitor value because the satisfactory phase detection may be carried out on the basis of a negative sensitivity depending on the polarized wave mode dispersion state of the optical transmission path. The selection unit 2830 notifies the selection switch 2840 of the selected sensitivity monitor phase detector. Also, the selection unit 2830 outputs the largest sensitivity monitor value among the sensitivity monitor values output from the sensitivity monitor phase detectors 2821 to 282N to the sensitivity correction coefficient generation unit 2850.

The selection switch 2840 outputs the phase signal output from the sensitivity monitor phase detector which is notified from the selection unit 2830 among the respective phase signals output from the sensitivity monitor phase detectors 2821 to 282N to the multiplication unit 2860.

The sensitivity correction coefficient generation unit 2850 is provided with an inverse number calculation unit 2851 and a multiplication unit 2852. The inverse number calculation unit 2851 calculates an inverse number of the sensitivity monitor value output from the selection unit 2830 to be output to the multiplication unit 2852. The multiplication unit 2852 multiplies the signal output from the inverse number calculation unit 2851 by the coefficient and outputs the multiplication result as the sensitivity correction coefficient to the multiplication unit 2860. The coefficient multiplied in the multiplication unit 2852 is coefficient equivalent to a phase shift amount x in the sensitivity monitor phase detectors 2821 to 282N (see FIG. 26 or 27).

The multiplication unit 2860 multiplies the phase signal output from the selection switch 2840 by the sensitivity correction coefficient output from the multiplication unit 2852. The multiplication unit 2860 outputs the multiplied phase signal to the subsequent stage. according to the configuration, the sensitivity correction coefficient generation unit 2850 conducts the calculation for the inverse number of the sensitivity monitor value and the coefficient multiplication, but a table reference configuration may be adopted that the sensitivity monitor value is converted into the sensitivity correction coefficient on the basis of a table in which the sensitivity monitor value and the sensitivity correction coefficient are associated with each other. The table in which the sensitivity monitor value and the sensitivity correction coefficient are associated with each other is previously stored, for example, in the memory of digital coherent receiver 100.

In this manner, the phase detection unit 2800 performs the equalization processing on the input signals in parallel by the equalization filters 2811 to 281N having mutually different equalization characteristics and detects the phases of the respective signals subjected to the equalization processing. Also, on the basis of the monitor results of the respective detection sensitivities of the sensitivity monitor phase detectors 2821 to 282N, the phase detection unit 2800 selects one of the sensitivity monitor phase detectors 2821 to 282N and outputs the phase signal indicating the phase detected by the selected phase detector.

With this configuration, the detection result of the phase detector whose detection sensitivity is optimal among the sensitivity monitor phase detectors 2821 to 282N can be used in the phase adjuster 511. For example, the detection result of the phase detector whose absolute value of the sensitivity monitor value is largest among the sensitivity monitor phase detectors 2821 to 282N is used in the phase adjuster 511. With this configuration, the phase is compensated on the basis of the detection result of the phase detector whose sensitivity degradation is smallest, and it is possible to detect the phase of the signal further accurately. For this reason, it is possible to further improve the communication quality.

Also, the phase detection unit 2800 generates the sensitivity correction coefficient in proportion to the inverse number of the monitor result of the phase detector selected by the selection unit 2830 among the respective monitor results by the sensitivity monitor phase detectors 2821 to 282N. Then, the phase detection unit 2800 multiplies the phase output by the selection switch 2840 by the sensitivity correction coefficient. With this configuration, the sensitivity degradation in the selected phase detector is corrected, and it is possible to detect the phase of the signal further accurately. For this reason, it is possible to further improve the communication quality.

Figure 29:
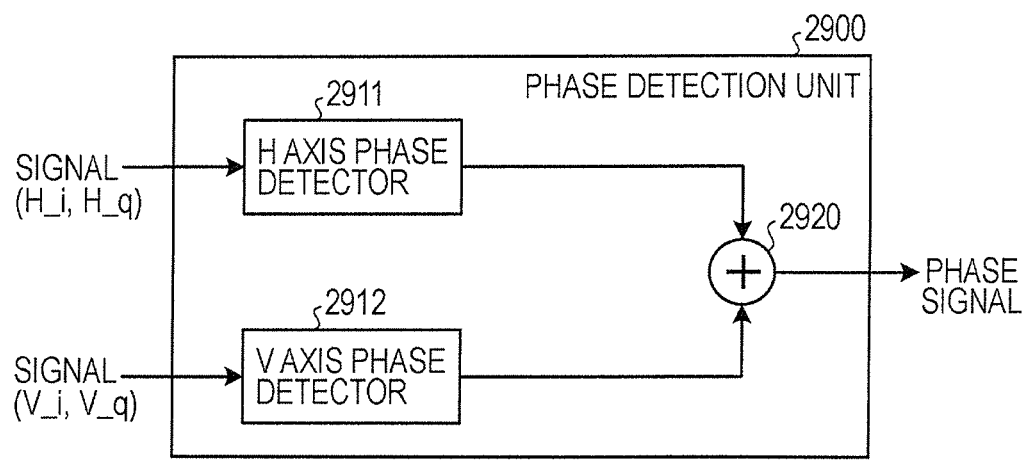
FIG. 29 is a block diagram showing a configuration example 1 of a phase detection unit of a diversity addition type.

FIG. 29 is a block diagram showing a configuration example 1 of a phase detection unit of a diversity addition type. A phase detection unit 2900 shown in FIG. 29 is provided with an H axis phase detector 2911 (a first phase detector), a V axis phase detector 2912 (a second phase detector), and an adder unit 2920. The phase detection unit 2900 is a diversity addition type phase detection unit and can be applied, for example, to the phase detection unit 512.

To the H axis phase detector 2911, the I channel component (H_i) and the Q channel component (H_q) included in the H axis of the signal are input. The H axis phase detector 2911 detects the phase of the input signal and outputs the detected phase signal indicating the phase to the adder unit 2920. To the V axis phase detector 2912, the I channel component (V_i) and the Q channel component (V_q) included in the V axis of the signal are input. The V axis phase detector 2912 detects the phase of the input signal and outputs the detected phase signal indicating the phase to the adder unit 2920.

The adder unit 2920 adds the phase signal output from the H axis phase detector 2911 with the phase signal output from the V axis phase detector 2912. The adder unit 2920 outputs the addition result as the phase signal to the subsequent stage.

In this manner, the phase detection unit 2900 detects the phases of the respective signals on the H axis (the first polarized wave) and the V axis (the second polarized wave) and adds the detected respective phases, so that it is cancel the polarized wave dependency of the phase detection result. Also, it is possible to suppress the noise of the phase detection result.

Figure 30:
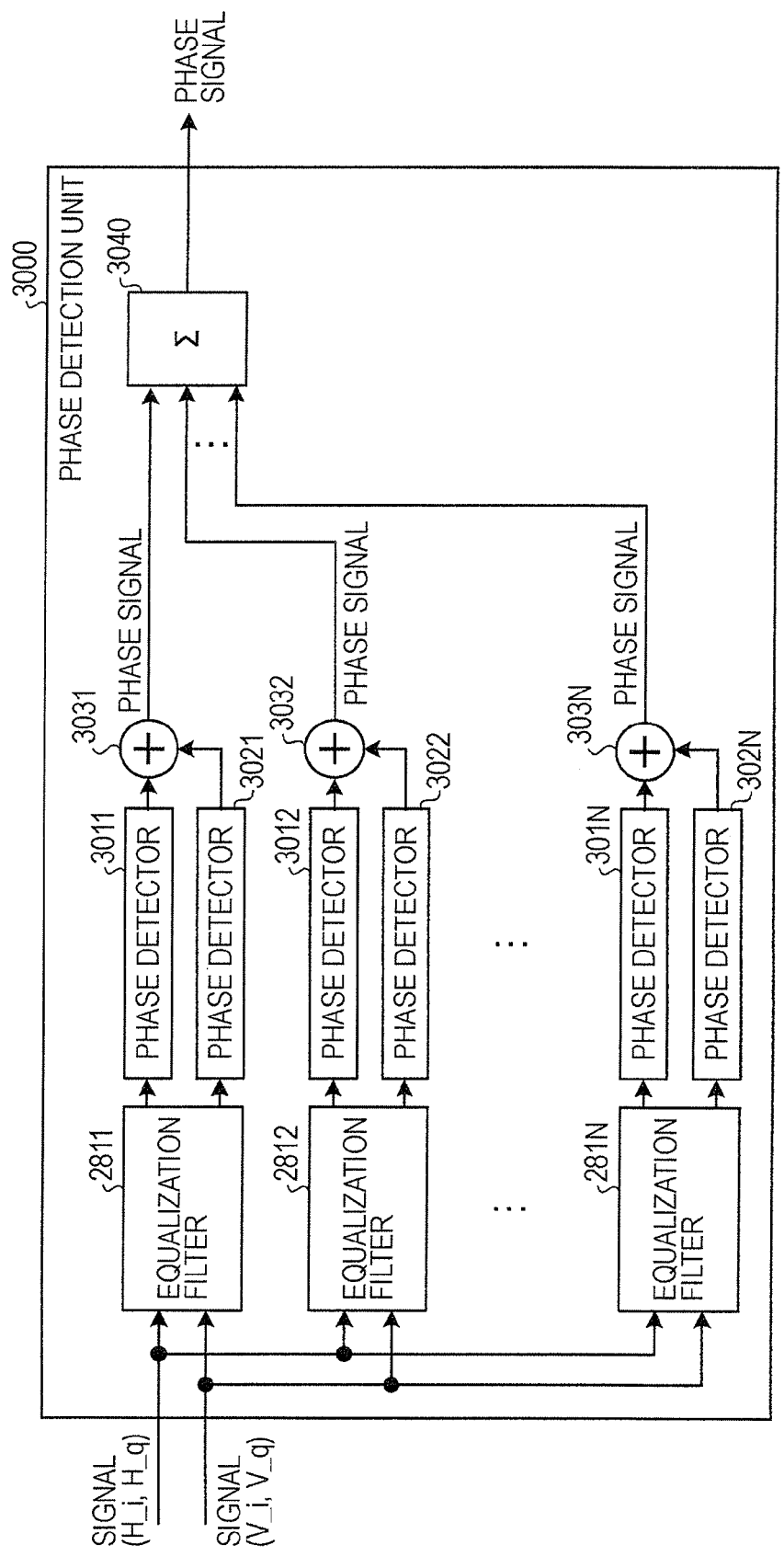
FIG. 30 is a block diagram showing a configuration example 2 of the phase detection unit of the diversity addition type.

FIG. 30 is a block diagram showing a configuration example 2 of the phase detection unit of the diversity addition type. In FIG. 30, a configuration similar to the configuration shown in FIG. 28 is assigned with the same reference symbol, and a description thereof is omitted. A phase detection unit 3000 shown in FIG. 30 is provided with the equalization filters 2811 to 281N, phase detectors 3011 to 301N and 3021 to 302N, adder units 3031 to 303N, and a combining unit 3040. The phase detection unit 3000 is a diversity addition type phase detection unit and can be applied, for example, to the phase detection unit 512.

To each of the equalization filters 2811 to 281N, the I channel component (H_i) and the Q channel component (H_q) included in the H axis of the signal and the I channel component (V_i) and the Q channel component (V_q) included in the V axis of the signal are input. The respective equalization filters 2811 to 281N perform the equalization processing on the input respective signals.

The equalization filter 2811 outputs the signal on the H axis subjected to the equalization processing to the phase detector 3011 and the signal on the V axis subjected to the equalization processing to the phase detector 3021. Similarly, the equalization filters 2812 to 281N output the signals on the H axis subjected to the equalization processing to the phase detectors 3012 to 301N, respectively, and the signals on the V axis subjected to the equalization processing to the phase detectors 3022 to 302N, respectively.

The phase detector 3011 detects the phase of the signal on the H axis from the equalization filter 2811 and outputs the detected phase signal indicating the phase to the adder unit 3031. Similarly, the phase detectors 3012 to 301N respectively detect the phases of the signals on the H axis from the equalization filters 2812 to 281N and respectively output the detected phase signals indicating the phases to the adder units 3032 to 303N.

The phase detector 3021 detects the phase of the signal on the V axis from the equalization filter 2811 and outputs the detected phase signal indicating the phase to the adder unit 3031. Similarly, the phase detectors 3022 to 302N respectively detect the phases of the signals on the V axis from the equalization filters 2812 to 281N and respectively output the detected phase signals indicating the phases to the adder units 3032 to 303N.

The adder unit 3031 adds the respective phase signals output from the phase detector 3011 and the phase detector 3021 and outputs the addition result to the combining unit 3040. Similarly, the adder units 3032 to 303N respectively adds the respective phase signals output from the phase detectors 3012 to 301N and the phase detectors 3022 to 302N and outputs the addition result to the combining unit 3040. The combining unit 3040 performs the diversity combining of the respective phase signals output from the adder units 3031 to 303N. The combining unit 3040 outputs the phase signal subjected to the diversity combining to the subsequent stage.

In this manner, the phase detection unit 3000 performs the diversity addition of the phases detected by the phase detectors 3012 to 301N and 3022 to 302N and outputs the addition result as the phase signal. With this configuration, even when the phase detector has the sensitivity degradation, it is possible to detect the phase of the signal accurately. For this reason, as the phase of the signal is compensated accurately, and the digital demodulation in the adaptive equalization type demodulation circuit 163 is conducted accurately, so that it is possible to further improve the communication quality.

Figure 31:
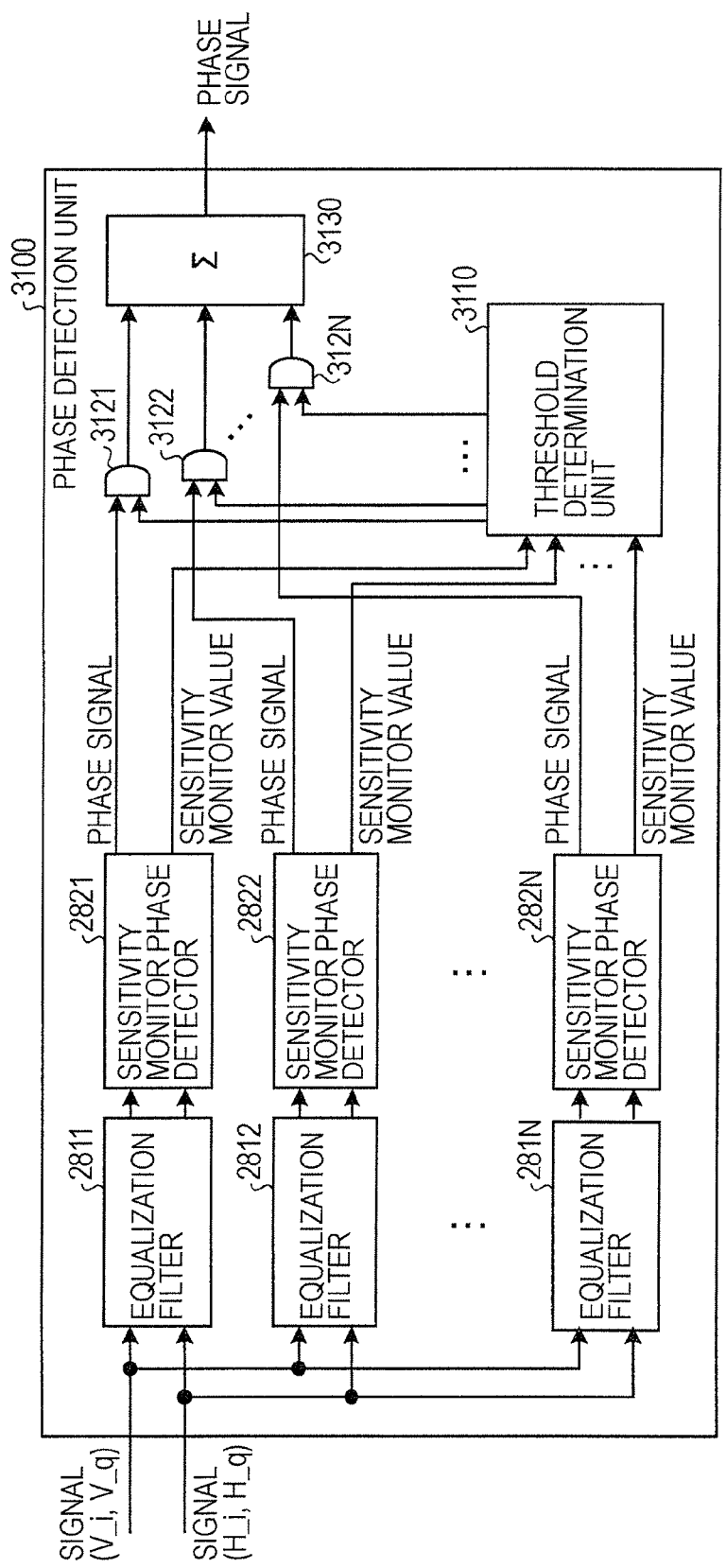
FIG. 31 is a block diagram showing a configuration example 3 of the phase detection unit of the diversity addition type.

FIG. 31 is a block diagram showing a configuration example 3 of the phase detection unit of the diversity addition type. In FIG. 31, a configuration similar to the configuration shown in FIG. 28 is assigned with the same reference symbol, and a description thereof is omitted. As shown in FIG. 31, a phase detection unit 3100 is provided with a threshold determination unit 3110, AND circuits 3121 to 312N, and a combining unit 3130 instead of the selection unit 2830, the selection switch 2840, the sensitivity correction coefficient generation unit 2850, and the multiplication unit 2860 shown in FIG. 28.

The phase detection unit 3100 is a configuration example of the diversity addition type phase detection unit and can be applied, for example, to the phase detection unit 512. The sensitivity monitor phase detector 2821 outputs the detected phase signal indicating the phase to the AND circuit 3121 and also outputs the sensitive monitor value to the threshold determination unit 3110. Similarly, the respective sensitivity monitor phase detectors 2822 to 282N output the detected phase signals indicating the phases to the AND circuits 3122 to 312N, respectively, and output the sensitive monitor values to the threshold determination unit 3110.

The threshold determination unit 3110 conducts a threshold determination on the respective sensitive monitor values output from the sensitivity monitor phase detectors 2821 to 282N. To be more specific, the threshold determination unit 3110 determines whether or not the sensitive monitor value output from the sensitivity monitor phase detector 2821 exceeds a predetermined threshold and outputs the determination result to the AND circuit 3121.

For example, in a case where the sensitive monitor value output from the sensitivity monitor phase detector 2821 exceeds the predetermined threshold, the threshold determination unit 3110 outputs "1" to the AND circuit 3121, and in a case where the sensitive monitor value is equal to or smaller than the predetermined threshold, the threshold determination unit 3110 outputs "0" to the AND circuit 3121. Similarly, the threshold determination unit 3110 determines whether or not the sensitivity monitor values from the sensitivity monitor phase detectors 2822 to 282N exceed a predetermined threshold and outputs the determination results to the respective AND circuits 3122 to 312N.

In a case where the determination result output from the threshold determination unit 3110 is "1", the AND circuit 3121 outputs the phase signal output from the sensitivity monitor phase detector 2821 to the combining unit 3130. On the other hand, in a case where the determination result output from the threshold determination unit 3110 is "0", the AND circuit 3121 does not output the phase signal output from the sensitivity monitor phase detector 2821.

Similarly, in a case where the determination result output from the threshold determination unit 3110 is "1", the respective AND circuits 3122 to 312N output the phase signals respectively output from the sensitivity monitor phase detectors 2822 to 282N to the combining unit 3130. On the other hand, in a case where the determination result output from the threshold determination unit 3110 is "0", the AND circuits 3122 to 312N do not output the phase signals output from the sensitivity monitor phase detectors 2822 to 282N.

The combining unit 3130 performs the diversity combining of the respective phase signals output from the AND circuits 3121 to 312N. The combining unit 3130 outputs the phase signal subjected to the diversity combining to the subsequent stage. the threshold in the threshold determination unit 3110 may be set as X % of the largest sensitivity monitor value of the sensitivity monitor phase detectors 2821 to 282N, Y % of the average of the monitor values, or a fixed threshold.

In this manner, the phase detection unit 3100 monitors the respective detection sensitivities of the sensitivity monitor phase detectors 2821 to 282N and performs the diversity combining on the phases detected by the phase detectors where it is determined that the monitored respective detection sensitivities exceed the threshold. Then, the phase detection unit 3100 outputs the result of the diversity combining as the phase signal to the subsequent stage. With this configuration, it is possible to exclude the detection result from the phase detector whose sensitivity is significantly degraded, and it is therefore possible to detect the phase of the signal further accurately. For this reason, it is possible to further improve the communication quality.

Figure 32:
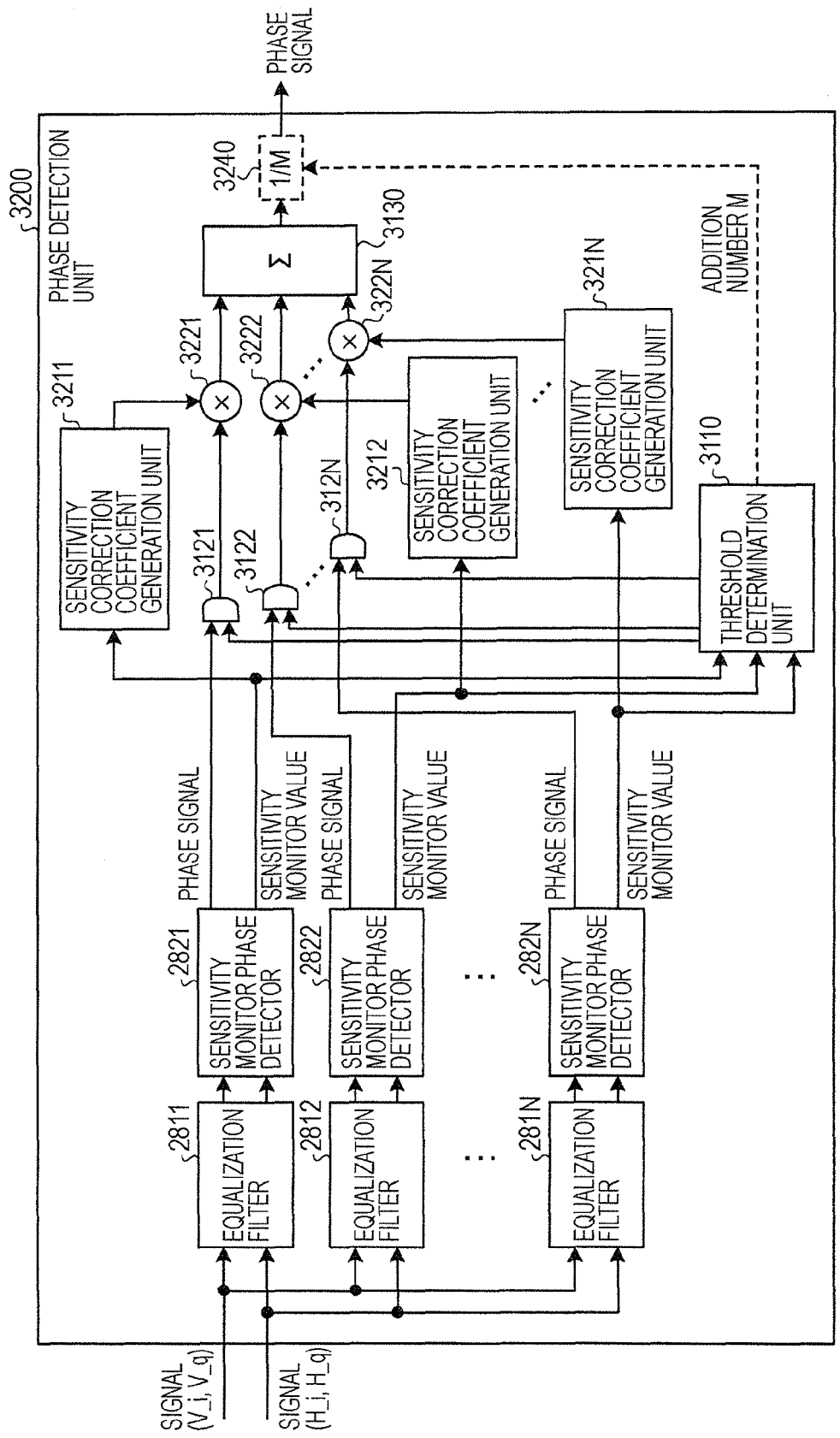
FIG. 32 is a block diagram showing a configuration example 4 of the phase detection unit of the diversity addition type.

FIG. 32 is a block diagram showing a configuration example 4 of the phase detection unit of the diversity addition type. In FIG. 32, a configuration similar to the configuration shown in FIG. 31 is assigned with the same reference symbol, and a description thereof is omitted. As shown in FIG. 32, a phase detection unit 3200 is provided with sensitivity correction coefficient generation units 3211 to 321N and multiplication units 3221 to 322N in addition to the configuration shown in FIG. 31.

The phase detection unit 3200 is a configuration example of the diversity addition type phase detection unit and can be applied, for example, to the phase detection unit 512. The sensitivity monitor phase detector 2821 outputs the sensitivity monitor value to the threshold determination unit 3110 and the sensitivity correction coefficient generation unit 3211. Similarly, each of the sensitivity monitor phase detectors 2822 to 282N outputs the sensitivity monitor value to the threshold determination unit 3110 and the sensitivity correction coefficient generation units 3212 to 321N.

In a case where the determination result output from the threshold determination unit 3110 is "1", the AND circuit 3121 outputs the phase signal output from the sensitivity monitor phase detector 2821 to the multiplication unit 3221. Similarly, in a case where the determination result output from the threshold determination unit 3110 is "1", the respective AND circuits 3122 to 312N outputs the phase signals respectively output from the sensitivity monitor phase detectors 2822 to 282N to the multiplication units 3222 to 322N, respectively.

The sensitivity correction coefficient generation unit 3211 generates the sensitivity correction coefficient on the basis of the sensitivity monitor value output from the sensitivity monitor phase detector 2821 and outputs the generated sensitivity correction coefficient to the multiplication unit 3221. Similarly, on the basis of the sensitivity monitor values respectively output from the sensitivity monitor phase detectors 2822 to 282N, the sensitivity correction coefficient generation units 3212 to 321N generate the sensitivity correction coefficients and respectively output the sensitivity correction coefficients to the multiplication units 3222 to 322N. Each of the sensitivity correction coefficient generation units 3211 to 321N has a configuration, for example, similar to the sensitivity correction coefficient generation unit 2850 shown in FIG. 28.

The multiplication unit 3221 multiplies the phase signal output from the AND circuit 3121 by the sensitivity correction coefficient output from the sensitivity correction coefficient generation unit 3211. The multiplication unit 3221 outputs the multiplied phase signal to the combining unit 3130. Similarly, the multiplication units 3222 to 322N multiply the phase signals respectively output from the AND circuits 3122 to 312N by the sensitivity correction coefficients respectively output from the sensitivity correction coefficient generation units 3212 to 321N. The multiplication units 3222 to 322N output the multiplied phase signals to the combining unit 3130. The combining unit 3130 performs diversity combining of the respective phase signals output from the multiplication units 3221 to 322N. The combining unit 3130 outputs the phase signal subjected to the diversity combining to the subsequent stage.

Also, a configuration in which a divider unit 3240 is provided may be adopted. The threshold determination unit 3110 notifies the divider unit 3240 of a number M of the sensitive monitors where the sensitivity monitor values output from the sensitivity monitor phase detectors 2821 to 282N exceed the threshold. The combining unit 3130 outputs the phase signal to the divider unit 3240. The divider unit 3240 divides the phase signal output from the combining unit 3130 by the number M notified from the threshold determination unit 3110 and outputs the division result as the phase signal to the subsequent stage. With this configuration, the detection sensitivity of the phase detection unit 3200 can be set constant.

In this manner, the phase detection unit 3200 generates a sensitivity correction coefficient in proportion to the inverse number of the monitor result from the phase detector where it is determined that the detection sensitivities exceed the threshold among the sensitivity monitor phase detectors 2821 to 282N. Then, the phase detection unit 3200 multiplies the respective phases subjected to the diversity addition by the sensitivity correction coefficient. With this configuration, the sensitivity degradation in the phase detector where it is determined that the detection sensitivities exceed the threshold is corrected, and it is possible to detect the phase of the signal further accurately. For this reason, it is possible to further improve the communication quality.

Figure 33:
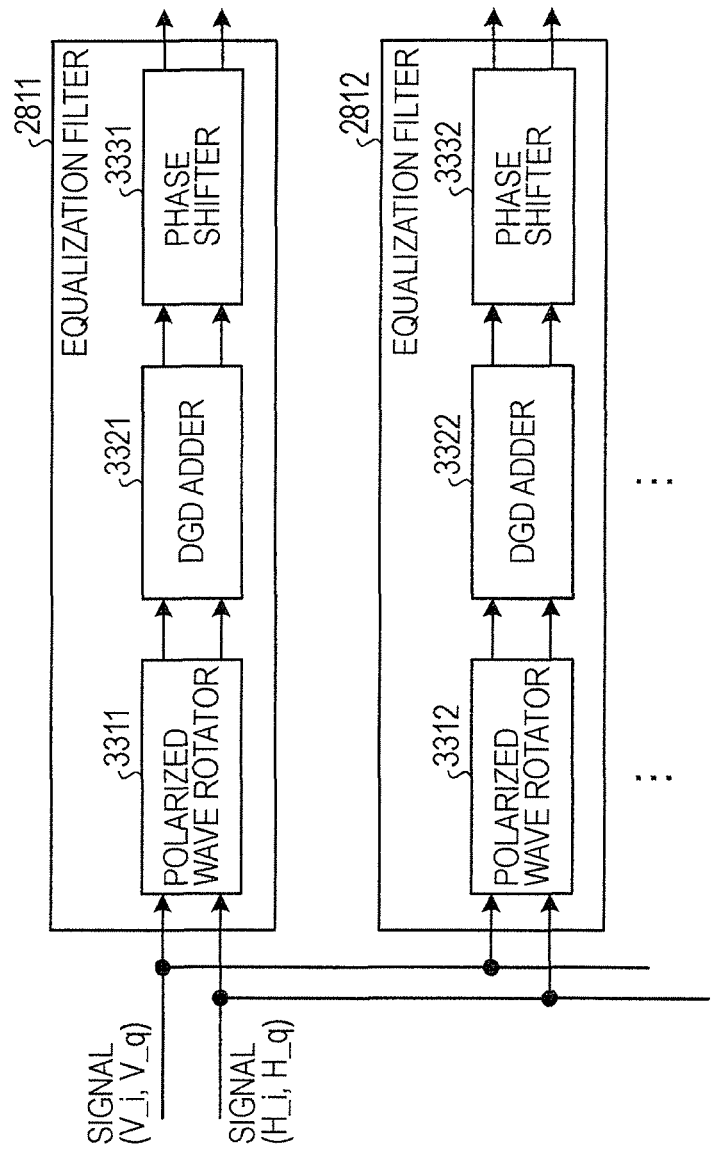
FIG. 33 is a block diagram showing a specific example of an equalization filter (polarized wave dispersion equalization)

FIG. 33 is a block diagram showing a specific example of an equalization filter (polarized wave dispersion equalization). For the equalization filters 2811 to 281N shown in FIGS. 28, 30, 31, and 32, for example, polarized wave dispersion equalization type equalization filters 2811, 2812, . . . shown in FIG. 33 can be applied. As shown in FIG. 33, the equalization filter 2811 is provided with a polarized wave rotator 3311, a DGD adder 3321, and a phase shifter 3331.

The polarized wave rotator 3311 rotates the polarized wave axis of the respective signals on the H axis and the V axis input to the equalization filter 2811 and outputs the respective signals where the polarized wave axis is rotated to the DGD adder 3321. The DGD adder 3321 adds DGD (Differential Group Delay) to the respective signals on the H axis and the V axis output from the polarized wave rotator 3311. The DGD adder 3321 outputs the respective signals to which the DGD is added to the phase shifter 3331.

The phase shifter 3331 shifts the phases of the respective signals on the H axis and the V axis output from the DGD adder 3321 to correct the phase convergent point which may be deviated because of the DGD addition. The phase shifter 3331 outputs the respective signals in which the phases are shifted to the subsequent stage. It is also possible to adopt a configuration omitting the phase shifter 3331.

Similarly, the equalization filters 2812 to 281N are respectively provided with polarized wave rotators 3312 to 331N, DGD adders 3322 to 332N, and phase shifters 3332 to 333N. The polarized wave rotators 3312 to 331N, the DGD adders 3322 to 332N, and the phase shifters 3332 to 333N are respectively similar to the polarized wave rotator 3311, the DGD adder 3321, and the phase shifter 3331, and a description thereof is omitted.

The polarized wave rotators 3312 to 331N have mutually different polarized wave rotation amounts. Also, the DGD adders 3321 to 332N have mutually different DGDs. Also, the phase shifters 3331 to 333N have mutually different phase shift amounts. With this configuration, the equalization filters 2811 to 281N have mutually different equalization characteristics.

Figure 34:
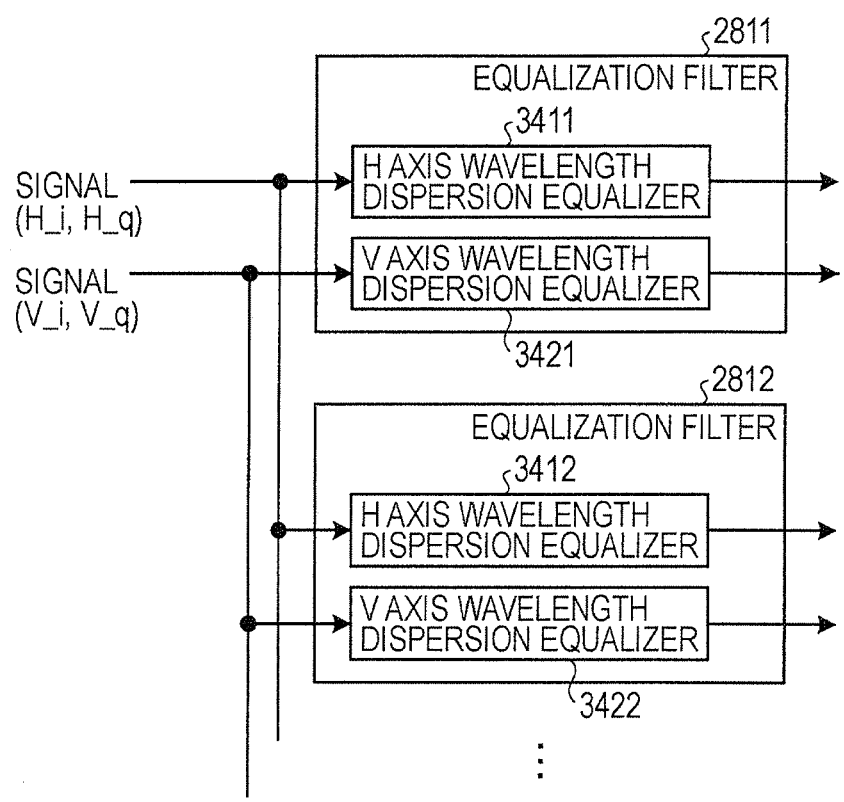
FIG. 34 is a block diagram showing a specific example of an equalization filter (wavelength dispersion equalization)

FIG. 34 is a block diagram showing a specific example of an equalization filter (wavelength dispersion equalization). For the equalization filters 2811 to 281N shown in FIGS. 28, 30, 31, and 32, for example, a filter of a wavelength dispersion equalization type shown in FIG. 34 can be applied. The equalization filter 2811 is provided with an H axis wavelength dispersion equalizer 3411 and a V axis wavelength dispersion equalizer 3421.

The H axis wavelength dispersion equalizer 3411 equalizes the wavelength dispersion of the signal on the H axis input to the equalization filter 2811 and outputs the signal in which the wavelength dispersion is equalized to the subsequent stage. The V axis wavelength dispersion equalizer 3421 equalizes the wavelength dispersion of the signal on the V axis input to the equalization filter 2811 and outputs the signal in which the wavelength dispersion is equalized to the subsequent stage.

Similarly, the equalization filters 2812 to 281N are respectively provided with the H axis wavelength dispersion equalizers 3412 to 341N and V axis wavelength dispersion equalizers 3422 to 342N. The H axis wavelength dispersion equalizers 3412 to 341N and the V axis wavelength dispersion equalizers 3422 to 342N are respectively similar to the H axis wavelength dispersion equalizer 3411 and the V axis wavelength dispersion equalizer 3421, and a description thereof is omitted. In this manner, the equalization filters 2811 to 281N have the wavelength dispersion equalizers corresponding to the respective signals on the H axis and the V axis. For the equalization filter, not only the polarized wave dispersion equalization and the wavelength dispersion equalization are independently applied, but also a combination of those can be applied.

(Modified Example of Digital Coherent Receiver)

Figure 35:
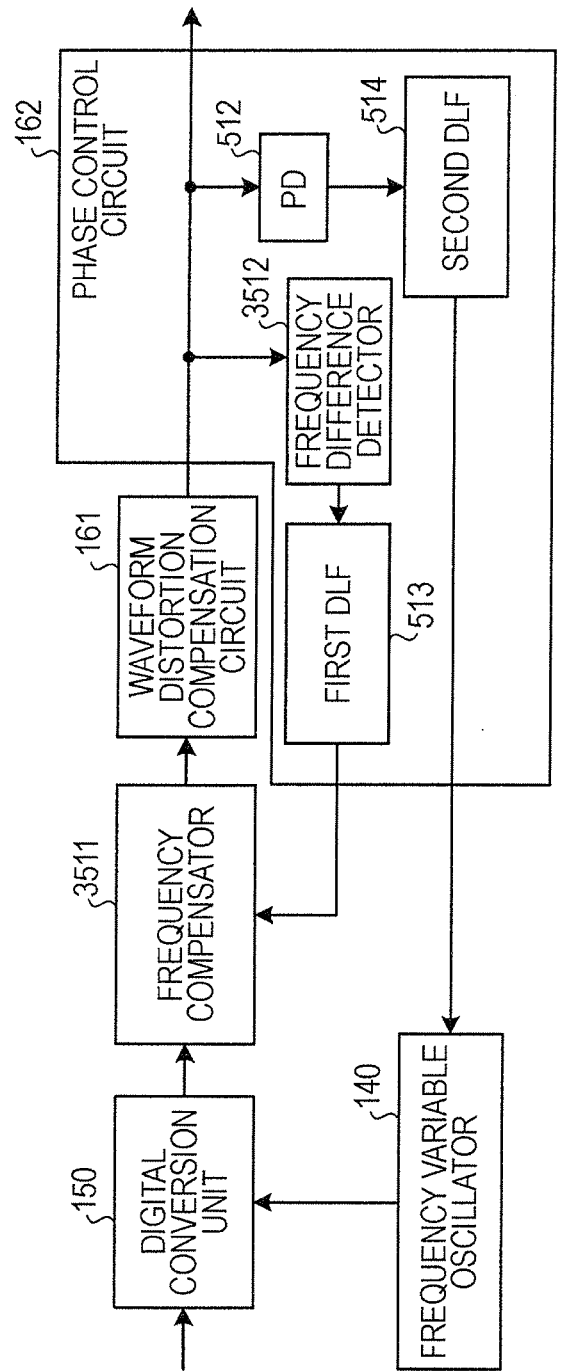
FIG. 35 is a block diagram showing a modified example 1 of the digital coherent receiver.

FIG. 35 is a block diagram showing a modified example 1 of the digital coherent receiver. In FIG. 35, with regard to a part of a configuration for the modified example 1 of the digital coherent receiver 100 shown in FIG. 1, the I and Q channels and the H and V axes are collectively illustrated. In FIG. 35, a configuration similar to the configuration shown in FIG. 5 is assigned with the same reference symbol, and a description thereof is omitted. As shown in FIG. 35, the digital coherent receiver 100 is provided with a frequency compensator 3511 (frequency compensation unit) and a frequency difference detector 3512 (frequency difference detection unit) instead of the phase adjuster 511 shown in FIG. 5.

The digital conversion unit 150 outputs the digitally converted signal to the frequency compensator 3511. On the basis of the rotation control signal output from the first DLF 513, the frequency compensator 3511 compensates the frequency of the signal output from the digital conversion unit 150. The frequency compensator 3511 outputs the signal in which the frequency is compensated to the waveform distortion compensation circuit 161. The waveform distortion compensation circuit 161 compensates the waveform distortion of the signal output from the frequency compensator 3511.

The phase detection unit 512 detects the phase of the signal output from the waveform distortion compensation circuit 161. The phase detection unit 512 outputs the detected phase signal indicating the phase to the second DLF 514. The second DLF 514 performs the signal processing on the signal output from the phase detection unit 512 and outputs the signal subjected to the signal processing as the frequency control signal to the frequency variable oscillator 140.

The frequency difference detector 3512 detects the frequency difference of the signal output from the waveform distortion compensation circuit 161. The frequency difference detector 3512 outputs the frequency difference signal indicating the frequency difference between the detected reception light and the local light to the first DLF 513. The first DLF 513 performs the signal processing on the frequency difference signal output from the frequency difference detector 3512. The first DLF 513 outputs the signal subjected to the signal processing as the rotation control signal to the frequency compensator 3511. Such a configuration may be adopted that instead of the frequency variable oscillator 140 shown in FIG. 35, the fixed-frequency oscillator 211 and the DDS 212 (see FIG. 2) are provided.

In this manner, the digital coherent receiver 100 detects the frequency difference between the reception light and the local light received in the subsequent stage of the waveform distortion compensation circuit 161 and compensates the detected frequency difference fluctuation through the frequency compensation in the former stage of the waveform distortion compensation circuit 161 to suppress the phase fluctuation generated in the output of the waveform distortion compensation circuit 161 due to the frequency fluctuation of the local light source 112, so that it is possible to accurately carry out the digital demodulation in the adaptive equalization type demodulation circuit 163. For this reason, it is possible to improve the communication quality.

Figure 36:
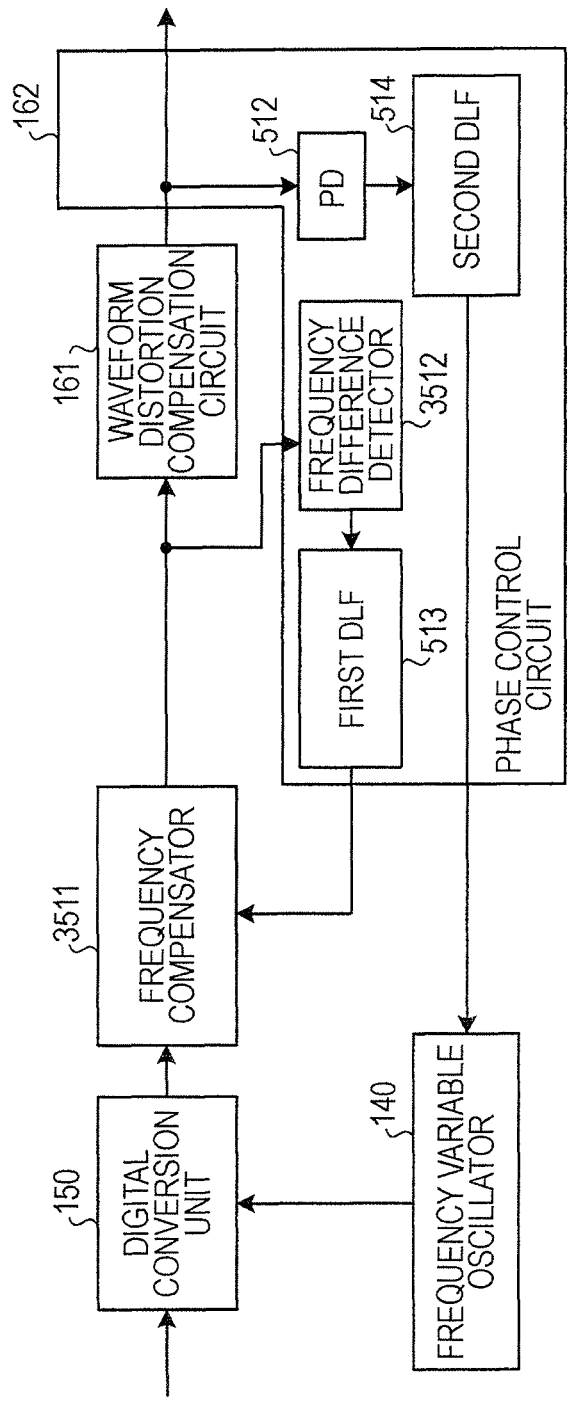
FIG. 36 is a block diagram showing a modified example 2 of the digital coherent receiver.

FIG. 36 is a block diagram showing a modified example 2 of the digital coherent receiver. In FIG. 36, a configuration similar to the configuration shown in FIG. 35 is assigned with the same reference symbol, and a description thereof is omitted. As shown in FIG. 36, the frequency difference detector 3512 may detect a frequency difference of the signal in the subsequent stage of the frequency compensator 3511. Such a configuration may be adopted that instead of the frequency variable oscillator 140 shown in FIG. 36, the fixed-frequency oscillator 211 and the DDS 212 (see FIG. 2).

Figure 37:
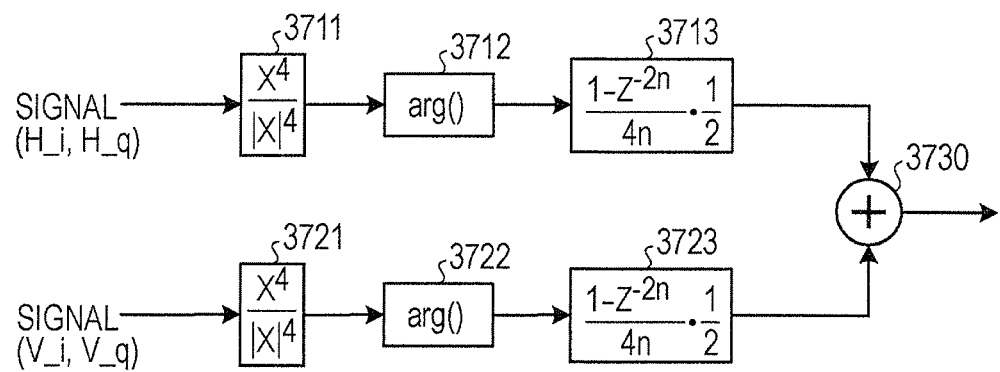
FIG. 37 is a block diagram showing a specific example of a frequency difference detector.

FIG. 37 is a block diagram showing a specific example of the frequency difference detector. The frequency difference detector 3512 shown in FIGS. 35 and 36 is provided, for example, as shown in FIG. 37, with computation units 3711 to 3713 and 3721 to 3723, and an adder unit 3730. With regard to the signal on the H axis input to the frequency difference detector 3512 (set as X), the computation unit 3711 computes $X^4/|X|^4$ and computation result to the computation unit 3712.

The computation unit 3712 computes arg( ) with respect to the computation result output from the computation unit 3711 to be converted into the phase information and outputs the computation result to the computation unit 3713. The computation unit 3713 performs a computation of the following expression (10) on the computation result output from the computation unit 3712 and outputs the computation result to the adder unit 3730.

[Expression 10]

$$\frac{1-Z^{-2n}}{4n} \cdot \frac{1}{2} \qquad (10)$$

With regard to the signal on the V axis input to the frequency difference detector 3512 (set as X), the computation unit 3721 computes $X^4/|X|^4$ and outputs the computation result to the computation unit 3722. The computation unit 3722 computes arg( ) with respect to the computation result output from the computation unit 3721 to be converted into the phase information and outputs the computation result to the computation unit 3723.

The computation unit 3723 performs the computation of the expression (10) on the computation result output from the computation unit 3722 and outputs the computation result to the adder unit 3730. The adder unit 3730 adds the respective computation results output from the computation unit 3713 and the computation unit 3723 with each other and outputs the addition result as the frequency difference signal to the subsequent stage.

In the respective signals on the H axis and the V axis which are the inputs of the frequency difference detectors, signals polarized and multiplexed on the transmitter side are mixed without being separated. In this case, when the modulation system is QPSK (Quadrature Phase Shift Keying), the quadrupling is conducted in the computation units 3721 and 3722, and the modulation signal $n\pi/4$ (n=1, 3, 5, and 7) on the transmission side becomes $n\pi$ (n=1, 3, 5, and 7).

For this reason, even when any rotation is applied in the optical transmission path, among the adjacent samples, as the complex number, the same phase is realized. For this reason, the conversion into the phase information is carried out in the computation units 3712 and 3722, and the computation is carried out in the computation units 3713 and 3723, so that it is possible to calculate the phase rotation amount for one sample from the phase rotation amount $(1-Z^{-2n})$ among 2n samples subjected to the 2× over sampling.

Then, through the addition of the H axis and the V axis in the adder unit 3730, it is possible to detect the frequency difference as the (2×) phase rotation amount. Even when the maximum frequency difference decided in the system is input, n is decided so that the phase rotation amount among the 2n samples falls within $-\pi$ to $\pi$. Also, in the computation of $(1-Z^{-2n})$ in the computation units 3713 and 3723, as the case may be addition of $\pm 2\pi$ is conducted so that the result falls within $-\pi$ to $\pi$.

Figure 38:
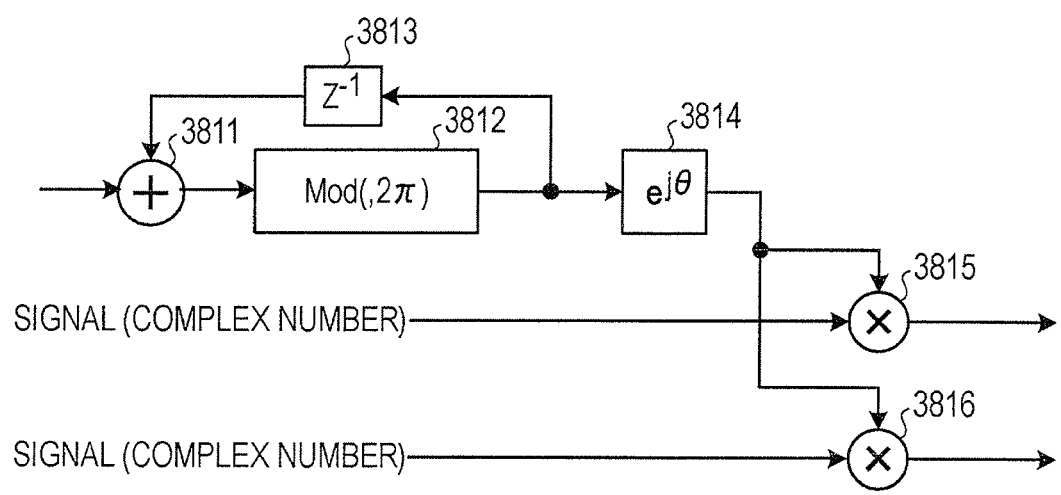
FIG. 38 is a block diagram showing a specific example of a frequency compensator.

FIG. 38 is a block diagram showing a specific example of the frequency compensator. The frequency compensator 3511 shown in FIGS. 35 and 36 is provided, for example, as shown in FIG. 38, with an adder unit 3811, a remainder operation unit 3812, a delay element 3813, a computation unit 3814, a multiplication unit 3815, and a multiplication unit 3816. The adder unit 3811 adds the rotation control signal from the first DLF 513 with a signal θ from the delay element 3813 and outputs the addition result to the remainder operation unit 3812.

The remainder operation unit 3812 conducts a remainder operation on the signal output from the adder unit 3811 while $2\pi$ is set as a divisor. The remainder operation unit 3812 outputs the signal θ of the computation result to the delay element 3813 and the computation unit 3814. The delay element 3813 delays the signal θ output from the remainder operation unit 3812 by ½ symbols to be output to the adder unit 3811.

On the basis of the signal θ output from the remainder operation unit 3812, the computation unit 3814 computes a rotator $e^{j\theta}$ for each sample. The computation unit 3814 outputs the rotator $e^{j\theta}$ obtained through the computation to the multiplication unit 3815 and the multiplication unit 3816.

The multiplication unit 3815 multiplies the signal on the H axis input to the frequency compensator 3511 (complex number) by the rotator $e^{j\theta}$ output from the computation unit 3814. The multiplication unit 3815 outputs the multiplied signal on the H axis to the subsequent stage. The multiplication unit 3816 multiplies the signal on the V axis input to the frequency compensator 3511 (complex number) by the rotator $e^{j\theta}$ output from the computation unit 3814. The multiplication unit 3816 outputs the multiplied signal on the V axis to the subsequent stage.

In a case where the signals are input to the frequency compensator 3511 in parallel, in order to process the N samples at the same time, $Z^{-1}$ in the delay element 3813 is set as $Z^{-N}$, and a rotator $e^{jm\theta}$ is computed in the m-th signal in the computation unit 3814. $Z^{-N}$ is equivalent to one clock delay in the signal processing block.

(Configuration Example of Optical Transmission System)

Figure 39:
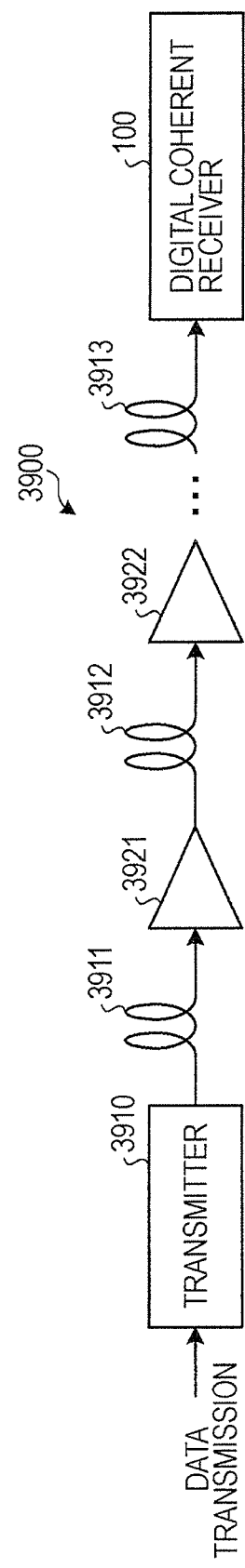
FIG. 39 is a block diagram showing a specific example of an optical transmission system.

FIG. 39 is a block diagram showing a specific example of the optical transmission system. As shown in FIG. 39, an optical transmission system 3900 includes a transmitter 3910 and the digital coherent receiver 100. The transmitter 3910 transmits the optical signal via the optical transmission path including optical fibers 3911 to 3913 and optical amplifiers 3921 and 3922 to the digital coherent receiver 100.

In the optical transmission system 3900, the waveform distortion of the optical signal such as the wavelength dispersion generated in the optical transmission path can be compensated in the digital coherent receiver 100. For this reason, for the optical transmission path in the optical transmission system 3900, a configuration without providing a Dispersion Compensating Fiber (DCF) or the like for compensating the wavelength dispersion amount can also be adopted.

For this reason, cost reduction, space saving, and the like for the apparatus can be realized, and also the optical attenuation amount of the optical signal can be reduced through no provision of the DCF, so that it is possible to reduce the number of the optical amplifiers can be reduced. For this reason, the power consumption. Also, as compared with the optical waveform compensation circuit, the digital waveform compensation circuit and the digital demodulation circuit in the digital coherent receiver 100 is superior in tracking property with respect to the fluctuation of the transmission path distortion. For this reason, the configuration is also useful to the polarized wave multiplex system where a high tracking property is demanded with respect to the polarized wave.

(Overlap Type Fourier Transform Unit and Inverse Fourier Transform Unit)

In the Fourier transform units 811, 1311, and 2011 and the inverse Fourier transform units 815, 1315, and 2014 which are shown in FIGS. 8, 13, 14, and 20, the phase shift of $\Delta\tau$ in the time domain becomes the rotator coefficient of $\exp^{(j\omega\Delta\tau)}$ in the frequency domain. For this reason, the Fourier transform result of the input is multiplied by the rotator coefficient, and the inverse Fourier transform is carried out to realize the phase shift.

However, if an attempt is made to realize the Fourier transform and the inverse Fourier transform by using the normal FFT, IFFT, DFT (Discrete Fourier Transform), or IDFT (Inverse DFT), discontinuous points may be generated as the sample in which the phase is shifted circulates the Fourier transform window after the inverse Fourier transform. Overlap type Fourier transform unit and inverse Fourier transform unit for solving this phenomenon will be described with reference to FIGS. 40 and 41.

Figure 40:
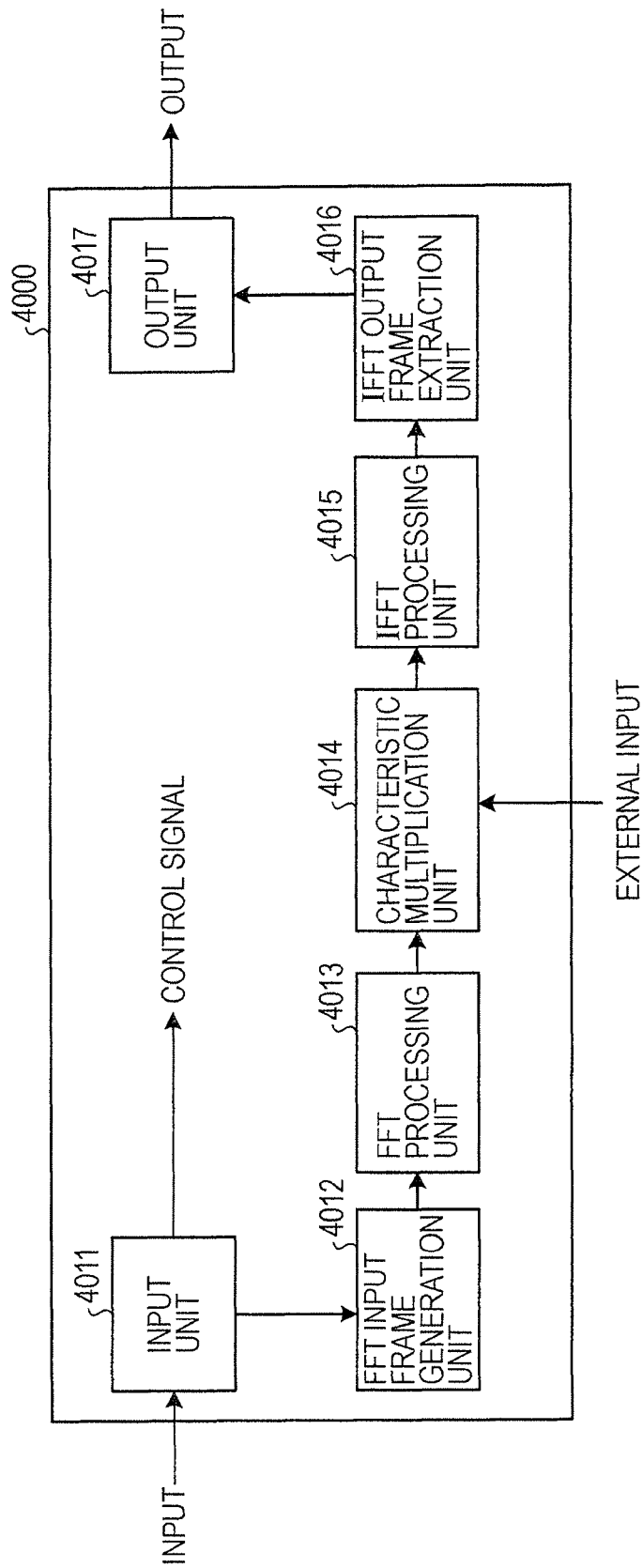
FIG. 40 is a block diagram showing specific example of a Fourier transform unit and an inverse Fourier transform unit.

FIG. 40 is a block diagram showing specific example of the Fourier transform unit and the inverse Fourier transform unit. For the Fourier transform units 811, 1311, and 2011 and the inverse Fourier transform units 815, 1315, and 2014 which are shown in FIGS. 8, 13, 14, and 20, for example, a circuit 4000 shown in FIG. 40 can be applied. The circuit 4000 is provided with an input unit 4011, a FFT input frame generation unit 4012, a FFT processing unit 4013, a characteristic multiplication unit 4014, an IFFT processing unit 4015, an IFFT output frame extraction unit 4016, and an output unit 4017.

Herein, the input data is set as 256 parallel signals, and a window side of FFT and IFFT is set as 1024. The input data (time domain: 256 samples) are input to the input unit 4011. The input unit 4011 buffers the input data thus input and generates a frame composed of 512 samples for once in 2 clocks.

The input unit 4011 outputs the generated frame to the FFT input frame generation unit 4012. Also, the input unit 4011 outputs a control signal including a frame generation timing to an internal counter of the respective blocks of the circuit 4000. In the subsequent stage of the input unit 4011, the processing is carried out this frame and the frame generation timing in the input unit 4011 are set as the unit.

The FFT input frame generation unit 4012 joins the one previous 512 sample frames and the current 512 sample frames in the sample frames output from the input unit 4011 to generate a frame composed of 1024 samples. The FFT input frame generation unit 4012 outputs the generated frame to the FFT processing unit 4013.

The FFT processing unit 4013 transforms the frame output from the FFT input frame generation unit 4012 into data in the frequency domain. The FFT processing unit 4013 outputs the transformed frame to the characteristic multiplication unit 4014. The characteristic multiplication unit 4014 respectively multiplies characteristic parameters for each frequency component with respect to the frequency corresponding to the frame output from the FFT processing unit 4013 (for 1024 frequencies). The characteristic parameters are input, for example, from an external area. The characteristic multiplication unit 4014 outputs the multiplied frame to the IFFT processing unit 4015.

The IFFT processing unit 4015 transforms the frame output from the characteristic multiplication unit 4014 into data in the time domain. The IFFT processing unit 4015 outputs the transformed frame to the IFFT output frame extraction unit 4016. In the vicinity of the frame output from the IFFT processing unit 4015, the discontinuous points are included.

With regards the frame output from the IFFT processing unit 4015, the IFFT output frame extraction unit 4016 discards 256 samples in the back and forth, that is, the quarter of the window size each. If the discontinuous points fall within an area for the discarding in the IFFT output frame extraction unit 4016, the discontinuous points are not generated in the output obtained by joining the 512 samples which are not discarded. The IFFT output frame extraction unit 4016 outputs the processed frame to the output unit 4017.

The output unit 4017 cuts the frame output from the IFFT output frame extraction unit 4016 (512 samples output every 2 samples) into 256 samples each per 1 clock to be output as the parallel signal to the subsequent stage.

FIG. 41 shows an operation of the circuit shown in FIG. 40. Reference numeral 4110 in FIG. 41 denotes input data input to the input unit 4011. Reference symbol 4120 denotes N-th frame (FFT input frame) input to the FFT processing unit 4013. Reference symbol 4130 denotes (N+1)-th frame input to the FFT processing unit 4013. Reference symbol 4140 denotes (N+2)-th frame input to the FFT processing unit 4013.

Reference symbol 4150 denotes N-th frame output from the IFFT processing unit 4015 (IFFT output frame). Reference symbol 4160 denotes (N+1)-th frame output from the IFFT processing unit 4015. Reference symbol 4170 denotes (N+2)-th frame output from the IFFT processing unit 4015. Reference symbol 4171 is a frame discarded by the IFFT output frame extraction unit 4016.

Reference symbol 4180 denotes a frame in which the respective frames denoted by Reference symbols 4150, 4160, and 4170 (except the frame denoted by reference numeral 4171) are joined by the IFFT output frame extraction unit 4016. In this manner, according to the circuit 4000 for conducting the overlap type FFT and IFFT, the generation of the discontinuous points because of the phase shift can be avoided.

As described above, according to the digital coherent receiver, it is possible to improve the communication quality.

The reception method described in the present embodiment can be realized while a previously prepared program is executed by a computer such as a personal computer or a work station. This program is recorded on a computer-readable recording medium such as a hard disk, a flexible disk, a CD-ROM, an MO, or a DVD and, and the program is read out from the recording medium by the computer for the execution. Also, this program may be a transmission medium which can be distributed via a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it may be understood that the various changes, substitutions, and alterations could be made hereto without departing from the spirit and scope of the invention.

What is claimed is:

1. A digital coherent receiving apparatus, comprising:
   a receiver configured to receive a light signal;
   a first oscillator configured to output a local light signal;
   a 90° optical hybrid circuit configured to mix the local light signal output from the first oscillator with the light signal received by the receiver;
   a second oscillator configured to output a sampling signal of a sampling frequency, the second oscillator changing the sampling frequency in response to an input control signal;
   a converter configured to convert the mixed light signal into a digital signal by sampling the mixed light signal with the sampling signal;
   a waveform adjuster configured to adjust a waveform distortion of the digital signal converted by the converter;
   a phase detector configured to detect a phase signal of the digital signal adjusted by the waveform adjuster;
   a control signal output unit configured to output a control signal based on the detected phase signal to the second oscillator;
   a phase adjuster configured to adjust a phase of the digital signal adjusted by the waveform adjuster; and
   a demodulator configured to demodulate the digital signal adjusted by the phase adjuster,
   wherein the phase detector includes:
   a plurality of equalizing filters configured to respectively process and equalize the digital signal using different equalizing characteristics,
   a plurality of detecting units configured to detect a plurality of candidate phases of the digital signal processed by each of the equalizing filters, and
   a selector configured to select one of the detected candidate phases as the detected phase.

2. The digital coherent receiving apparatus according to claim 1, wherein the control signal output unit outputs a frequency control signal generated by converting the component of the detected phase into a frequency component.

3. The digital coherent receiving apparatus according to claim 1,
   wherein the control signal output unit includes:
   a noise canceller for cancelling a noise in the phase detected by the phase detector, and
   a generator for generating the control signal in reference to the phase after cancelling the noise by the noise canceller and for outputting the control signal to the second oscillator, and
   the phase adjuster adjusts the phase of the digital signal on the basis of the phase after cancelling the noise by the phase detector.

4. The digital coherent receiving apparatus according to claim 1, further comprising a noise canceller configured to cancel a noise in the phase detected by the phase detector; and
   wherein the phase adjuster adjusts the phase of the digital signal based on the phase after cancelling the noise.

5. The digital coherent receiving apparatus according to claim 4, wherein the control signal output unit outputs a frequency control signal generated by converting the phase component of the detected phase into a frequency component.

6. A digital coherent receiving apparatus, comprising:
   a receiver configured to receive a light signal;
   a first oscillator configured to output a local light signal;
   a 90° optical hybrid circuit configured to mix the local light signal output from the first oscillator with the light signal received by the receiver;
   a second oscillator configured to output a sampling signal of a sampling frequency, the second oscillator changing the sampling frequency in response to an input control signal;
   a converter configured to convert the mixed light signal into a digital signal by sampling the mixed light signal with the sampling signal;
   a waveform adjuster configured to adjust a waveform distortion of the digital signal converted by the converter;
   a phase detector configured to detect a phase signal of the digital signal adjusted by the waveform adjuster;
   a control signal output unit configured to output a control signal based on the detected phase signal to the second oscillator;
   a phase adjuster configured to adjust a phase of the digital signal adjusted by the waveform adjuster; and
   a demodulator configured to demodulate the digital signal adjusted by the phase adjuster,
   wherein the phase detector includes:
   a plurality of equalizing filters configured to respectively process and equalize the digital signal using different equalizing characteristics,
   a plurality of detecting units configured to detect a plurality of candidate phases of the digital signal processed by each of the equalizing filters,
   a convertor for diversity converting the plurality of the candidate phases, and
   a phase generator configured to generate the phase by combining the plurality of the candidate phases using a diversity combining method and for outputting the phase.

* * * * *